United States Patent [19]
Furumochi et al.

[11] Patent Number: 5,734,622
[45] Date of Patent: Mar. 31, 1998

[54] MOS STATIC RAM WITH IMPROVED SOFT ERROR RESISTANCE; HIGH-LEVEL SUPPLY VOLTAGE DROP DETECTION CIRCUIT AND COMPLEMENTARY SIGNAL TRANSITION DETECTION CIRCUIT FOR THE SAME; AND SEMICONDUCTOR DEVICE WITH IMPROVED INTERSIGNAL TIME MARGIN

[75] Inventors: Kazuto Furumochi; Junji Seino, both of Kawasaki, Japan

[73] Assignee: Fujitsu Limited, Kawasaki, Japan

[21] Appl. No.: 755,550

[22] Filed: Nov. 22, 1996

Related U.S. Application Data

[62] Division of Ser. No. 513,641, Aug. 10, 1995, Pat. No. 5,644,546, which is a continuation of Ser. No. 353,312, Dec. 5, 1994, abandoned, which is a continuation of Ser. No. 113,894, Aug. 31, 1993, abandoned.

[30] Foreign Application Priority Data

| Sep. 11, 1992 | [JP] | Japan | 4-243136 |
| Sep. 16, 1992 | [JP] | Japan | 4-246598 |
| Sep. 17, 1992 | [JP] | Japan | 4-248309 |
| Sep. 17, 1992 | [JP] | Japan | 4-248310 |

[51] Int. Cl.$^6$ ........................... G11C 8/00
[52] U.S. Cl. ............. 365/233.5; 365/194; 365/190; 326/93
[58] Field of Search ............ 365/233.5, 194, 365/190; 326/93, 95

[56] References Cited

U.S. PATENT DOCUMENTS

| 3,806,900 | 4/1974 | Spain et al. ............... 340/174 |
| 4,521,696 | 6/1985 | Raghunathan ............ 307/350 |
| 4,716,323 | 12/1987 | Wada et al. ............... 307/594 |
| 5,003,513 | 3/1991 | Porter et al. ............. 365/233.5 X |
| 5,014,242 | 5/1991 | Akimoto et al. ........... 365/63 |
| 5,124,584 | 6/1992 | McClure ................. 326/93 X |
| 5,159,573 | 10/1992 | Yamada ................. 365/233.5 |
| 5,189,641 | 2/1993 | Arakawa ................ 365/228 |
| 5,214,609 | 5/1993 | Kato et al. ............ 365/233.5 X |
| 5,228,003 | 7/1993 | Tokuda ................. 365/194 X |
| 5,297,097 | 3/1994 | Etoh et al. ............. 365/226 |
| 5,306,963 | 4/1994 | Leak et al. ............. 326/93 X |
| 5,335,203 | 8/1994 | Ishii et al. ............. 365/226 |

FOREIGN PATENT DOCUMENTS

| 59-151523 | 8/1984 | Japan . |
| 62-150586 | 7/1987 | Japan . |
| 62-177787 | 8/1987 | Japan . |
| 62-188090 | 8/1987 | Japan . |
| 63-103978 | 5/1988 | Japan . |
| 2-183495 | 7/1990 | Japan . |
| 3-48455 | 3/1991 | Japan . |
| 3-137886 | 6/1991 | Japan . |
| 3-238365 | 10/1991 | Japan . |
| 3-263688 | 11/1991 | Japan . |
| 4-132084 | 5/1992 | Japan . |
| 4-132242 | 5/1992 | Japan . |

*Primary Examiner*—David C. Nelms
*Assistant Examiner*—Huan Hoang
*Attorney, Agent, or Firm*—Armstrong, Westerman, Hattori, McLeland & Naughton

[57] ABSTRACT

An object of the present invention is to provide a MOS static RAM in which the power consumption can be reduced when it is required to reduce the power consumption during standby, and sufficient soft error resistance can be secured when it is required to provide sufficient soft error resistance for the cell. A MOS static RAM of the present invention comprises a power supply circuit for generating a plurality of voltages of different voltage values and a selection circuit for selecting one voltage from among the plurality of voltages output from the power supply circuit and supplying the selected voltage as a cell data retention voltage to a flip-flop that forms a cell.

6 Claims, 48 Drawing Sheets

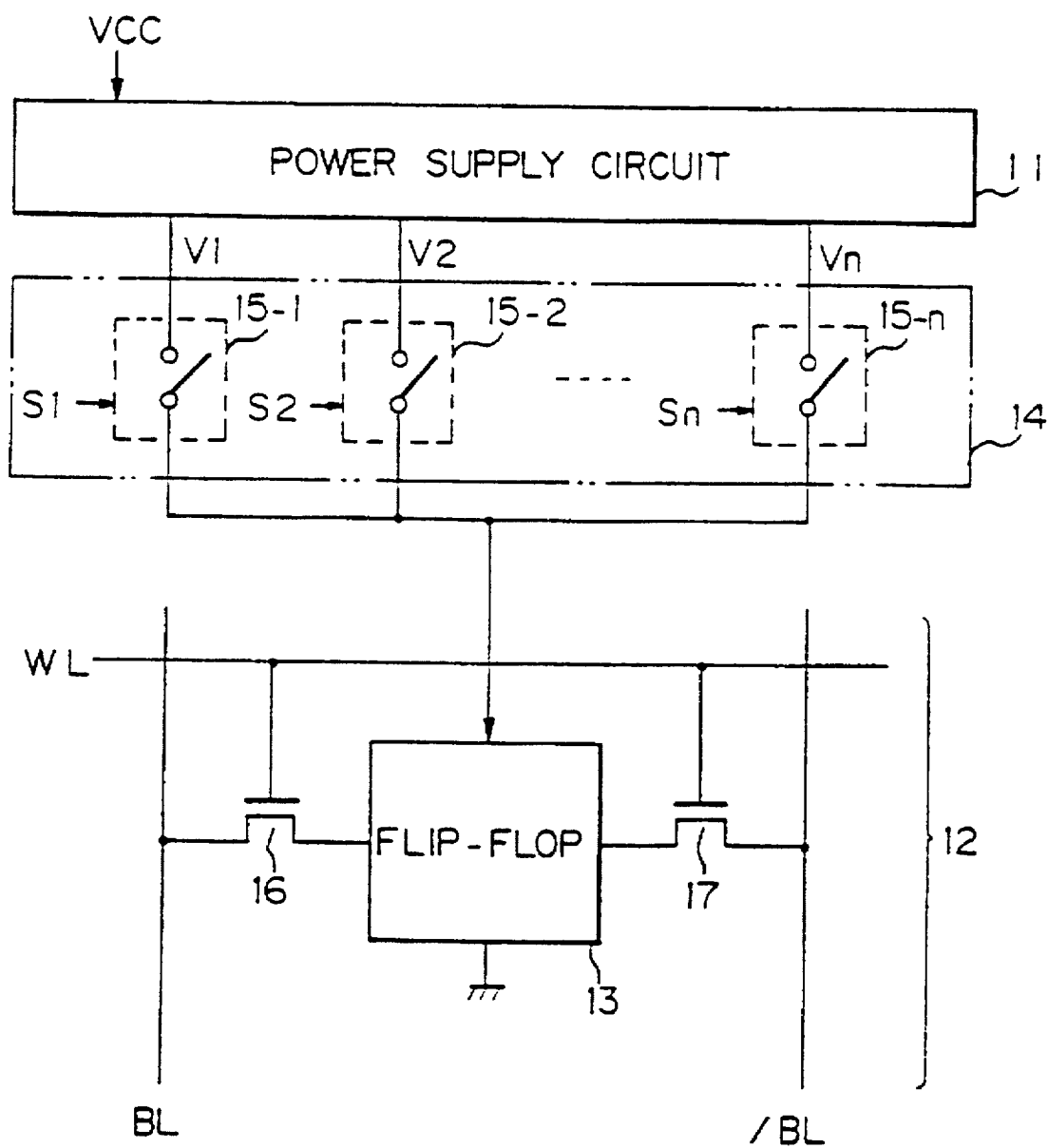

| Fig. 8 |
|---|
| Fig. 8A |
| Fig. 8B |

| Fig.11A |
| Fig.11B |

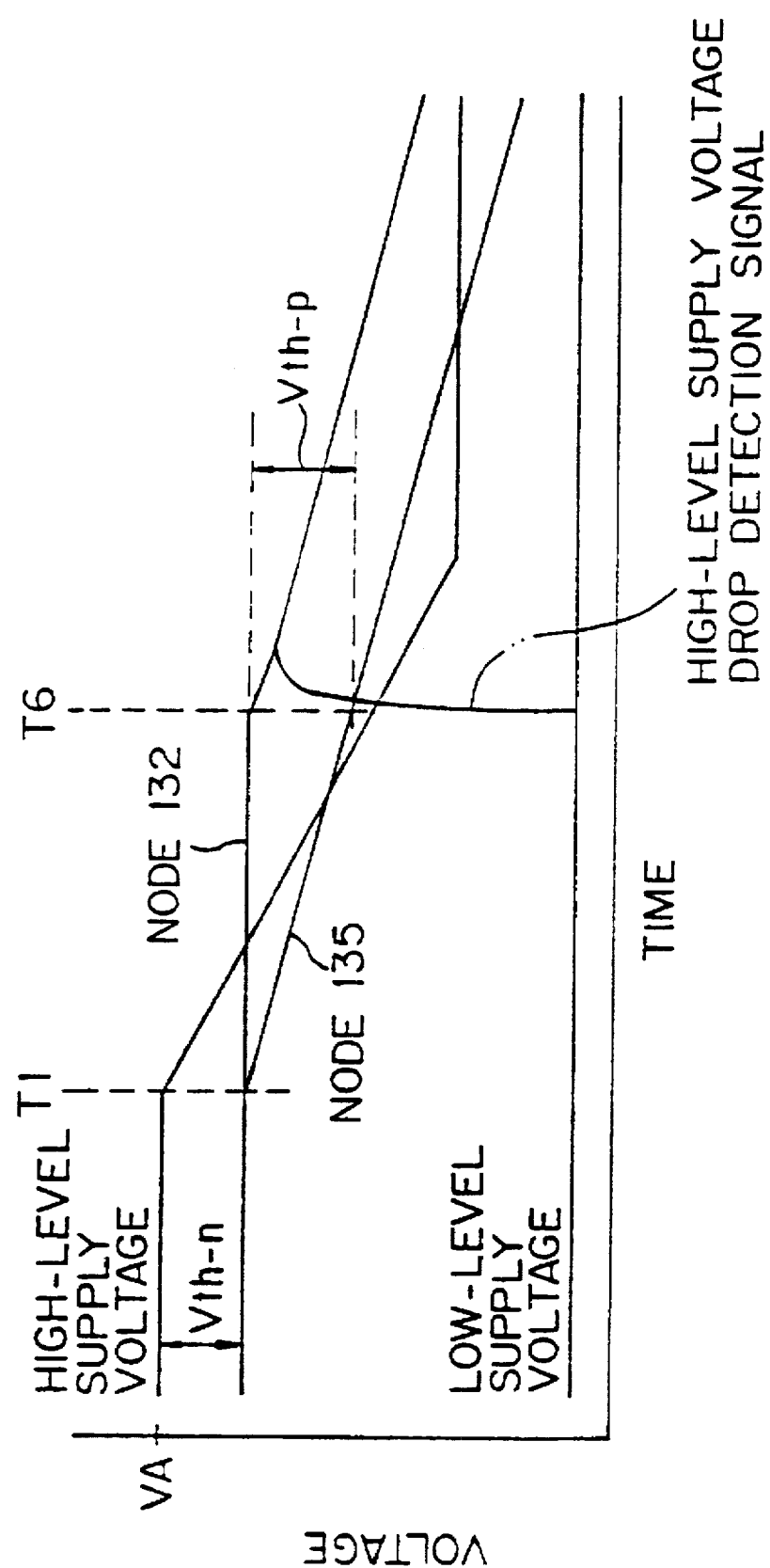

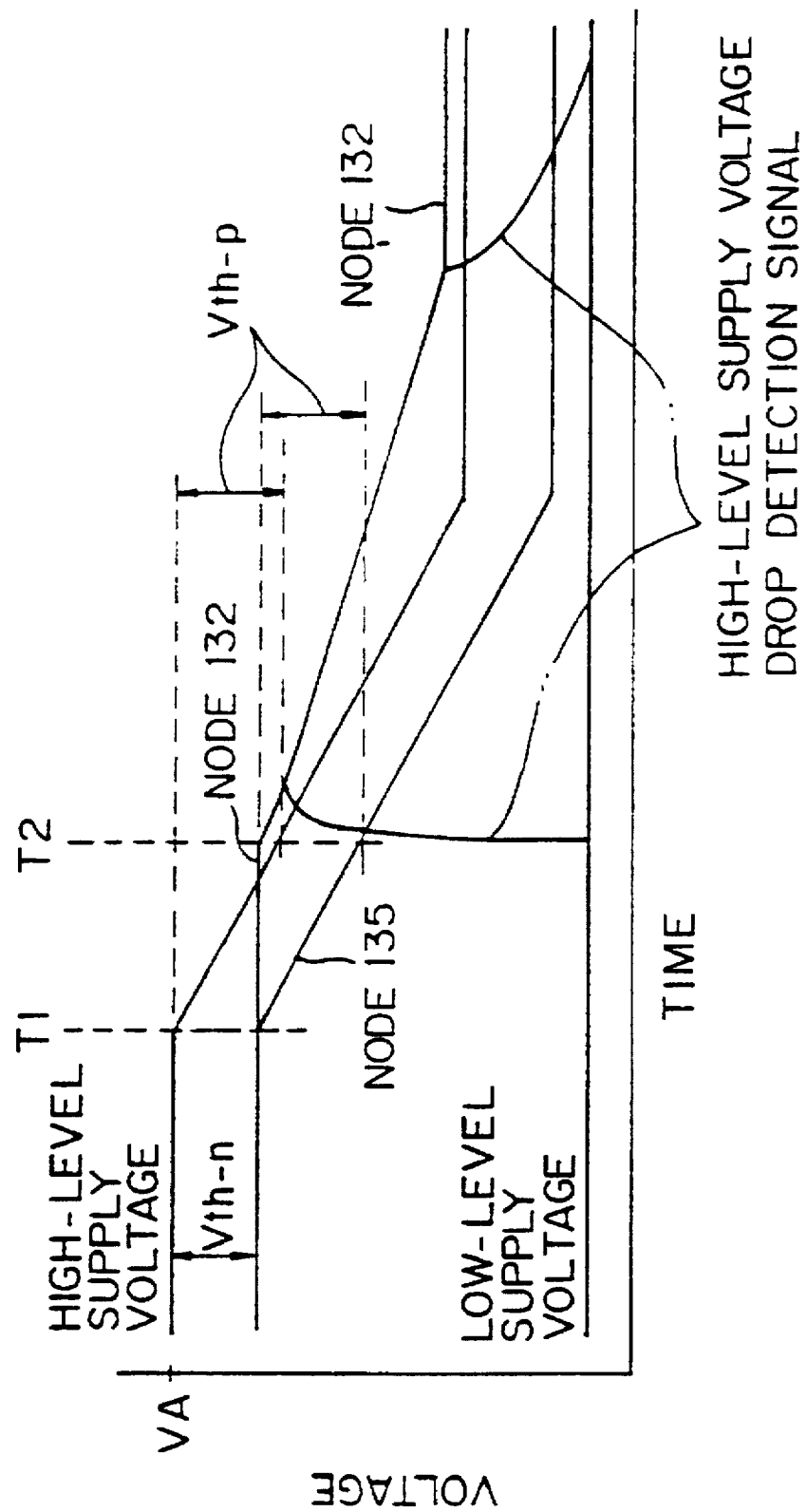

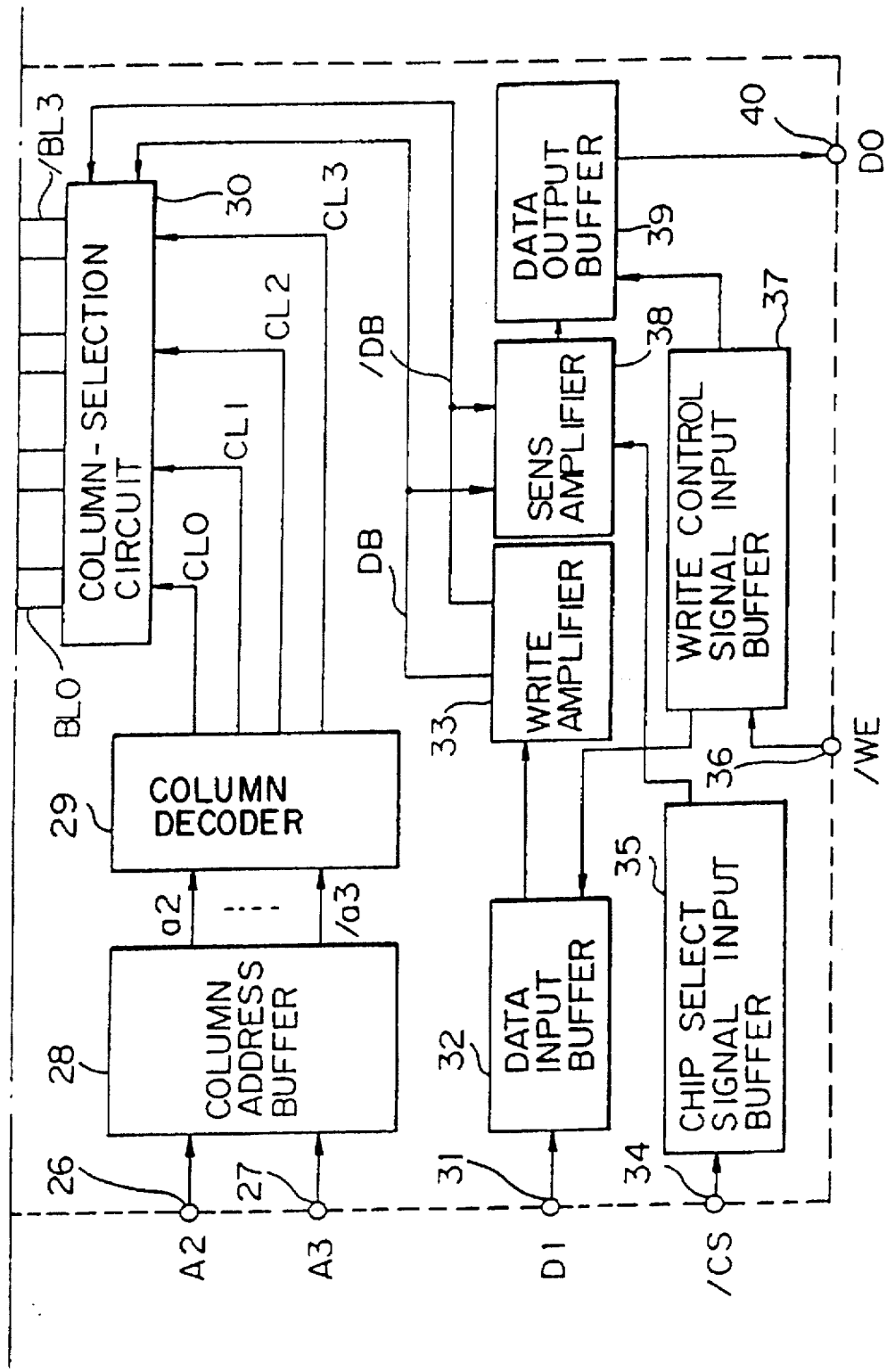

PRIOR ART

PRIOR ART

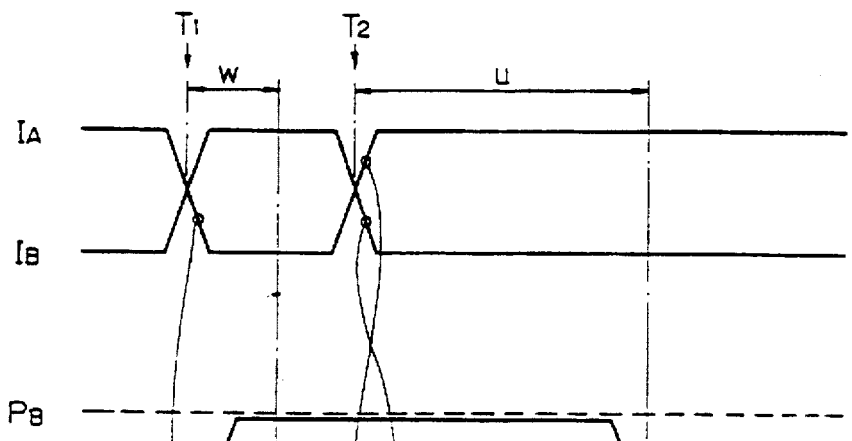
Fig.28A
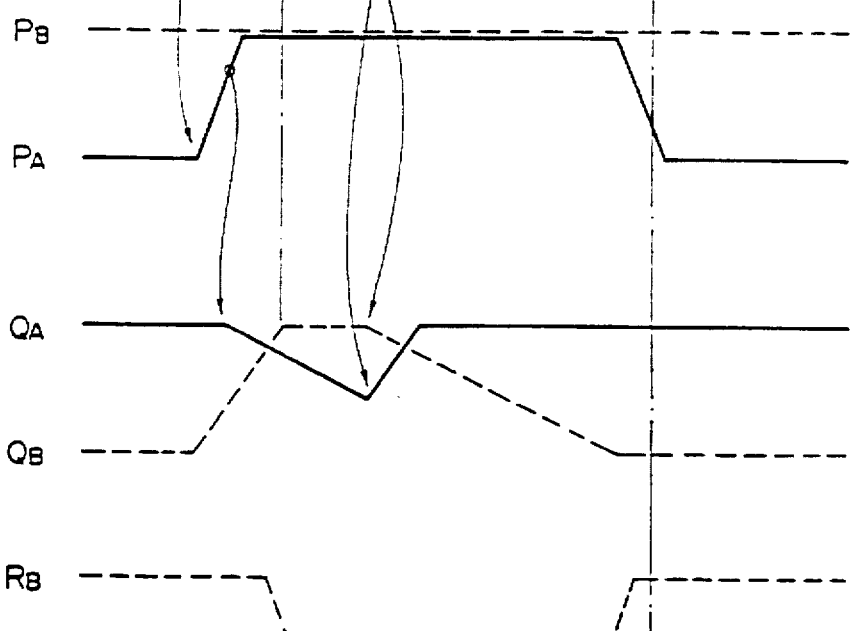
Fig.28B
Fig.28C
Fig.28D
Fig.28E Fig. 41A ADDRESS
Fig. 41B /WE
Fig. 41C WL
Fig. 41D INNER /WE
Fig. 41E BL
Fig. 41F CELL NODE

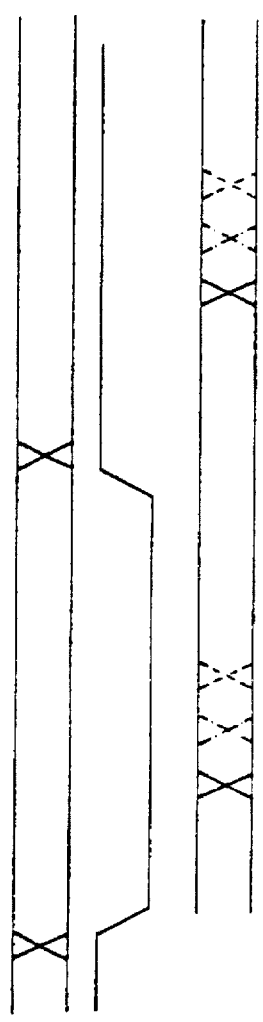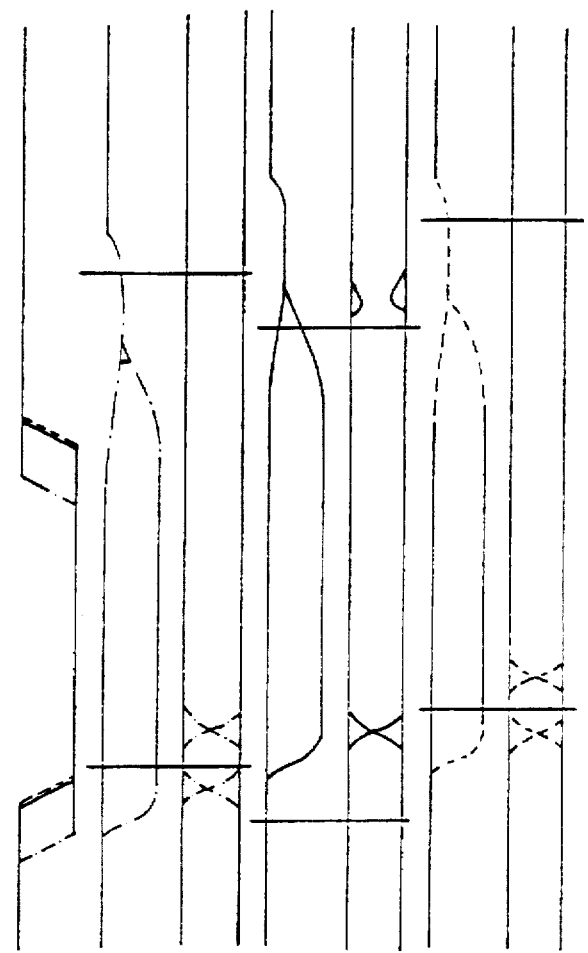
Fig. 43A ADDRESS
Fig. 43B /WE
Fig. 43C WL
Fig. 43D INNER /WE
Fig. 43E BL AT 2
Fig. 43F CELL NODE AT 2
Fig. 43G BL AT 1
Fig. 43H CELL NODE AT 1
Fig. 43I BL AT 3
Fig. 43J CELL NODE AT 3

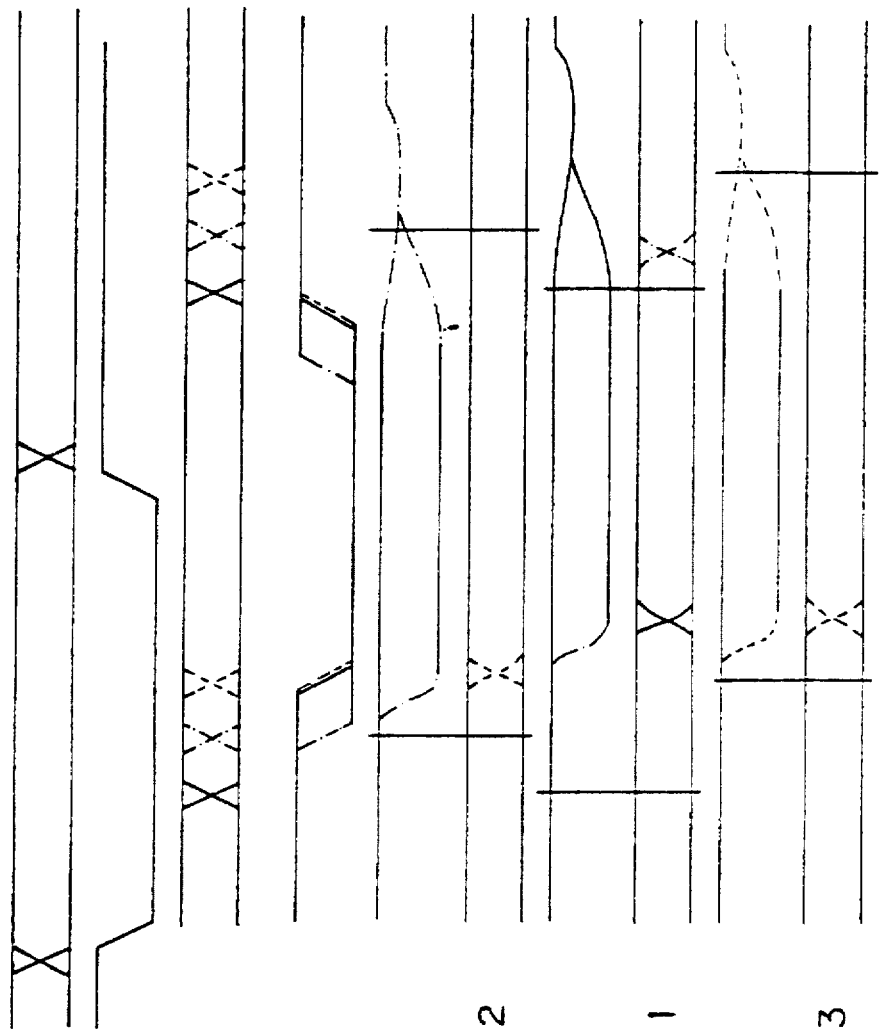

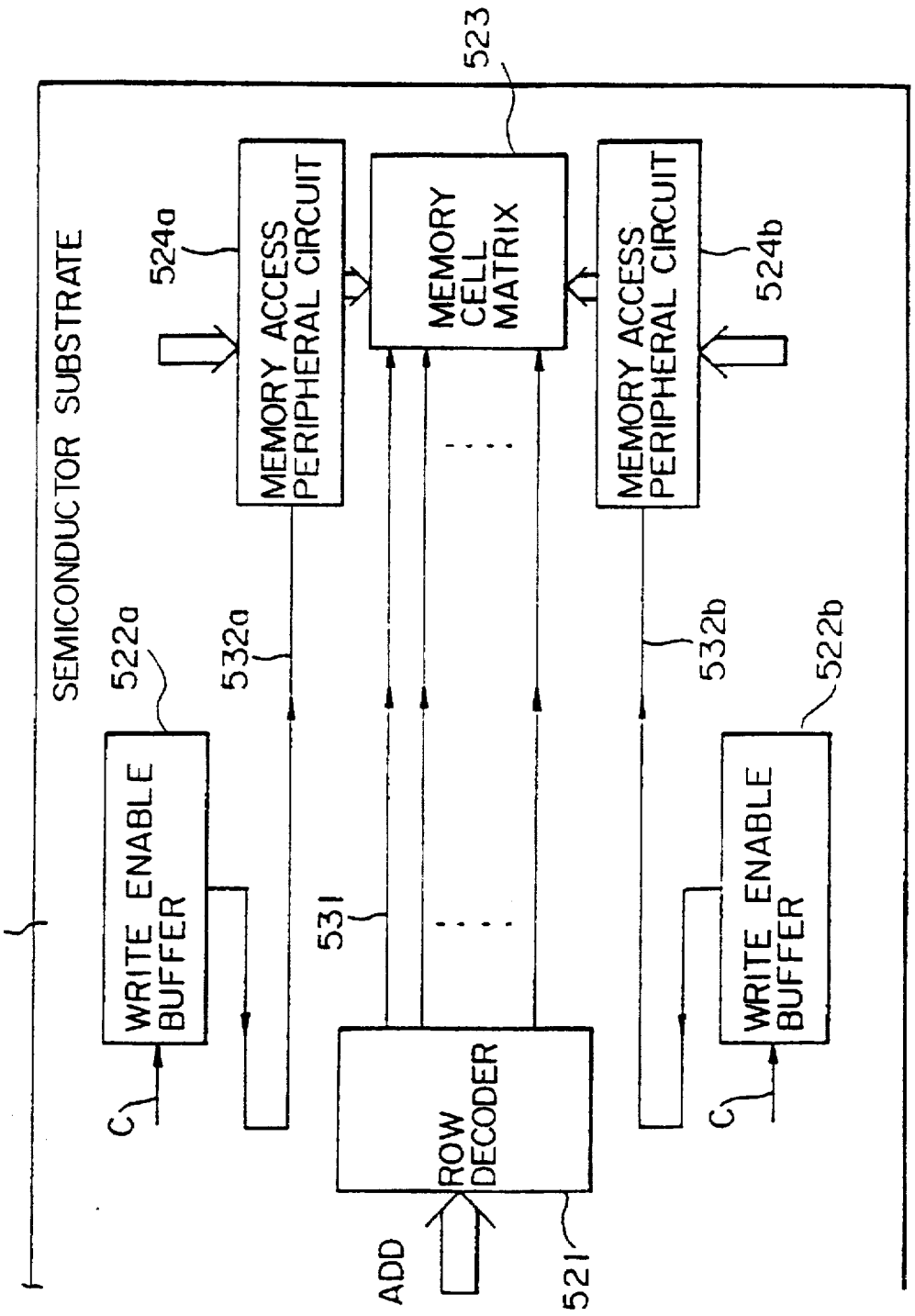

MOS STATIC RAM WITH IMPROVED SOFT ERROR RESISTANCE; HIGH-LEVEL SUPPLY VOLTAGE DROP DETECTION CIRCUIT AND COMPLEMENTARY SIGNAL TRANSITION DETECTION CIRCUIT FOR THE SAME; AND SEMICONDUCTOR DEVICE WITH IMPROVED INTERSIGNAL TIME MARGIN

This is a divisional of application Ser. No. 08/513,641 filed Aug. 10, 1995 U.S. Pat. No. 5,644,546; which is a continuation of Ser. No. 08/353,312 filed Dec. 5, 1994, now abandoned; which is a continuation of Ser. No. 08/113,894 filed Aug. 31, 1993, now abandoned.

BACKGROUND OF THE INVENTION

1. Field of the Invention

The present invention relates to a MOS static RAM constructed with MOS transistors forming flip-flops as memory cells; a high-level supply voltage drop detection circuit, used in the MOS static RAM, for detecting a high-level supply voltage drop; a complementary signal transition detection circuit for detecting a transition of complementary signals such as complementary address signals generated within the RAM; and a semiconductor device having a wiring-pattern designed to improve the time margin between signals.

2. Description of the Related Art

In recent years, with decreasing (memory) cell size and increasing memory capacity of MOS static RAMs, there have been arising problems such as decreased soft error resistance of the cells and increased current consumption during standby, and these problems need urgent solution.

For MOS static RAMs, cell miniaturization is being pushed forward to increase the memory capacity; however, cell miniaturization involves a decrease in node parasitic capacitance, and hence a decrease in the amount of charge with which a node is charged when it is to be set to a high level. This decrease in the charge amount has been a major cause of decreased soft error resistance of the cells. The decrease of the soft error resistance due to cell miniaturization becomes greater as a high-level voltage to be applied to a node is reduced.

On the other hand, lower power dissipation is demanded of the MOS static RAM, and low-dissipation type MOS static RAMs have been made available for practical use. In such low-dissipation type MOS static RAMs, most of the standby power dissipation is due to the cell data retention current. If the supply voltage is reduced to reduce the cell data retention current for lower power consumption, the memory cell node voltage will drop, causing a further drop in the soft error resistance and hence the inability to obtain the necessary reliability of the device.

In particular, in a MOS static RAM having a memory cell structure of high resistance load type that permits reduced memory cell size and increased integration, a certain amount of cell data retention current is needed to ensure cell data retention, and there is a limit to increasing the load resistance value. Accordingly, increasing the memory cell density involves an increase in the cell data retention current as a whole, which has impeded efforts to further reduce the power consumption.

As described above, low-dissipation type MOS static RAMs have had the problem that sufficient soft error resistance cannot be obtained, since power consumption increases if sufficient soft error resistance is to be ensured.

Generally, the MOS static RAM has the problem that if the cell size is reduced, the dielectric strength of the insulating film decreases and the voltage of the same magnitude as is normally possible cannot be applied to the RAM internal circuitry. To avoid this problem, there are such semiconductor devices that contain a supply voltage reducing circuit to reduce the voltage to be applied to internal circuitry. On the other hand, it is often practiced to reduce the supply voltage to achieve lower power consumption. In some semiconductor devices, a voltage raising circuit is provided to prevent the voltage to be supplied to internal circuitry from dropping in the event that the external supply voltage drops.

For example, Japanese Unexamined Patent Publication (Kokai) No. 62-17778 discloses a semiconductor memory that has a word line voltage raising circuit and that switches the word line voltage raising circuit by detecting the supply voltage.

On the other hand, Japanese Unexamined Patent Publication (Kokai) No. 2-183495 discloses a semiconductor memory having a supply voltage reducing circuit wherein an external supply voltage is supplied to a word line drive circuit when the internal voltage that the supply voltage reducing circuit produces drops below a predetermined value.

Furthermore, Japanese Unexamined Patent Publication (Kokai) No. 4-132084 discloses a semiconductor device having a voltage generation circuit for generating a plurality of voltages and a delivery circuit for delivering the different supply voltages produced by the voltage generation circuit to various circuit portions according to the operating conditions of the circuit portions, thus reducing power consumption in nonoperating portions.

In any of the above three prior art examples, the voltage to be applied to the internal circuitry is switched between two or more values to reduce power consumption and/or alleviate adverse effects caused by variations in the external supply voltage. As previously noted, in the low-dissipation type MOS static RAM, most of the standby power dissipation is due to the cell data retention current, but in any of the above three prior art examples, no particular description is given about reducing the cell data retention current during standby, nor is there any mention of measures against soft errors.

In low-dissipation type integrated circuit devices, the supply voltage is kept lower during standby than during active mode, to reduce the power consumption. When effecting such supply voltage switching, it is usual to switch the voltage to be supplied to the cell array to a higher voltage so that the stored information can be retained. It is therefore necessary to detect the supply voltage when it is switched to a lower voltage. To effect such voltage switching, there has previously been used a circuit that detects the voltage dropping to a predetermined voltage. When switching the voltage to be supplied to the cell array from one value to another, the voltage to be supplied to the cell array must be switched to the higher voltage immediately when the supply voltage switching to the lower voltage is detected. Various circuits have been used to detect the switching of the supply voltage to the lower voltage, but no circuits have been available that perfectly satisfy the above requirement.

For example, in the above Japanese Unexamined Patent Publication (Kokai) No. 62-177787, there is disclosed a circuit that detects the supply voltage dropping to a predetermined value; similar circuits are also disclosed in Japanese Unexamined Patent Publication (Kokai) Nos.

62-150586, 62-188090, 63-103978, and 3-238365. These circuits, however, have the same problem as described above.

Accordingly, there is a demand to provide a circuit that is capable of promptly detecting the switching of the supply voltage to the lower voltage by using simple circuitry constructed with ordinary transistors.

With recent increases in the operating speeds and functional capabilities of semiconductor devices, it is commonly practiced to detect transitions of various signals and utilize their detection signals. In semiconductor memories such as static RAMs, transitions of address signals are detected to reset internal circuits or limit the operating intervals. Since the detection signals generated by detecting these transitions serve as the basic signals for various operations, reliable detection sensitivity and high speed response are demanded. Such address signal transition detection signals are generated from address complementary signals, the address signals of opposite polarity generated within the semiconductor memory. The circuit designed to detect the address signal transitions is called an address transition detection (ATD) circuit.

Japanese Unexamined Patent Publication (Kokai) Nos. 59-151523 and 3-263688 disclose address transition detection circuits utilizing NAND circuits: Japanese Unexamined Patent Publication (Kokai) No. 59-151523 discloses an address transition detection circuit with simple circuitry, and Japanese Unexamined Patent Publication (Kokai) No. 3-263688 discloses an address transition detection circuit that generates stable pulses.

In a memory device, a transition detection circuit that generates a pulse by detecting an address signal transition is required not only to respond to signal transitions at high speed, as described above, but also to generate a pulse in response to each signal transition for a prescribed period starting from the instant of transition. This is necessary for reset operations, etc., within the memory device. This requirement means that even when successive transitions occur within a short period of time because of introduction of noise, etc., in the address pulses, a prescribed pulse must be generated in response to each transition, and that even when a long train of successive pulses occurs depending on the transition pattern, for the last occurring transition a pulse must be generated that stops at the end of the prescribed period.

However, the address transition detection circuits disclosed in the above Japanese Unexamined Patent Publication (Kokai) Nos. 59-151523 and 3-263688 are not designed to generate a pulse in response to such a signal transition for a predetermined period starting from the instant of transition, and therefore, have the problem that when used in a semiconductor memory such as a static RAM, proper operations may not be performed as bit line resets, etc., may not be performed in the case of address pulses containing noise, etc., that causes successive transitions within a short period of time.

In recent years, with increasing storage capacity of Static RAMs and other semiconductor devices, the chip area has been increasing, and accordingly, signal delay due to increased signal line length and failure of synchronization with other signals due to such delay have been posing problems. It is therefore demanded that the circuits be designed by considering signal delays caused by increased wiring length of signal lines. According to prior known signal line wiring for a semiconductor device, it is practiced to lay out the signal lines so that each signal line is run over the shortest possible distance to reduce the signal propagation delay attributable to the signal line length.

Thus, in the prior known signal line wiring layout, since each signal line is run over the shortest possible distance and its signal propagation direction (wiring direction) is determined without considering the wiring directions of adjacent signal lines, there occurs a timing difference between signals in terms of propagation times because of the arrangement and increased length of the signal lines. This causes situations where in some circuit blocks the timing difference between input signals is relatively small, while in other circuit blocks, the timing difference is relatively large, the resulting problem being that where the timing difference is large, the relevant circuit blocks are prone to malfunction.

Japanese Unexamined Patent Publication (Kokai) No. 3-137886 discloses a semiconductor memory equipped with means for controlling the amount of propagation delay so that the propagation delay is substantially equal for all control signals supplied to address signal processing circuits arranged in different locations on the chip. Furthermore, Japanese Unexamined Patent Publication (Kokai) No. 3-48455 discloses a wiring pattern designed to reduce the amount of signal propagation delay, while in Japanese Unexamined Patent Publication (Kokai) No. 4-132242, there is disclosed a semiconductor device in which variations in the propagation time between signals propagating along the chip are reduced. However, in any of these prior art examples, there is no mention made of the malfunctioning caused by the timing difference resulting from the signals propagating in different directions, and with these prior art arrangements, it is not possible to solve this problem.

SUMMARY OF THE INVENTION

The present invention aims to solve the above enumerated problems.

It is a first object of the invention to provide a MOS static RAM capable of providing the necessary performance according to the condition of the supply voltage supplied to the chip such that the power consumption can be reduced when it is required to reduce the power consumption during standby, and sufficient soft error resistance can be secured when it is required to provide sufficient soft error resistance for the cell.

It is a second object of the invention to provide a high-level supply voltage drop detection circuit capable of detecting a high-level supply voltage drop by using simple circuitry constructed with transistors of conventional structure.

It is a third object of the invention to provide a transition detection circuit that has a high operating speed and is capable of detecting a signal transition without fail even when inversion of input complementary signals occurs at intervals shorter than the duration of the transition detection pulse output.

It is a fourth object of the invention to provide a semiconductor device having a wiring pattern that eliminates the timing difference resulting from the difference in propagation time between the various signals supplied to various circuit blocks, and thus prevents circuit malfunctioning.

According to a first mode of the invention that accomplishes the first object, there is provided a MOS static RAM which comprises: a power supply circuit for generating a plurality of voltages of different voltage values in accordance with variations in an external supply voltage; and a selection circuit for selecting one voltage from among the plurality of voltages output from the power supply circuit and supplying the selected voltage as a cell data retention voltage to a flip-flop that forms a cell. The power supply circuit may include either a voltage reducing circuit that reduces the external supply voltage or a voltage raising circuit that raises the external supply voltage, or may include both of these circuits. The selecting operation of the selection circuit may be performed by detecting a change in the external supply voltage or a change in the voltage created from the external supply voltage.

In the MOS static RAM according to the first mode of the invention, control is performed in such a manner that a low-value voltage is selected as the cell data retention voltage from among the plurality of voltages output from the power supply circuit when the standby power consumption is to be reduced and a high-value voltage is selected as the cell data retention voltage from among the plurality of voltages output from the power supply circuit when sufficient soft error resistance is to be secured for the cell.

According to a second mode of the invention that accomplishes the second object, there is provided a high-level supply voltage drop detection circuit which comprises: an nMOS transistor whose drain and gate are connected to a high-level supply voltage input terminal at which a high-level supply voltage is applied; a capacitor connected at one end thereof to the source of the nMOS transistor and connected at the other end to a low-level supply voltage input terminal at which a low-level supply voltage is applied; a pMOS transistor whose source is connected to the capacitor and whose gate is connected to the high-level supply voltage input terminal; and a resistor connected at one end thereof to the drain of the pMOS transistor and connected at the other end to the low-level supply voltage input terminal, characterized in that a high-level supply voltage drop detection signal is obtained from the drain of the pMOS transistor.

In the high-level supply voltage drop detection circuit according to the second mode of the invention, the nMOS transistor conducts when the high-level supply voltage is at a first voltage value, and is cut off when the supply voltage is below the first voltage value. Therefore, when the high-level supply voltage is at the first voltage value, the nMOS transistor is ON, and the capacitor is charged through the nMOS transistor, so that the voltage value at the output terminal becomes equal to the low-level supply voltage value. The pMOS transistor is OFF when the high-level supply voltage is held above a second voltage value lower than the first voltage value, and conducts when the supply voltage drops below the second voltage value. Accordingly, when the high-level supply voltage begins to fall from the first voltage value, the nMOS transistor is cut off, and until the high-level supply voltage drops to the second voltage value, the pMOS transistor is held OFF, so that the voltage value at the output terminal remains equal to the low-level supply voltage value. When the high-level supply voltage drops to the second voltage value, the pMOS transistor is turned on, and the charge stored on the capacitor is released through the pMOS transistor, so that a voltage higher than the low-level supply voltage is output at the output terminal as the high-level supply voltage detection signal.

According to a third mode of the invention that accomplishes the third object, there is provided a complementary signal transition detection circuit which comprises: a first NAND circuit to which a first signal of a complementary signal pair is input; a second NAND circuit to which a second signal of the complementary signal pair is input; a third NAND circuit to which the outputs of the first NAND circuit and the second NAND circuit are input and which outputs a pulse signal; a first delay circuit for delaying the output of the first NAND circuit and supplying the delayed output as an input signal to the second NAND circuit; and a second delay circuit for delaying the output of the second NAND circuit and supplying the delayed output as an input signal to the first NAND circuit. To accomplish the above object, the first delay circuit comprises a fourth NAND circuit, a first inverter circuit to which the output of the fourth NAND circuit is input, and a capacitive device connected between the output of the fourth NAND circuit and ground, the fourth NAND circuit being supplied at its inputs with the output of the first NAND circuit and the second signal of the complementary signal pair, and the second delay circuit comprises a fifth NAND circuit, a second inverter circuit to which the output of the fifth NAND circuit is input, and a capacitive device connected between the output of the fifth NAND circuit and ground, the fifth NAND circuit being supplied at its inputs with the output of the second NAND circuit and the first signal of the complementary signal pair. The NAND circuits may be replaced by NOR circuits.

In the complementary signal transition detection circuit according to the third mode of the invention, a change in the input signals is immediately reflected in the output, and the duration of the output pulse is determined by the length of the discharge time of the capacitive device. Further, the second signal and the first signal in the complementary signal pair are applied as inputs to the fourth NAND circuit in the first delay circuit and the fifth NAND circuit in the second delay circuit, respectively. When the input signals are inverted, since the input signal being applied to the NAND circuit connected to the capacitive device to be charged is inverted and changes to low, the capacitive device immediately begins to charge. When the charging is completed, it is possible to output a proper pulse in response to the inversion of the input signals; therefore, proper pulses can be generated even when successive inversions of the input signals occur.

According to a fourth mode of the invention that accomplishes the fourth object, there is provided a semiconductor device which comprises a plurality of different signal sources, a plurality of signal lines for carrying a plurality of signals, respectively, generated from the signal sources, and at least one circuit block to which the plurality of signals are supplied via the signal lines, characterized in that the plurality of signal lines are arranged so that they run in the same direction. When the signal lines have different wiring lengths, means may be provided that adjusts the difference so that each signal line has the same signal propagation delay time. The means for adjusting the delay time may be realized by introducing a delay circuit partway through the signal line, or by setting the line widths of the signal lines at different values so that each signal line has the same propagation delay time.

In the semiconductor device according to the fourth mode of the invention, since the signal lines extending from the plurality of signal sources to the destination circuit blocks are arranged so that they run in the same direction, the signal propagation timing (i.e., the delay amount) between the signals can be made equal at any specific point on the signal lines. This serves to prevent malfunctioning of the circuit blocks.

BRIEF DESCRIPTION OF THE DRAWINGS

The above object and the feature of the present invention will be more apparent from the following description of the preferred embodiments with reference to the accompanying drawings:

FIG. 1 is a diagram showing the basic configuration of a MOS static RAM according to a first mode of the invention;

FIG. 18 is a waveform diagram for explaining the operation of the fifth embodiment of the invention when the resistance value of a clamping resistor is increased;

FIG. 19 is a waveform diagram for explaining the operation of the sixth embodiment of the invention;

FIGS. 20A and 20B are circuit diagrams showing a seventh embodiment of the invention;

FIGS. 28A to 28E is a diagram showing potential changes at various parts of the circuit of FIG. 27;

FIGS. 43A to 43F is a diagram showing timing differences between signals in the arrangement of FIG. 42;

FIGS. 45A to 45F is a diagram showing timing differences between signals in the arrangement of FIG. 44;

FIG. 46 is a diagram schematically showing a signal line wiring layout according to a 12th embodiment.

DESCRIPTION OF THE PREFERRED EMBODIMENTS

Figure 2A:
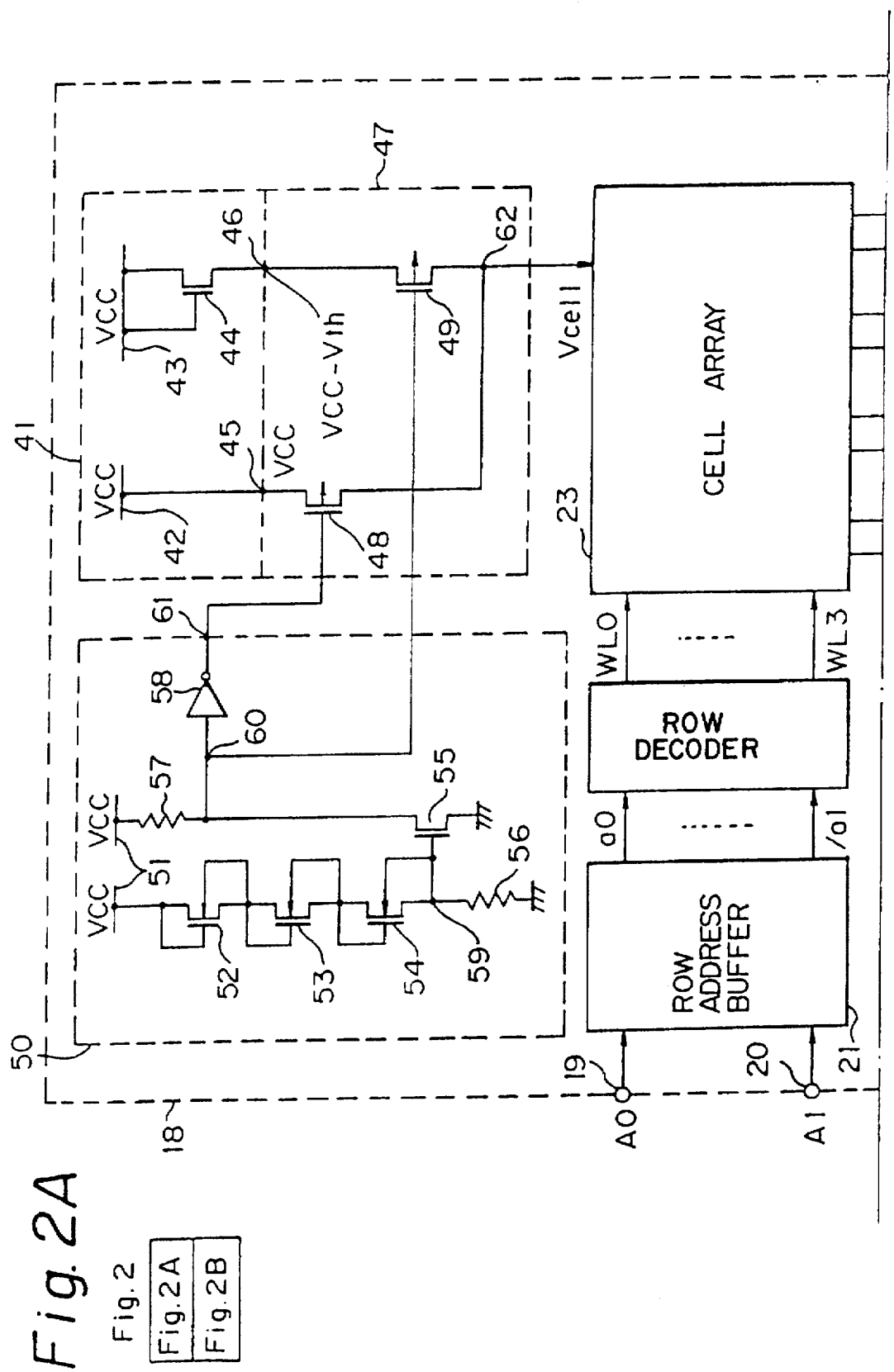
FIGS. 2A and 2B are block diagrams showing the essential portions of a first embodiment of the invention.

FIG. 1 is a diagram showing the basic configuration of a portion of a MOS static RAM according to a first to a third embodiment of the invention, which specifically concerns the present invention. In FIG. 1, the reference numeral 11 designates a power supply circuit 11 that produces a plurality of voltages V1, V2, . . . . . Vn of different voltage values in accordance with variations in the external supply voltage VCC; the reference numeral 14 indicates a selection circuit 14 that selects one voltage from among the plurality of voltages V1, V2, . . . , Vn output from the power supply circuit 11 and that supplies the selected voltage as a cell data retention voltage to a flip-flop 13 that forms a cell 12; 15-1, 15-2, . . . , 15-n denote switch devices that form the selection circuit 14; S1, S2, . . . , Sn refer to switch control signals for controlling the ON/OFF operations of the switch devices 15-1, 15-2, . . . , 15-n; 16 and 17 indicate cell-selection nMOS transistors; WL is a word line; and BL and /BL represent bit lines.

In the illustrated MOS static RAM, control is performed in such a manner that when the standby power consumption is to be reduced, one voltage with a low voltage value is selected as the cell data retention voltage from among the plurality of voltages V1, V2, . . . , Vn output from the power supply circuit 11, and when sufficient soft error resistance is to be secured for the cell, one voltage with a high voltage value is selected as the cell data retention voltage from among the plurality of voltages V1, V2, . . . , Vn output from the power supply circuit 11.

In the MOS static RAM of the present invention, the power supply circuit 11 produces multiple voltages, as described above, but in the embodiments hereinafter described, it is assumed for simplicity that the power supply circuit 11 produces two different voltages.

Figure 2B:
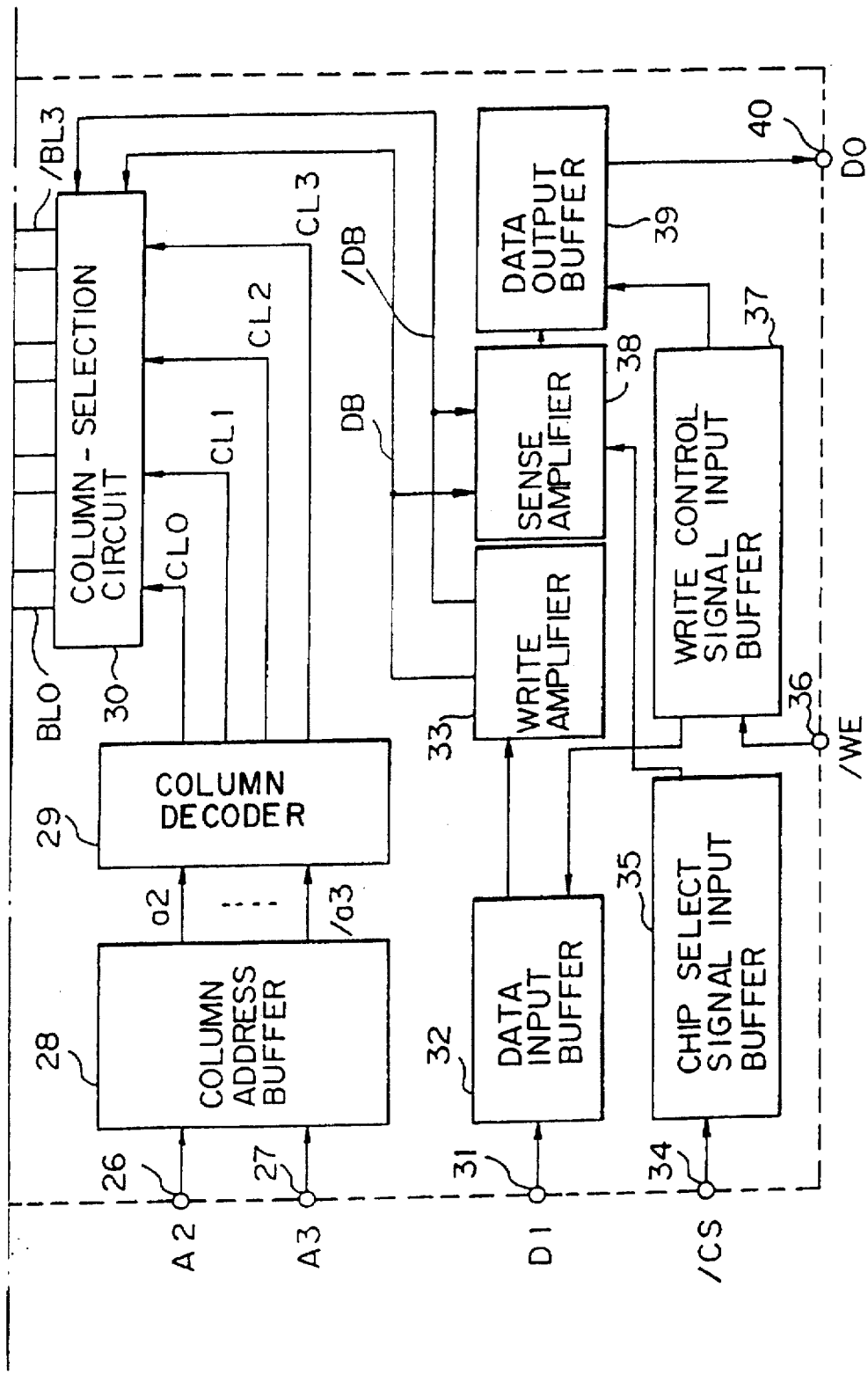

FIGS. 2A and 2B show the essential portions of the first embodiment, wherein the reference numeral 18 designates the chip; 19 and 20 indicate row address signal input terminals at which row address signals, A0 and A1, are applied; 21 denotes a row address buffer that performs waveshaping on the row address signals, A0 and A1, input via the row address signal input terminals, 19 and 20, and that outputs internal row address signals, a0, /a0, a1, and /a1, by generating the complements of the row address signals A0 and A1; 22 refers to a row decoder for decoding the internal row address signals, a0, /a0, a1, and /a1, supplied from the row address buffer 21; and 23 shows a cell array consisting of an array of cells.

Figure 3:
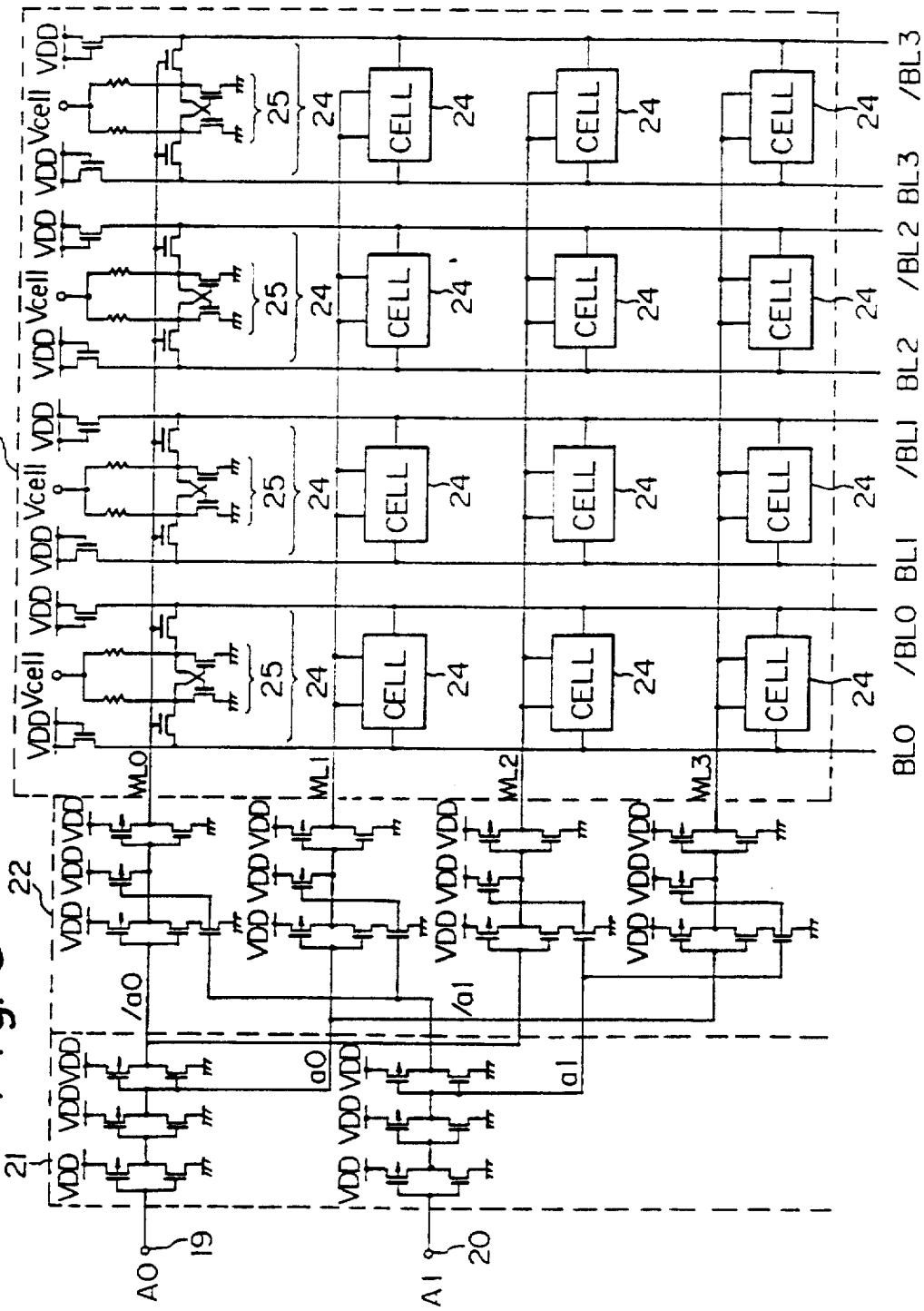
FIG. 3 is a circuit diagram showing a detailed construction of a row address buffer, a row decoder, and a cell array according to the first embodiment of the invention.

In a specific example, the row address buffer 21, the row decoder 22, and the cell array 23 are constructed as shown in FIG. 3. In the figure, WL0 to WL3 represent word lines, BL0 to BL3 designate bit lines, and VDD denotes internal supply voltage.

Further, the reference numeral 24 indicates a high resistance load type cell, and 25 refers to a high resistance load type flip-flop that forms the cell 24. A cell data retention voltage VCELL is supplied to each flip-flop 25 from a power supply circuit which will be described later.

Figure 4:
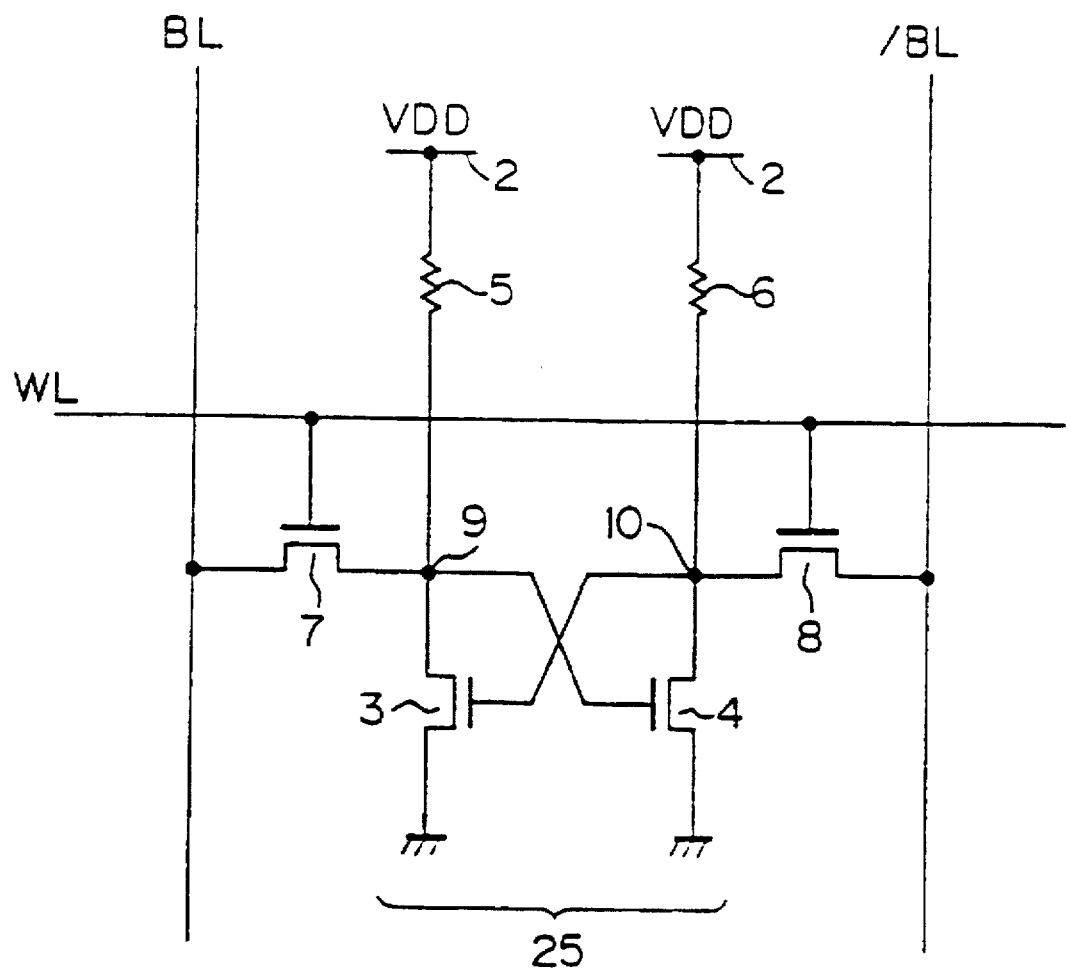
FIG. 4 is a circuit diagram showing the configuration of a cell according to the first embodiment of the invention.

FIG. 4 is a diagram showing the configuration of the high resistance load type cell 25.

In FIG. 4, the reference numeral 25 is a flip-flop acting as the memory element; 2 is a VDD line for supplying an internal reduced voltage which is obtained by reducing the external supply voltage within the chip; 3 and 4 are nMOS transistors acting as drive elements; 5 and 6 are high-value resistors for leakage compensation; 7 and 8 are cell-Selection nMOS transistors; WL is a word line connected to the row decoder (not shown); BL and/BL are a bit line pair connected to a column-selection gate (not shown).

Here, if node 9 is high, for example, the nMOS transistor 4 is ON, node 10 is low, and the nMOS transistor 3 is OFF; hence, the node 9 is maintained at high.

In this case, current flows to the node 9 through the leak-compensating high-value resistor 5 from the VDD line 2, the high-value resistor 5 thus acting to compensate for a voltage drop at the node 9 due to leakage.

Also, in this case, since the nMOS transistor 4 is ON, current flows from the VDD line 2 to ground through the high-value resistor 6 and the nMOS transistor 4; this current is consumed as the cell data retention current, i.e., the current used to retain the cell data.

On the other hand, when node 10 is high, then the nMOS transistor 3 is ON, node 9 is low, and the nMOS transistor 4 is OFF; hence, the node 10 is maintained at high.

In this case, current flows from the VDD line 2 to the node 10 through the leakage-compensating high-value resistor 6, the high-value resistor 6 thus acting to compensate for a voltage drop at the node 10 due to leakage.

Also, in this case, since the nMOS transistor 3 is ON, current flows from the VDD line 2 to ground through the high-value resistor 5 and the nMOS transistor 3; this current is consumed as the cell data retention current.

It would be possible to reduce the cell data retention current by increasing the resistance value of the resistors 5 and 6. However, when the node 9 is set to a high level, a current of 10 to 100 fA needs to be fed to the node 9 to maintain it at the high level, and likewise, when the node 10 is set to a high level, a current of 10 to 100 fA needs to be fed to the node 10 to maintain it at the high level.

This imposes a limit on how large the resistance value of the high-value resistors 5 and 6 can be made, and because of this limitation, the cell data retention current inevitably increases with increasing cell density.

The increase of the cell data retention current due to increased cell density becomes a serious problem particularly for a so-called low-dissipation type MOS static RAM in which most of the standby power dissipation is due to the cell data retention current.

Furthermore, as the parasitic capacitances at the nodes 9 and 10 decrease because of reduced cell size, the amount of charge stored at the node that is set high also decreases, which has been the cause of reducing the cell's soft error resistance.

This reduction of the soft error resistance with decreasing cell size becomes greater as the voltage applied to the node 9 or 10, whichever set to a high level, is reduced. This has presented a serious problem particularly for a MOS static RAM in which an internal supply voltage produced by reducing the external supply voltage is supplied to the cells. In the present embodiment, these problems are resolved. The present embodiment employs a high resistance load type memory cell, but the invention is not restricted to this particular type of memory cell and other types of memory cell may be used.

Referring back to FIGS. 2A and 2B, the reference numerals 26 and 27 designate column address signal input terminals at which column address signals, A2 and A3, are applied, and the numeral 28 denotes a column address buffer that performs waveshaping on the column address signals, A2 and A3, input via the column address signal input terminals, 26 and 27, and that outputs internal column address signals, a2, /a2, a3, and /a3, by generating the complements of the column address signals A2 and A3.

The numeral 29 designates a column decoder for decoding the column address signals, A2 and A3, input via the column address buffer 28, by using the internal column address signals a2, /a2, a3, and /a3.

Furthermore, CL0 to CL3 indicate column-selection signal lines derived from the column decoder 29, and 30 refers to a column-selection circuit for selecting a column in accordance with the column-selection signal supplied from the column decoder 29.

Figure 5:
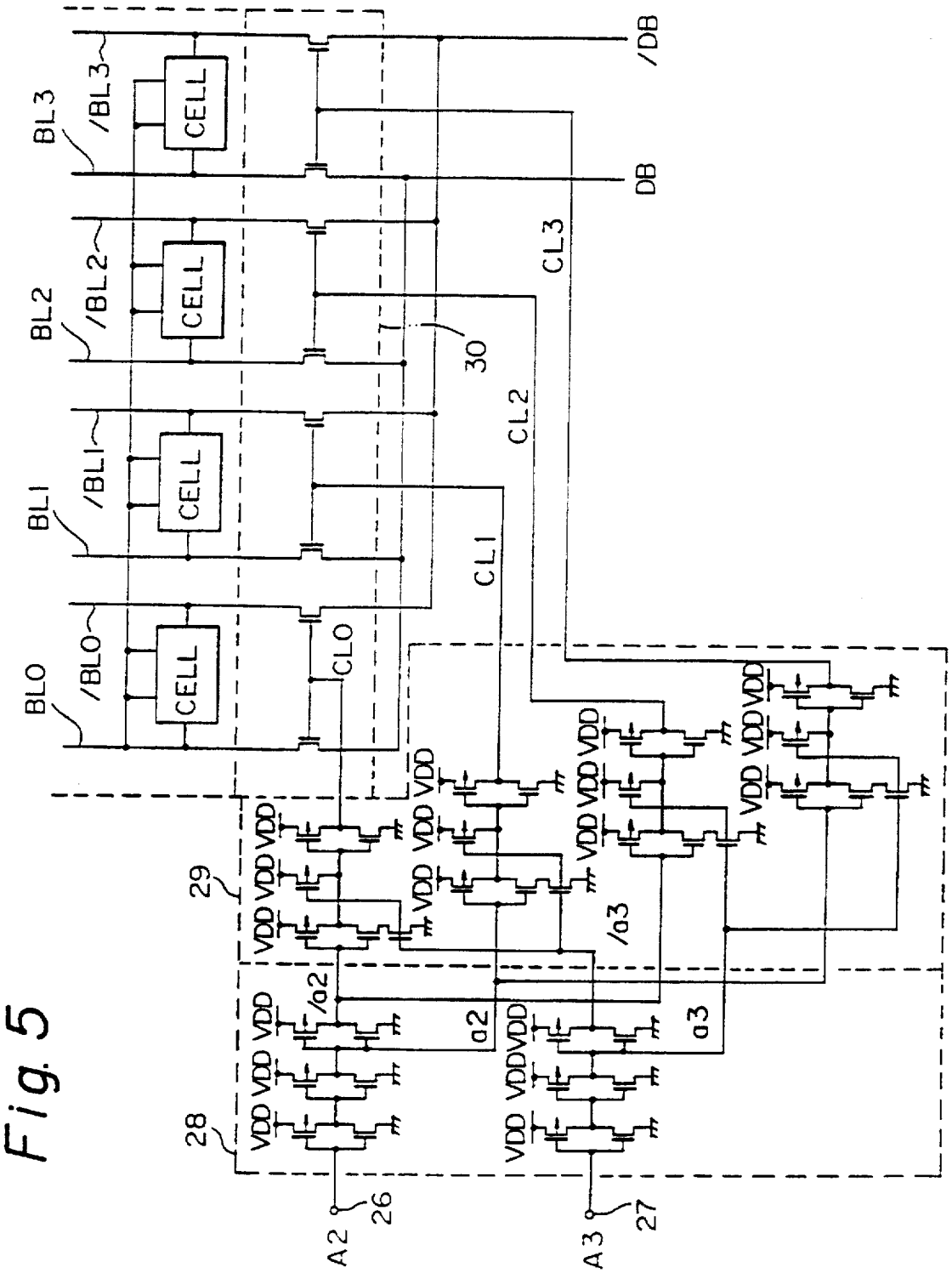
FIG. 5 is a circuit diagram showing a detailed construction of a column address buffer, a column decoder, and a column-selection circuit according to the first embodiment of the invention.

In a specific example, the column address buffer 28, the column decoder 29, and the column-selection circuit 30 are constructed as shown in FIG. 5. In the figure, DB and/DB indicate data buses.

Further, in FIGS. 2A and 2B, the numeral 31 designates a data input terminal at which data DI to be written to the cell array 23 is applied, and the numeral 32 denotes a data input buffer that performs waveshaping on the data DI input via the data input terminal 31.

The numeral 33 is a write amplifier used to write the data DI, input via the data input buffer 32, into a cell 24 designated by the row address signals A0, A1 and column address signals A2, A3.

The numeral 34 is a chip select signal input terminal at which a chip select signal /CS is applied, and the numeral 35 is a chip select signal input buffer that performs waveshaping on the chip select signal /CS input via the chip select signal input terminal 34.

The numeral 36 indicates a write control signal input terminal at which a write control signal /WE is applied, and the numeral 37 denotes a write control signal input buffer that performs waveshaping on the write control signal /WE input via the write control signal input terminal 36.

Furthermore, the numeral 38 designates a sense amplifier for amplifying the data read out of the cell array 23, the numeral 39 denotes a data output buffer for outputting the data amplified by the sense amplifier 38 to outside circuitry, and the numeral 40 indicates a data output terminal via which output data DO from the data output buffer is output.

Figure 6:
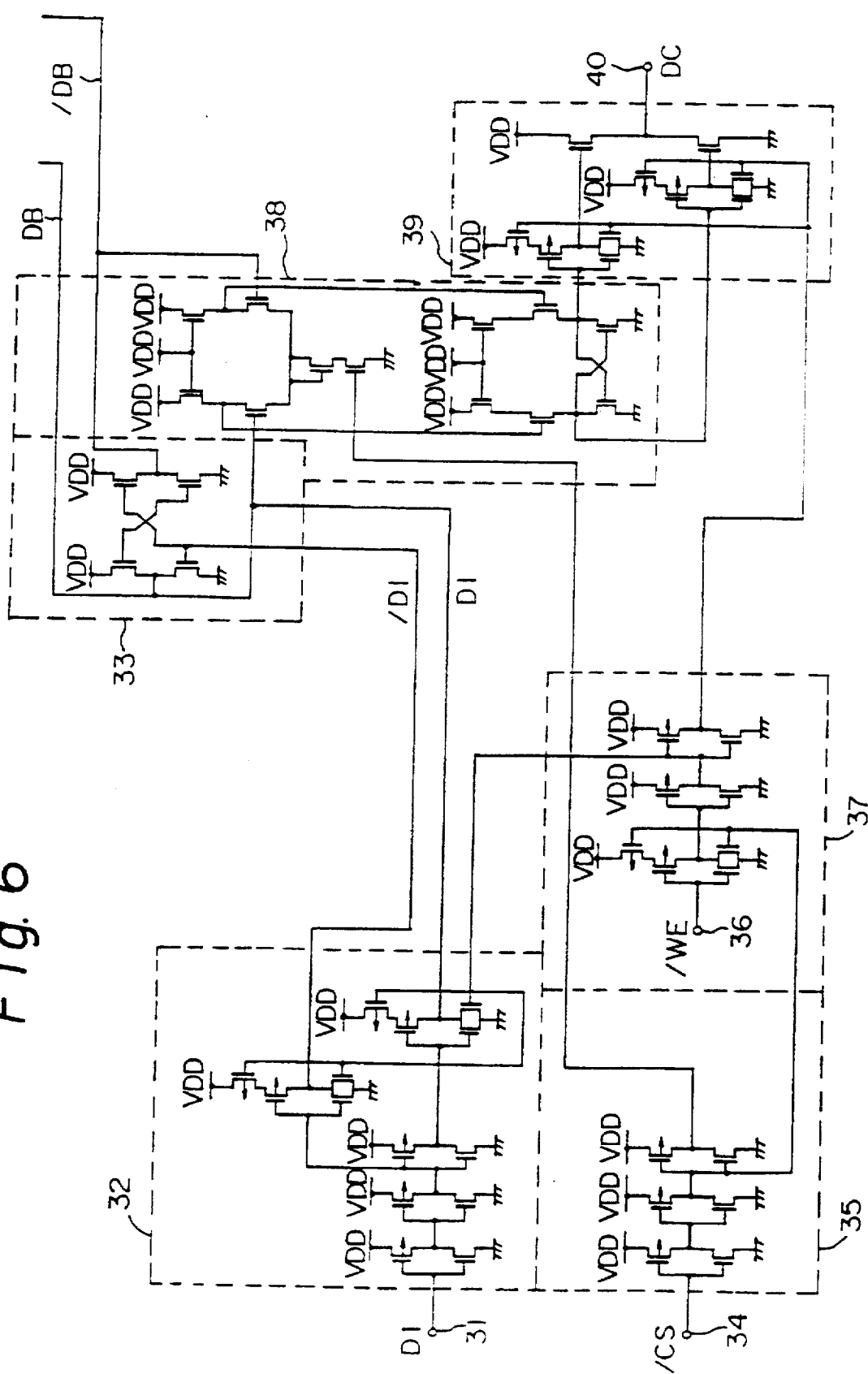
FIG. 6 is a circuit diagram showing detailed portions of a data input buffer, a write amplifier, a chip select signal input buffer, a write control signal input buffer, a sense amplifier, and a data output buffer according to the first embodiment of the invention.

In a specific example, the data input buffer 32, the write amplifier 33, the chip select signal input buffer 35, the write control signal input buffer 37, the sense amplifier 38, and the data output buffer 39 are constructed as shown in FIG. 6.

Turning back to FIGS. 2A and 2B, the numeral 41 designates a power supply circuit provided for the cells 24 (see FIG. 3), the numerals 42 and 43 indicate VCC power supply lines for supplying the external power supply voltage VCC to internal circuitry, and the numeral 44 denotes a diode-connected nMOS transistor.

The power supply circuit 41 for the cells 24 is constructed to output the external supply voltage VCC at node 45 and VCC−VTH (VTH: threshold voltage of the nMOS transistor) at node 46.

Furthermore, the numeral 47 designates a selection circuit that selects one or the other of the two voltages, VCC or VCC−VTH, output from the power supply circuit 41, and that supplies the selected voltage as the cell data retention voltage VCELL to the flip-flop 25 that forms the cell 24. The numerals 48 and 49 are pMOS transistors that act as switch devices.

The numeral 50 indicates an external supply voltage detection circuit that acts as a selection control circuit to control the ON/OFF operations of the pMOS transistors 48 and 49, and hence, the selection operation of the selection circuit 47; 51 denotes VCC power supply lines; 52 to 55 are nMOS transistors; 56 and 57 are clamping resistors; and 58 is an inverter.

Figure 7:
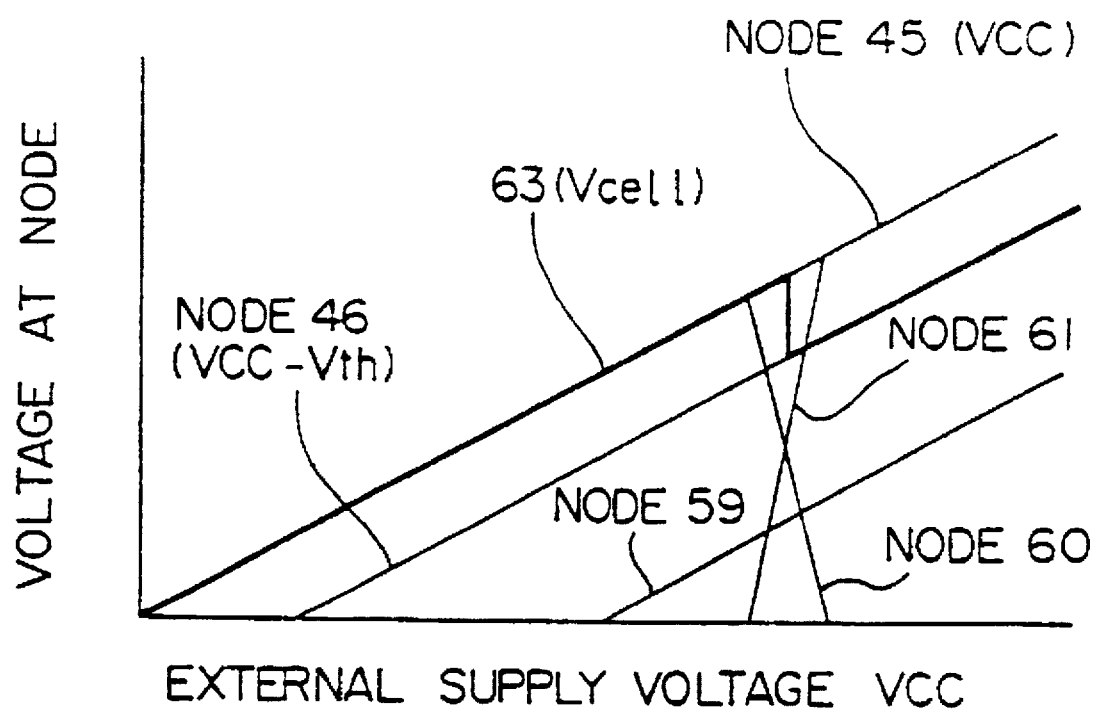
FIG. 7 is a diagram for explaining the operation of the first embodiment of the invention.

In FIG. 7, the voltages at nodes 45, 46, 59, 60, and 61 are plotted, along with the cell data retention voltage VCELL supplied to the flip-flop 25 forming the cell 24, as a function of the external supply voltage VCC. In the figure, the thick solid line 63 is a plot of the cell data retention voltage VCELL supplied to the flip-flop 25 forming the cell 24, as a function of the external supply voltage VCC.

That is, in the first embodiment, when VCC>=4×VTH, a voltage greater than VTH is applied to the gate of the nMOS transistor 55, so that the nMOS transistor 55 is ON, the node 60 is low, and the node 61 is high.

As a result, the pMOS transistor 48 is OFF, and the pMOS transistor 49 is ON, so that a voltage equal to VCC−VTH is applied as the cell data retention voltage VCELL to the flip-flop 25 that forms the cell 24, thus reducing the data retention current to reduce the power consumption during standby.

On the other hand, when VCC<4×VTH (cell data retention mode), the gate of the nMOS transistor 55 is supplied with ground potential, 0 V, so that the nMOS transistor 55 is OFF, the node 60 is high, and the node 61 is low.

As a result, the pMOS transistor 48 is ON, and the pMOS transistor 49 is OFF, so that the external supply voltage VCC is applied as the cell data retention voltage VCELL to the flip-flop 25 that forms the cell 24, thus ensuring sufficient soft error resistance for the cell 24.

With VTH=0.9 V, for example, when VCC>=4×0.9=3.6 V, a voltage equal to VCC−0.9 V is applied as the cell data retention voltage VCELL to the flip-flop 25 that forms the cell 24; as a result, the data retention current is reduced, achieving a reduction in the power consumption during standby.

On the other hand, when VCC<4×0.9=3.6 V, the external supply voltage VCC is applied as the cell data retention voltage VCELL to the flip-flop 25 that forms the cell 24, thus ensuring sufficient soft error resistance for the cell 24.

Figure 8A:
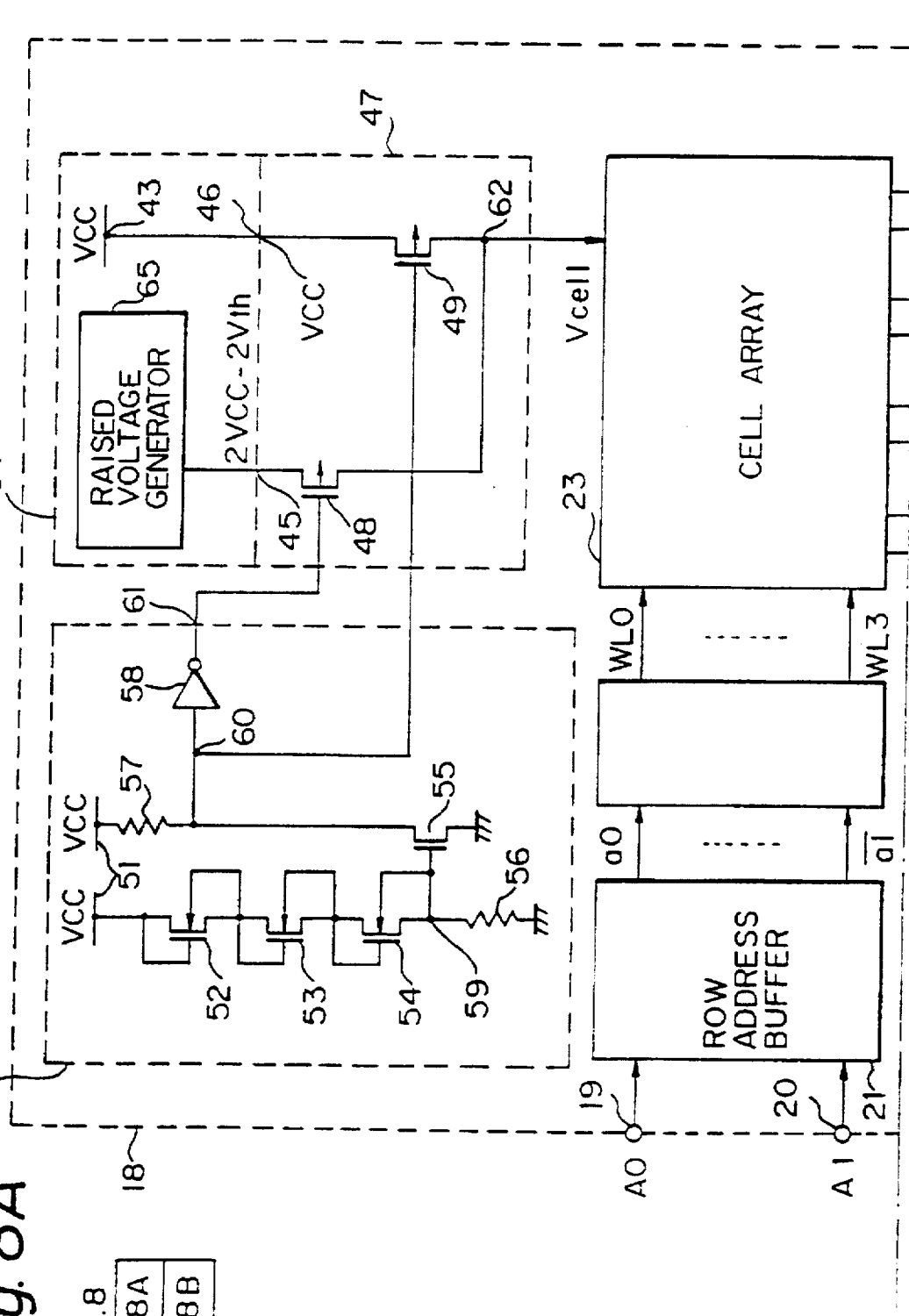
FIGS. 8A and 8B are block diagrams showing the essential portions of a second embodiment of the invention.
Figure 8B:
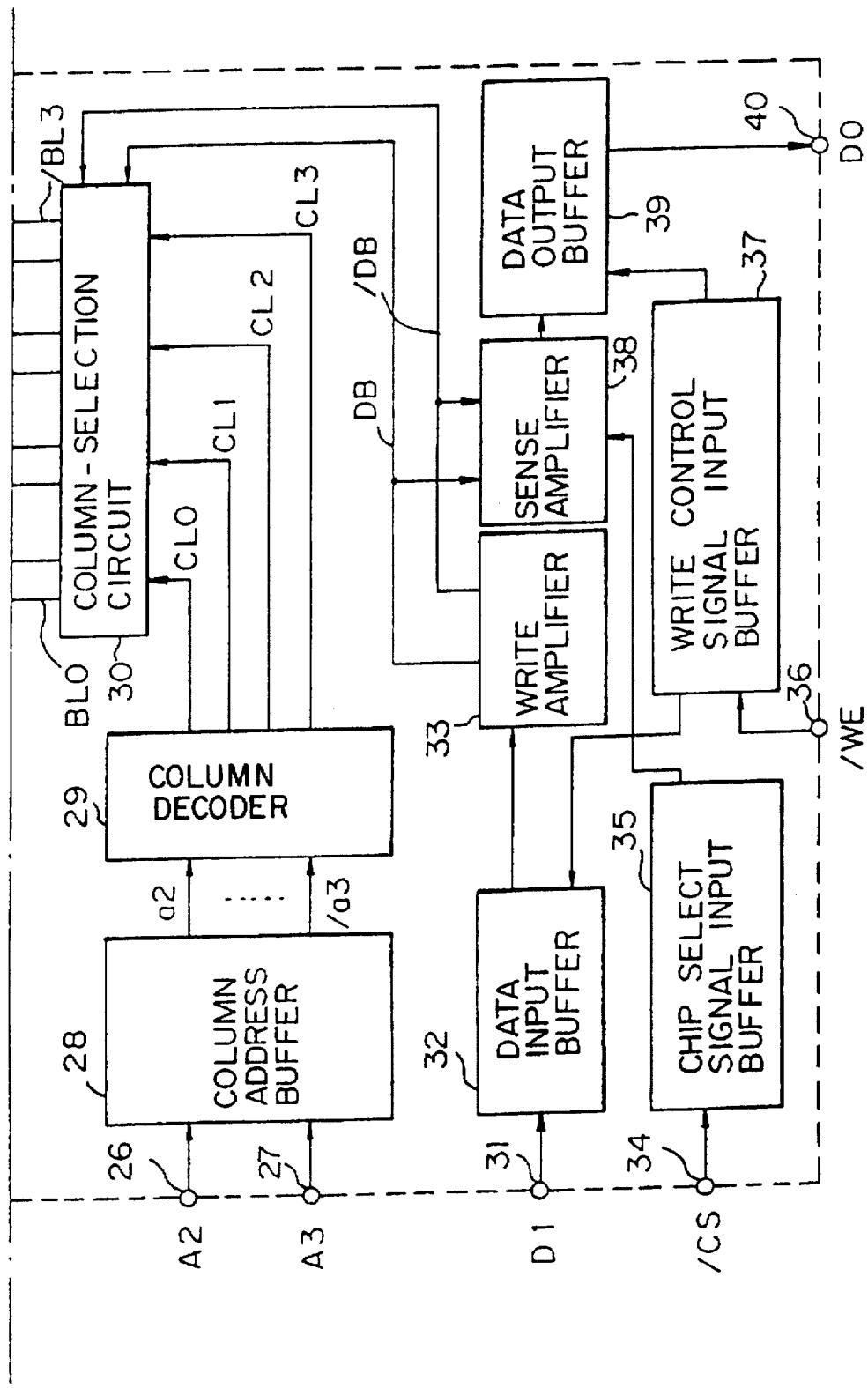

FIGS. 8A and 8B are block diagrams showing the essential portions of the second embodiment of the invention. The power supply circuit 64 employed in the second embodiment has a different circuit configuration than that of the power supply circuit 41 shown in FIG. 2.

Figure 9:
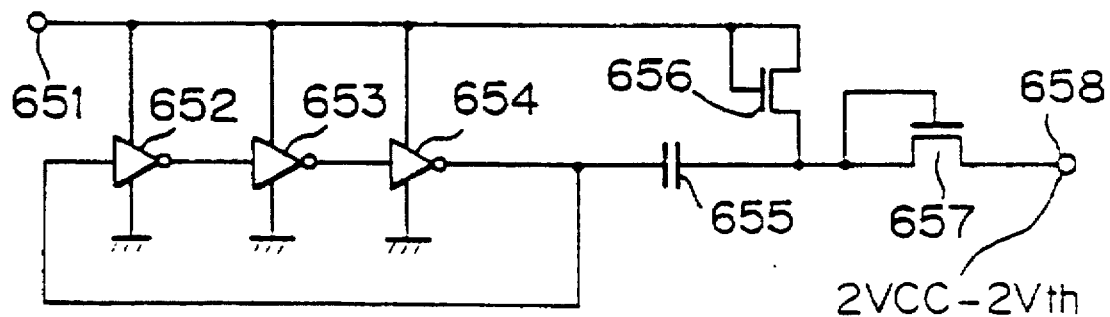
FIG. 9 is a circuit diagram showing the configuration in detail of a raised-voltage generating circuit according to the second embodiment of the invention.

In the power supply circuit 64, the reference numeral 65 designates a voltage raising circuit for generating a voltage by raising the external supply voltage VCC. In a specific example, the voltage raising circuit 65 is constructed as shown in FIG. 9.

In the figures, the numeral 651 is an external supply voltage input terminal; 652 to 654 are inverters that form an oscillator circuit; 655 is a capacitor; 656 and 657 are nMOS transistors; and 658 is a raised-voltage output terminal at which the raised-voltage is output. The voltage raising circuit 65 shown is designed to generate a raised voltage of 2VCC−2VTH.

That is, in the second embodiment, the power supply circuit 64 is constructed to output the raised voltage, 2VCC−2VTH, at node 45 and the external supply voltage VCC at node 46.

Figure 10:
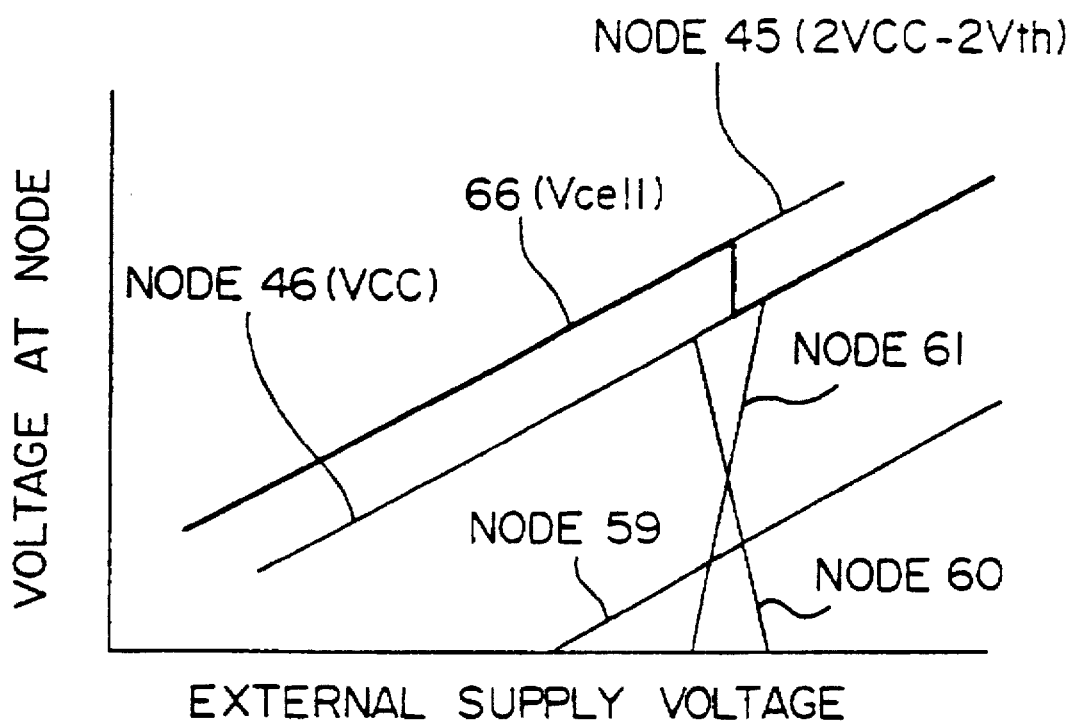
FIG. 10 is a diagram for explaining the operation of the second embodiment.

In FIG. 10, the voltages at nodes 45, 46, 59, 60, and 61 are plotted, along with the cell data retention voltage VCELL supplied to the flip-flop 25 forming the cell 24, as a function of the external supply voltage VCC. In the figure, the thick solid line 66 is a plot of the cell data retention voltage VCELL supplied to the flip-flop 25 that forms the cell 24, as a function of the external supply voltage VCC.

That is, in the second embodiment, when VCC>=4×VTH, a voltage greater than VTH is applied to the gate of the nMOS transistor 55, so that the nMOS transistor 55 is ON, the node 60 is low, and the node 61 is high.

As a result, the pMOS transistor 48 is OFF, and the pMOS transistor 49 is ON, so that the external supply voltage VCC is applied as the cell data retention voltage VCELL to the flip-flop 25 in the cell 24.

On the other hand, when VCC<4×VTH (cell data retention mode), the gate of the nMOS transistor 55 is supplied with ground potential, 0 V, so that the nMOS transistor 55 is OFF, the node 60 is high, and the node 61 is low.

As a result, the pMOS transistor 48 is ON, and the pMOS transistor 49 is OFF, so that the raised voltage, 2VCC–2VTH, is applied as the cell data retention voltage VCELL to the flip-flop 25 in the cell 24.

With VTH=0.9 V, for example, when VCC>=4×0.9=3.6 V, the external supply voltage VCC is directly applied as the cell data retention voltage VCELL to the flip-flop 25 that forms the cell 24.

On the other hand, when VCC<4×0.9=3.6 V, the raised voltage, 2VCC–2×0.9 V, is applied as the cell data retention voltage VCELL to the flip-flop 25 that forms the cell 24, thus ensuring sufficient soft error resistance for the cell 24.

Accordingly, the second embodiment is particularly effective in applications where the soft error resistance in the cell data retention mode in which the external supply voltage VCC is low is improved more than in the first embodiment.

In the above embodiments, the external power supply detection circuit 50 is provided as the circuit to control the selection circuit 47 that selects the cell data retention voltage VCELL. Alternatively, the selection circuit 47 may be controlled by using a reduced-voltage detection circuit, which detects the reduced voltage supplied from the voltage reducing circuit that reduces the external supply voltage, and/or a raised-voltage detection circuit, which detects the raised voltage supplied from the voltage raising circuit that raises the external supply voltage.

As described above, according to the first and second embodiments, when control is performed to select the lower voltage from among the plurality of voltages output from the power supply circuit, the standby power consumption can be reduced; when control is performed to select the higher voltage from among the plurality of voltages output from the power supply circuit, sufficient soft error resistance can be obtained for the cells.

Figures 11, 11A:
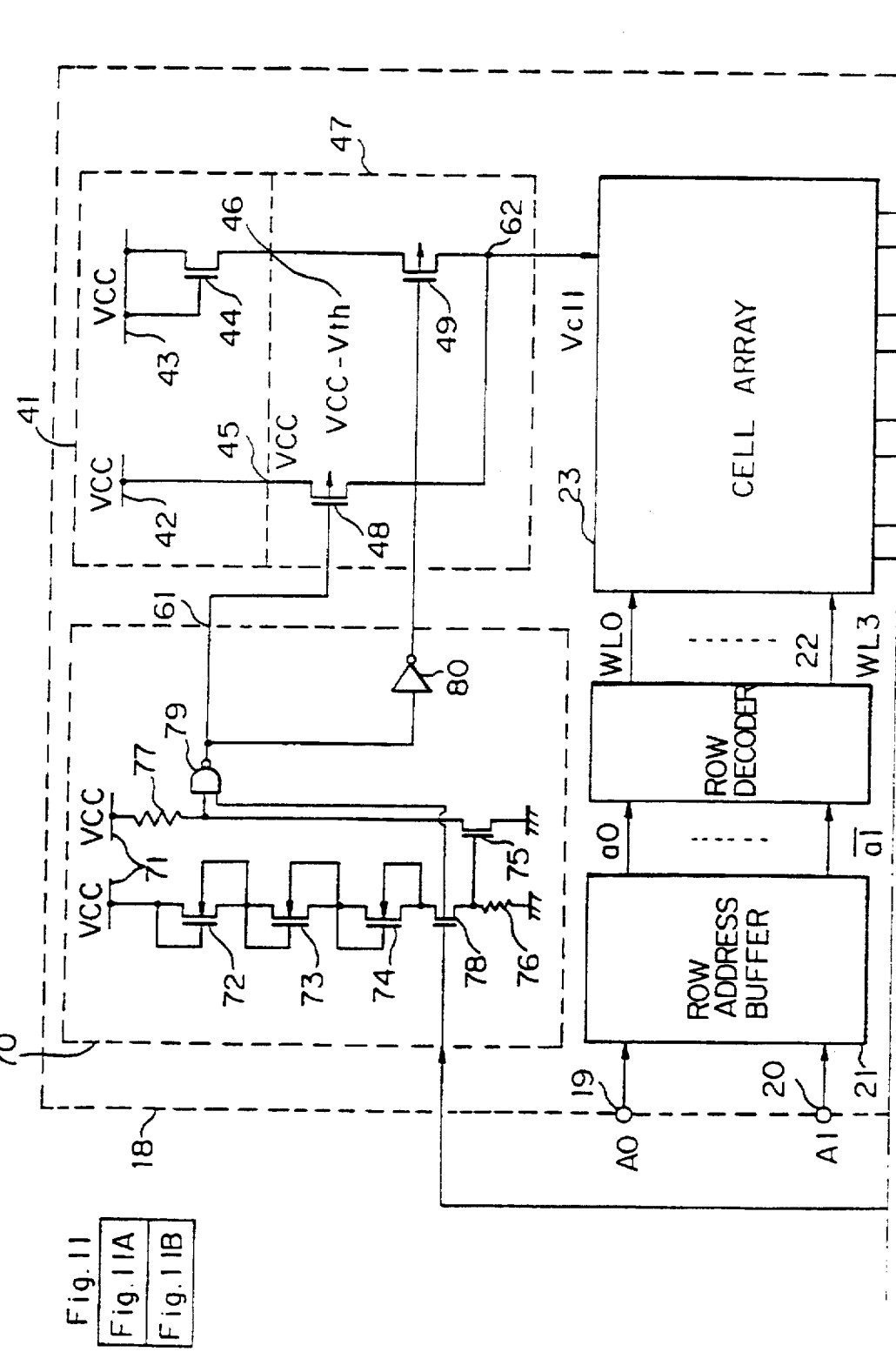
FIGS. 11A and 11B are diagrams showing the essential portions of a third embodiment of the invention.
Figure 11B:
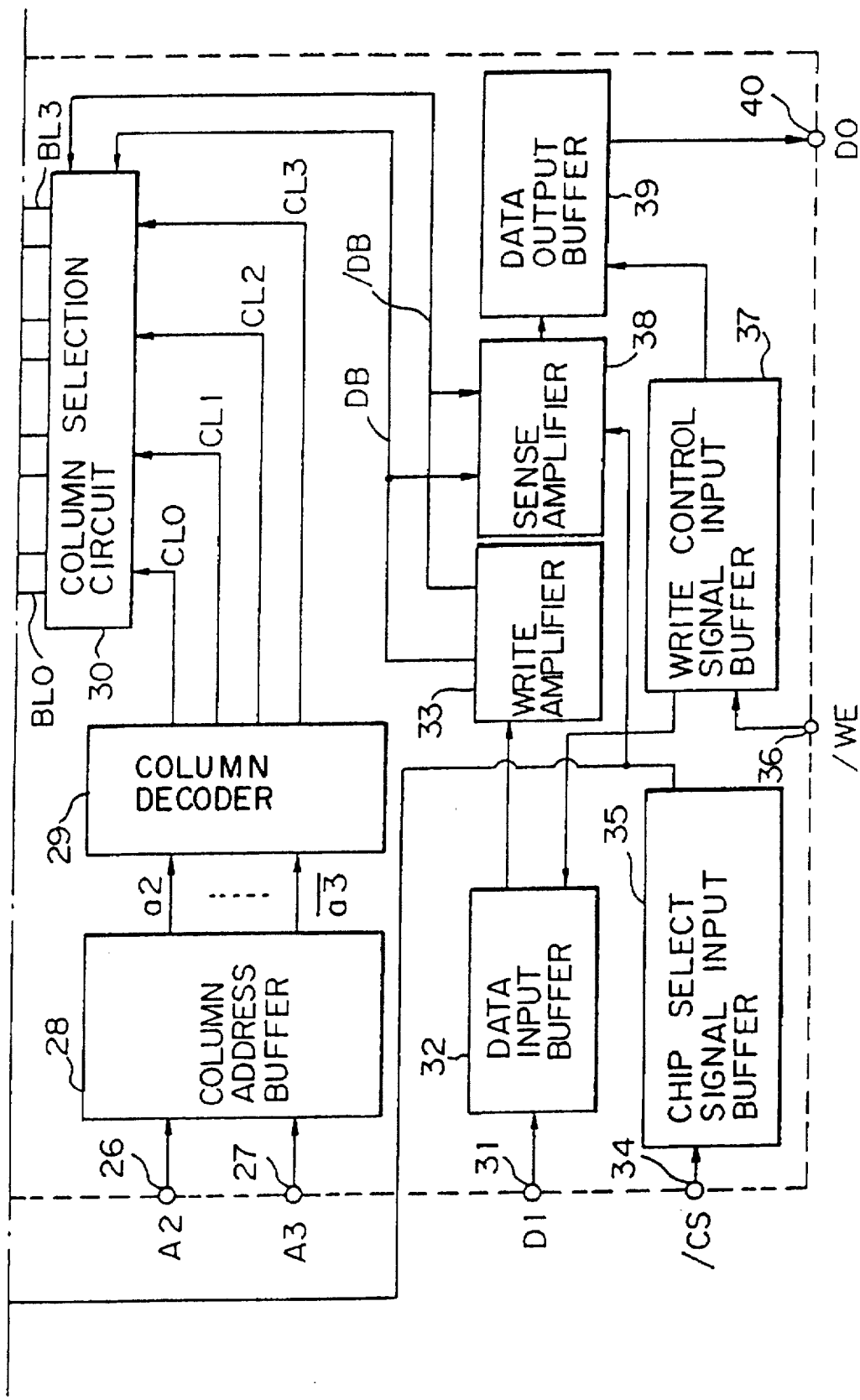

As can be seen from FIGS. 2A and 2B that show the essential portions of the first embodiment, in the external supply voltage detection circuit 50 current flows from the high level terminal 51 of the external power supply to ground through the nMOS transistors, 52, 53, and 54, and the resistor 56. This current flows regardless of whether the chip is in active mode or in standby mode, but in standby mode, the cell data retention current is supplied to the cell array 23 with the current cut off to other parts, reducing the power consumption of the chip as a whole; as a result, the current flowing in the external supply voltage detection circuit 50 becomes a problem in relative terms. The third embodiment hereinafter describes concerns an example in which current is cut off to the external supply voltage detection circuit 50 during standby to achieve a further reduction in the standby power consumption. FIGS. 11A and 11B are diagrams showing the essential portions of the third embodiment. As can be seen, the third embodiment is different from the first embodiment in that the external supply voltage detection circuit 70 is controlled by the chip select signal /CS.

The external supply voltage detection circuit 70 in the third embodiment is essentially the same as the external supply voltage detection circuit 50 in the first embodiment, except that an nMOS transistor 78, a NAND gate 79, and an inverter gate 80 are added. A standby signal output from the chip select signal input buffer 35 is applied to the gate of the nMOS transistor 78 and also to one input of the NAND gate 79. The chip select signal input buffer 35 generates the standby signal from the externally supplied chip select signal /CS. The chip select signal /CS is a signal to switch the chip between the active mode and the low-dissipation standby mode. The standby signal is set low in standby mode and high in active mode.

As can be seen from the diagram, the nMOS transistor 78 is OFF during standby so that no current flows to the resistor 76 regardless of the voltage value of the external supply voltage. As a result, the nMOS transistor 75 is also OFF, and no current flows to the resistor 77. At this time, the other input of the NAND gate 79 is high, but since the standby signal is low, the NAND gate outputs a high, which turns on the pMOS transistor 49, so that a reduced voltage is supplied to the Cell array 23. In other words, in standby mode the reduced voltage is supplied regardless of the voltage value of the external supply voltage.

On the other hand, in active mode, since the standby signal is high, the nMOS transistor 78 is ON, and the one input of the NAND gate is high; as a result, the external supply voltage detection circuit 70 of FIG. 11A functions in the same manner as the external supply voltage detection circuit 50 of the first embodiment shown in FIG. 2A. That is, when the external supply voltage increases, a reduced voltage is supplied to the cell array 23, and when the external supply voltage decreases, a raised voltage is supplied to the cell array 23.

Figure 12:
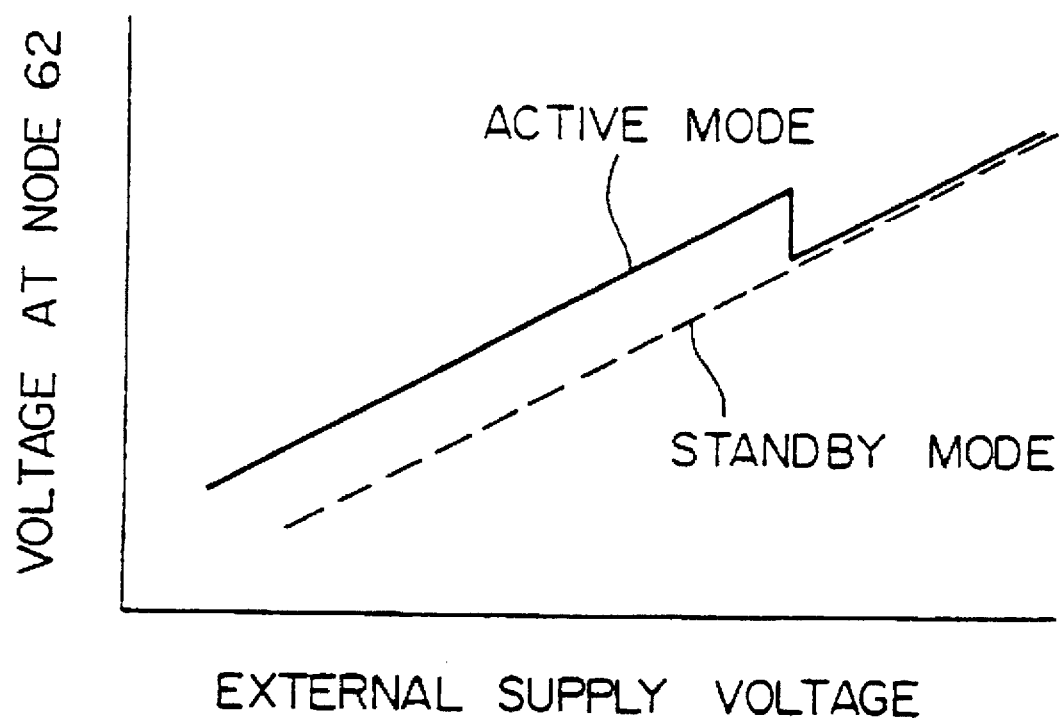
FIG. 12 is a diagram for explaining the operation of the third embodiment of the invention.

FIG. 12 is a diagram plotting the voltage at node 62, which voltage is supplied as the cell data retention voltage to the flip-flop in each cell, as a function of the external supply voltage VCC. In the figure, a solid line is for the voltage at node 62 in active mode, and a dashed line indicates the same in standby mode. As shown, in standby mode a reduced voltage is supplied at all times as the Cell data retention voltage, so that the standby current is further reduced as compared to the first embodiment.

In the first, second, and third embodiments, an external supply voltage detection circuit, such as shown in FIG. 2, is used as a circuit to detect the external supply voltage so that the cell data retention voltage to be supplied to the memory cell is controlled in accordance with variations in the external supply voltage. The design of semiconductor memory circuitry, however, is not restricted to this example, but some integrated circuits are designed so that, of the high-level and low-level supply voltages supplied from an external power supply, the high-level supply voltage value is varied according to the kind of operation mode.

For example, in some static random-access memories (SRAMs) which are semiconductor memories, the high-level voltage value during cell data retention mode is made lower than the high-level voltage supplied during write mode, read mode, and standby mode. Such SRAMs are constructed so that during write, read, and standby modes, the external high-level supply voltage is reduced on the chip and the thus reduced voltage is used as the internal high-level supply voltage; on the other hand, during cell data retention mode the external high-level supply voltage is directly used as the internal supply voltage. In such SRAMs, therefore, it is required that the decrease of the external high-level supply voltage when switching to cell data retention mode be immediately detected and the internal high-level supply voltage be switched from the reduced voltage to the high-level supply voltage at high speed. For this purpose, a supply voltage detection circuit is used that detects the high-level supply voltage dropping to a predetermined voltage, but in the current situation, the performance of such detection circuits is not sufficient when it comes to high-speed switching. One possible approach to solving this problem would be to control the supply voltage detection circuit by using a high-level supply voltage drop detection circuit that would directly detect the decrease of the high-level supply voltage at high speed. However, such a high-level supply voltage drop detection circuit for directly detecting the decrease in the high-level supply voltage at high speed is not known yet.

An alternative approach would then be by using a signal level drop detection circuit, but since the voltage supplied to the detection circuit itself drops, it is difficult to detect the voltage drop by using such a circuit under the current circumstances.

The fourth embodiment of the invention hereinafter described is concerned with a high-level supply voltage drop detection circuit that is designed to detect the high-level supply voltage when it drops by a prescribed amount.

Figure 13:
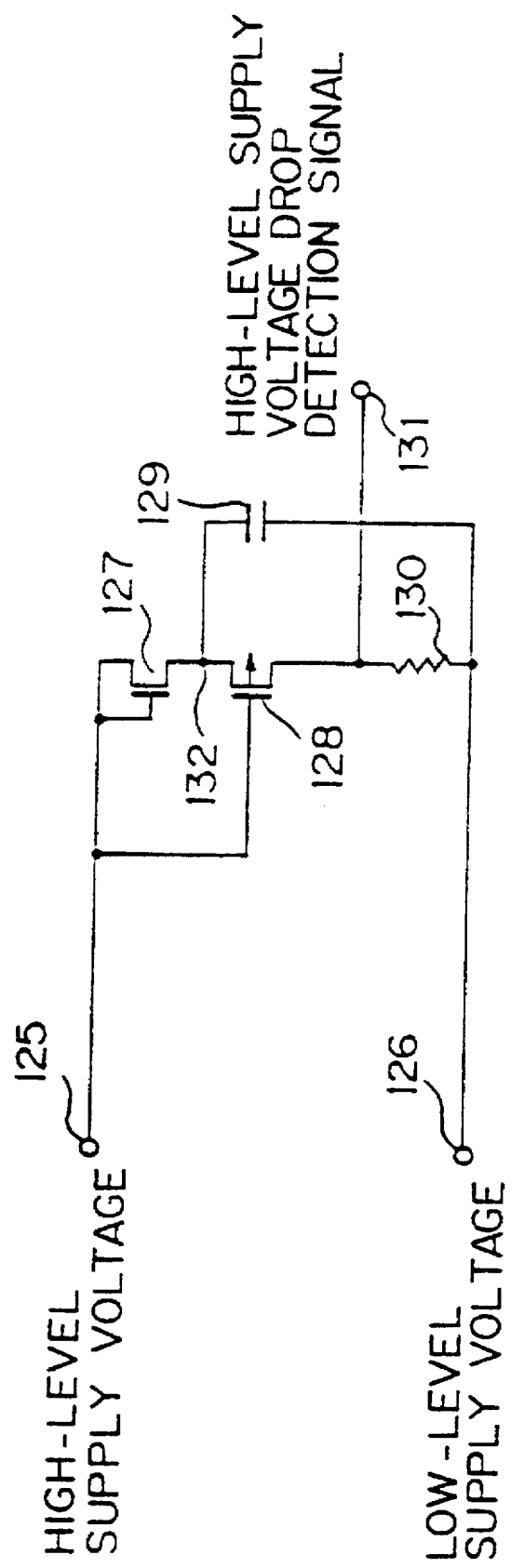
FIG. 13 is a circuit diagram showing a fourth embodiment of the invention.

FIG. 13 is a circuit diagram illustrating the high-level supply voltage drop detection circuit according to the fourth embodiment of the invention.

In FIG. 13, the reference numeral 125 is a high-level supply voltage input terminal at which a high-level supply voltage whose maximum voltage value is VA is applied; 126 is a low-level supply voltage input terminal at which a low-level supply voltage is applied; 127 is an nMOS transistor; 128 is a pMOS transistor; 129 is a capacitor; 130 is a resistor; and 131 is an output terminal.

Figure 14:
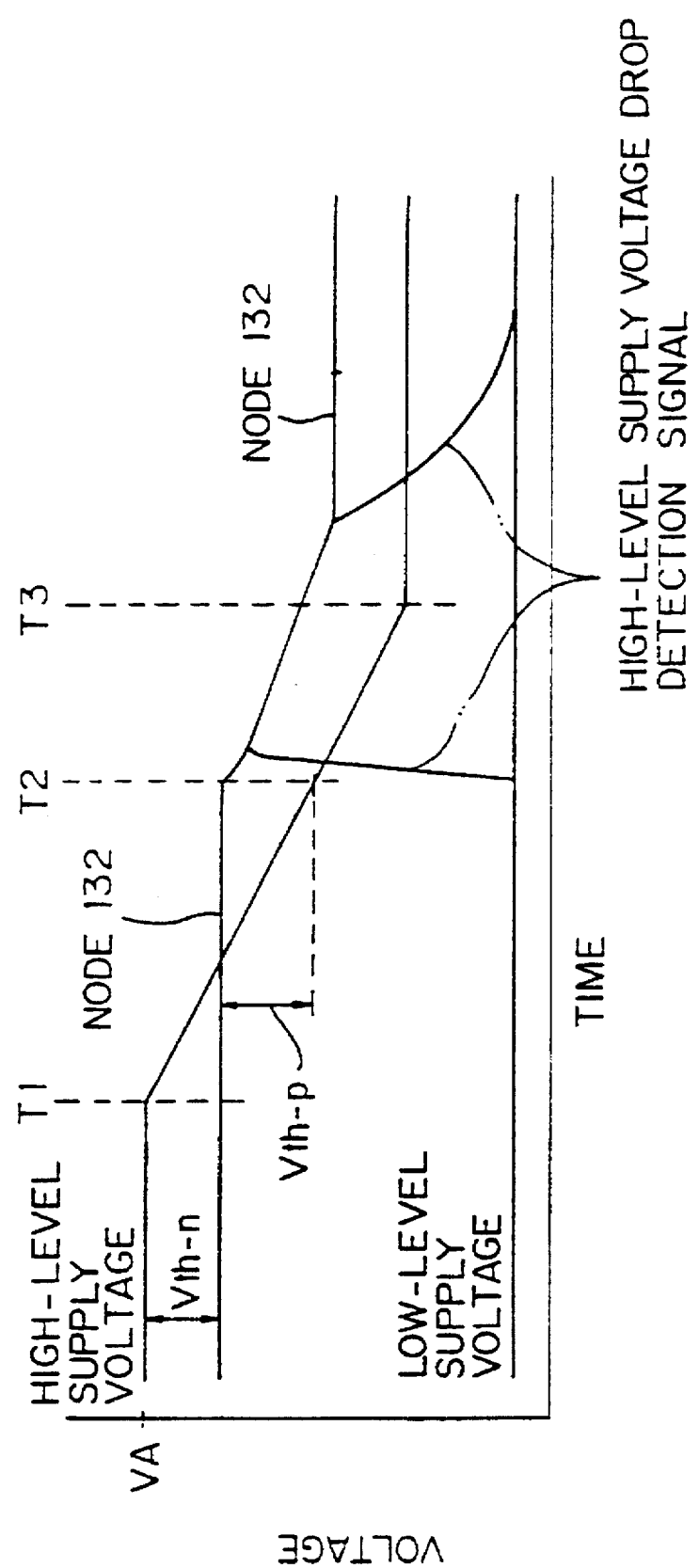
FIG. 14 is a waveform diagram for explaining the operation of the fourth embodiment of the invention.

FIG. 14 is a waveform diagram for explaining the operation of the fourth embodiment; shown are the high-level supply voltage, low-level supply voltage, voltage at node 132, and a high-level supply voltage drop detection signal (voltage at output terminal 131).

As shown, in the fourth embodiment, when the high-level supply voltage is stable at the maximum voltage VA, the voltage at the node 132 is VA–VTH-N (VTH-N: threshold voltage of the nMOS transistor) and the capacitor 129 is charged to VA–VTH-N.

In this case, since VA is applied as the gate voltage of the pMOS transistor 128, the gate voltage is greater than the source voltage, so that the pMOS transistor 128 remains off. In this case, therefore, the output terminal 131 is held at the low-level supply voltage.

At t (time)=T1, when the high-level supply voltage begins to fall from the maximum voltage VA, the gate voltage of the nMOS transistor 127 also begins to fall; in this case, since the voltage at node 132 is maintained at VA–VTH-N through the capacitor 129, the nMOS transistor 127 is turned off since its gate-source voltage becomes smaller than VTH-N. On the other hand, the gate voltage of the pMOS transistor 128 also begins to fall, but the pMOS transistor 128 remains off until the gate voltage becomes equal to the voltage at node 132 minus VTH-P (threshold voltage of the pMOS transistor).

As a result, after the high-level supply voltage begins to fall from VA, the output terminal 131 remains held at the low-level supply voltage until the gate voltage of the pMOS transistor 128 falls to VA–VTH-N–VTH-P.

At t=T2, when the high-level supply voltage falls to VA–VTH-N–VTH-P, the pMOS transistor 128 turns on and the capacitor 129 begins to discharge. In this case, if the resistor 130 is set at a relatively high resistance value, a high-level supply voltage drop detection signal having a discharge characteristic as shown in FIG. 14 is output at the output terminal 131 so that the decrease of the high-level supply voltage is detected.

At t=T3, the high-level supply voltage stops falling, and when the voltage at node 132 becomes smaller than the high-level supply voltage plus VTH-P, the pMOS transistor 128 is turned off and the voltage at the output terminal 131 begins to fall toward the low-level supply voltage value.

According to the fourth embodiment, the decrease of the high-level supply voltage can be detected with simple circuitry comprised of the nMOS transistor 127, pMOS transistor 128, capacitor 129, and resistor 130.

Figure 15:
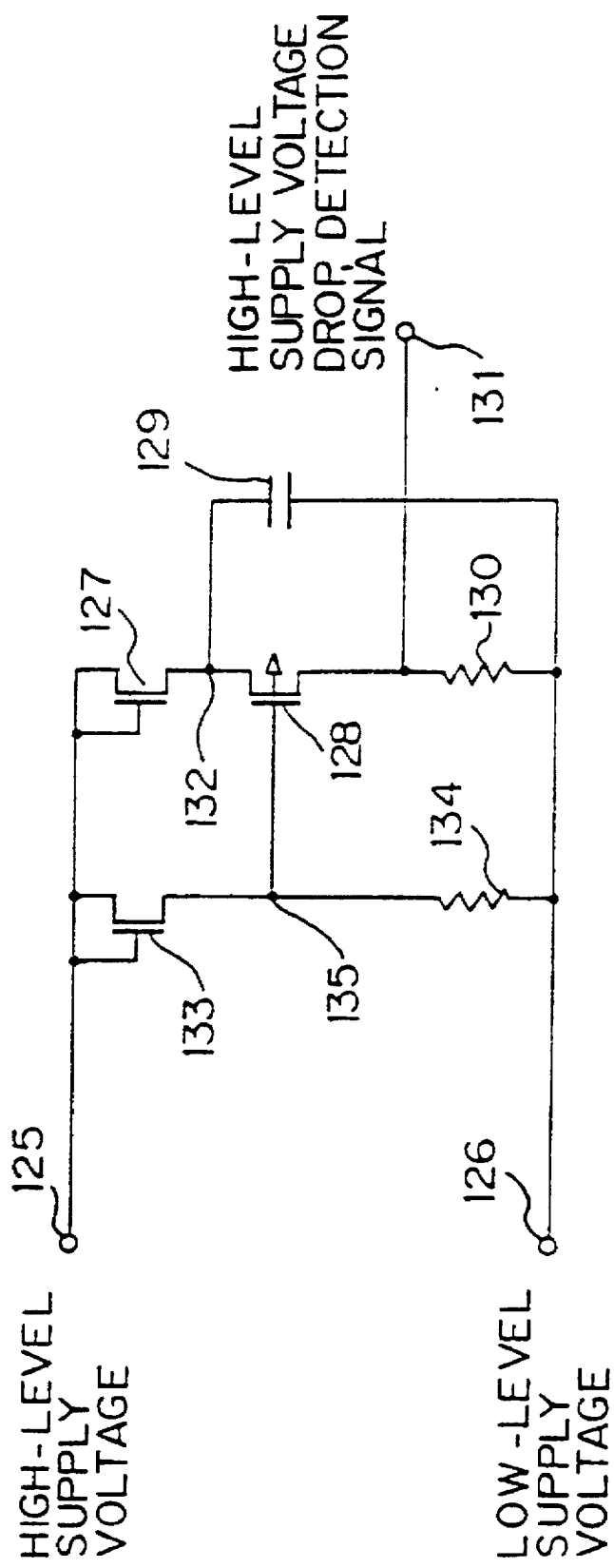
FIG. 15 is a circuit diagram showing a fifth embodiment of the invention.

FIG. 15 is a circuit diagram illustrating a high-level supply voltage drop detection circuit according to a fifth embodiment of the invention.

As shown, in the fifth embodiment, the high-level supply voltage input terminal 125 is connected to the gate of the pMOS transistor 128 via a diode-connected nMOS transistor 133.

Furthermore, a clamping resistor 134 having a sufficiently larger resistance value than the ON resistance of the nMOS transistor 133 is connected between the gate of the pMOS transistor 128 and the low-level supply voltage input terminal 126. Otherwise, the circuit configuration is the same as that of the fourth embodiment shown in FIG. 13.

Figure 16:
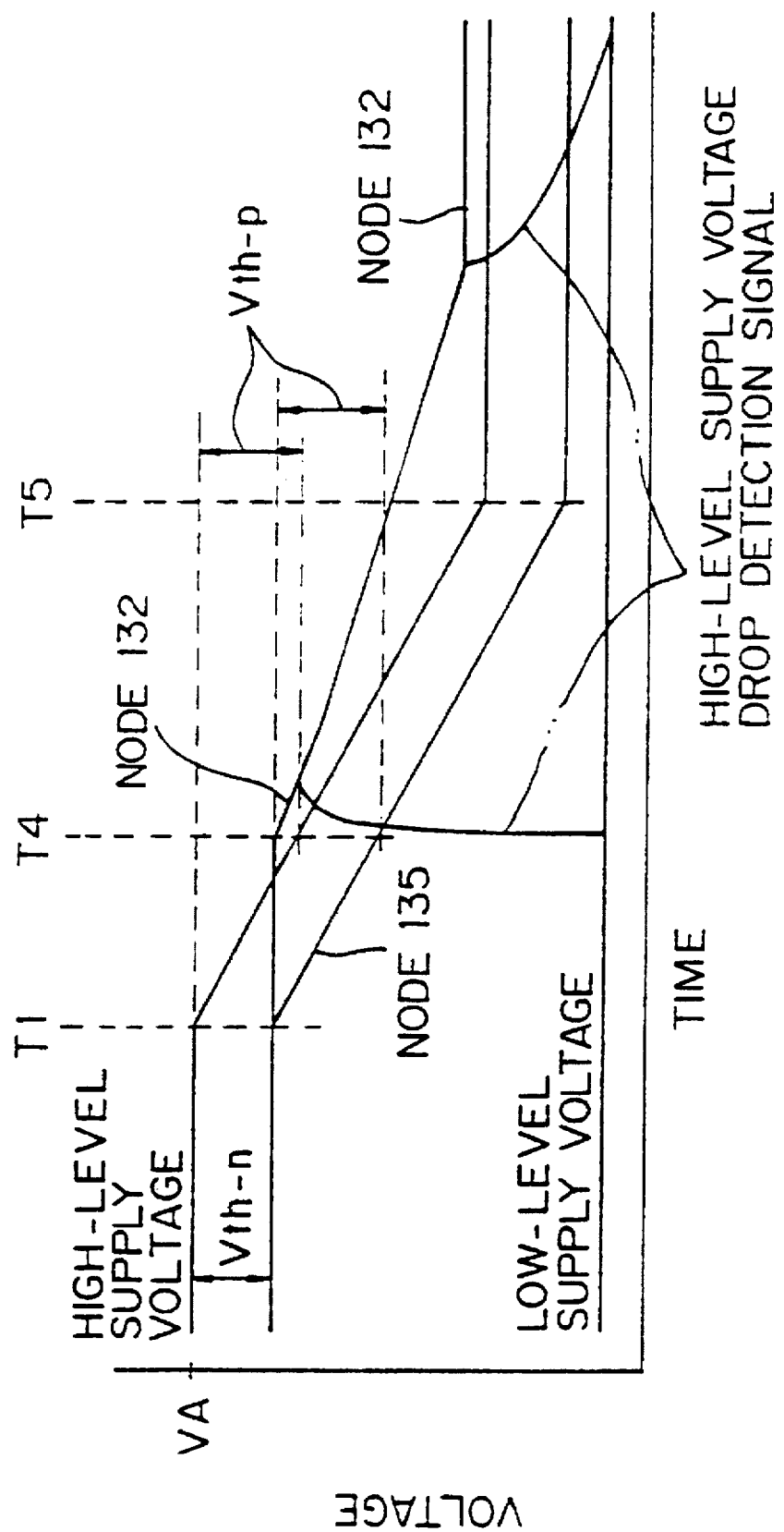
FIG. 16 is a waveform diagram for explaining the operation of the fifth embodiment.

FIG. 16 is a waveform diagram for explaining the operation of the fifth embodiment; shown are the high-level supply voltage, low-level supply voltage, voltage at node 132, voltage at node 135, and high-level supply voltage drop detection signal (voltage at output terminal 131).

As shown, in the fifth embodiment, when the high-level supply voltage is stable at the maximum voltage VA, the voltage at node 132 is VA–VTH-N and the capacitor 129 is charged to VA–VTH-N. At this time, the voltage at node 135 is also VA–VTH-N.

At t=T1, when the high-level supply voltage begins to fall from VA, the gate voltage of the nMOS transistor 127 also begins to fall; in this case, since the voltage at node 132 is maintained at VA–VTH-N through the capacitor 129, the nMOS transistor 127 is turned off since its gate-source voltage becomes smaller than VTH-N.

On the other hand, the gate voltage of the pMOS transistor 128 also begins to fall, but the pMOS transistor 128 remains off until the gate voltage becomes equal to the voltage at node 132 minus VTH-P.

As a result, after the high-level supply voltage begins to fall from VA, the output terminal 131 remains held at the low-level supply voltage until the gate voltage of the pMOS transistor 128 falls to VA–VTH-N–VTH-P, that is, until the high-level supply voltage falls to VA–VTH-P. Then, at t=T4, when the voltage at node 135 falls to VA–VTH-N–VTH-P, the pMOS transistor 128 turns on and the capacitor 129 begins to discharge. As a result, a high-level supply voltage drop detection signal having a discharge characteristic as shown in FIG. 16 is output at the output terminal 131 so that the decrease in the high-level supply voltage is detected.

At t=T5, the high-level supply voltage stops falling, and when the voltage at node 132 becomes smaller than the high-level supply voltage minus VTH-N plus VTH-P, the pMOS transistor 128 is turned off and the voltage at the output terminal 131 begins to fall toward the low-level supply voltage value.

According to the fifth embodiment, the decrease of the high-level supply voltage can be detected with simple circuitry comprised of the nMOS transistors 127 and 133, pMOS transistor 128, capacitor 129, and resistors 130 and 134.

Furthermore, according to the fifth embodiment, since the high-level supply voltage drop detection signal is obtained when the voltage at node 135 falls to VA–VTH-N–VTH-P, i.e., when the high-level supply voltage falls to VA–VTH-P, the decrease in the high-level supply voltage can be detected with a higher speed than the fourth embodiment in which the high-level supply voltage drop detection signal is obtained when the high-level supply voltage falls to VA–VTH-N–VTH-P.

Figure 17:
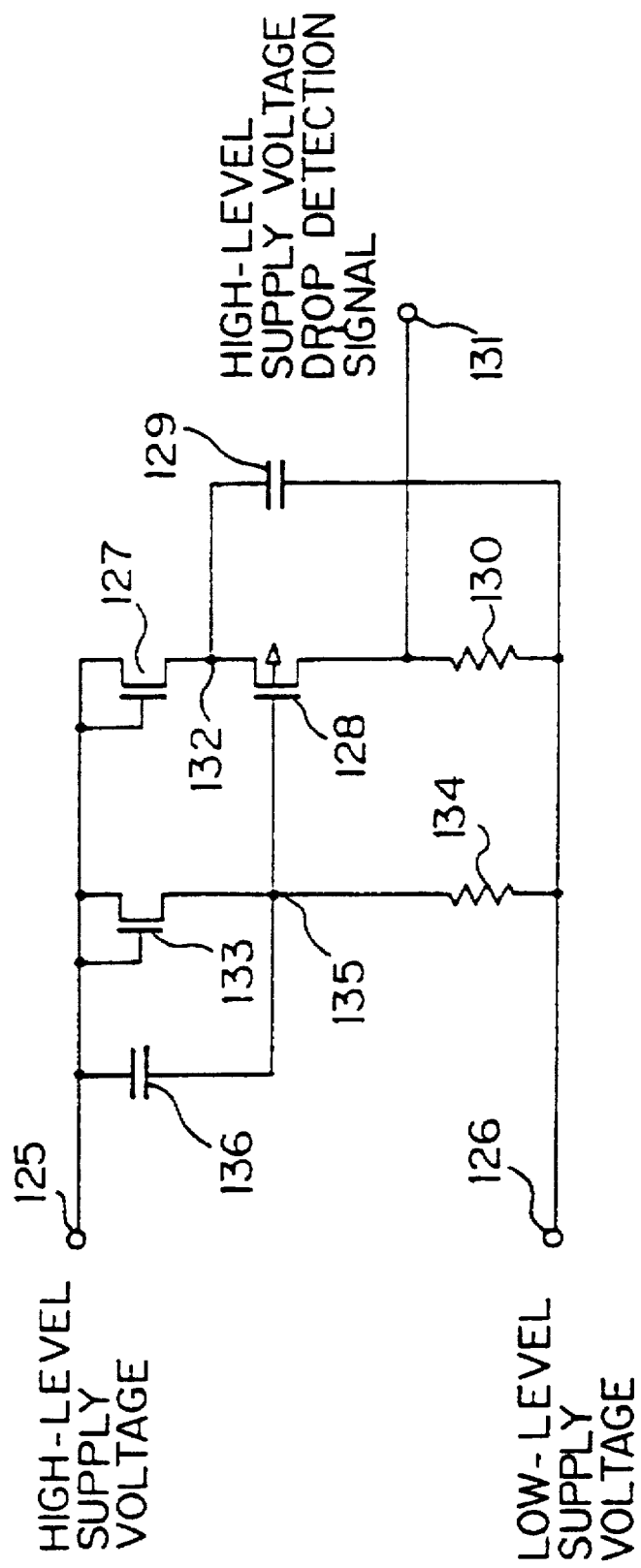
FIG. 17 is a circuit diagram showing a sixth embodiment of the invention.

FIG. 17 is a circuit diagram illustrating a high-level supply voltage drop detection circuit according to a sixth embodiment of the invention.

In the sixth embodiment, a capacitor 136 having a larger capacitance than the parasitic capacitance at node 135 is connected between the high-level supply voltage input terminal 125 and the node 135; otherwise, the circuit configuration is the same as that of the fifth embodiment.

In the foregoing fifth embodiment, idling current flows through the clamping resistor 134. One way to reduce the idling current would be by increasing the resistance value of the clamping resistor 134, but this would in turn require more time to discharge the parasitic capacitance at node 135, resulting in a slower response to an abrupt drop in the high-level supply voltage.

FIG. 18 is a waveform diagram for explaining the operation of the fifth embodiment when the resistance value of the clamping resistor 134 is increased to reduce the idling current flowing through it. Shown in the figure are the high-level supply voltage, low-level supply voltage, voltage at node 132, voltage at node 135, and high-level supply voltage drop detection signal (voltage at output terminal 131).

By comparison, FIG. 19 is a diagram for explaining the operation of the sixth embodiment. In the sixth embodiment, when the high-level supply voltage is stable at the maximum voltage VA, the voltage at node 132 is VA–VTH-N and the capacitor 129 is charged to VA–VTH-N. At this time, the voltage at node 135 is also VA–VTH-N.

At t=T1, when the high-level supply voltage begins to fall from VA, the gate voltage of the nMOS transistor 127 also begins to fall; in this case, since the voltage at node 132 is maintained at VA–VTH-N through the capacitor 129, the nMOS transistor 127 is turned off since its gate-source voltage becomes smaller than VTH-N.

Since the capacitor 136 having a larger capacitance than the parasitic capacitance at node 135 is connected between the high-level supply voltage input terminal 125 and the node 135, the voltage at node 135 falls with the decrease of the high-level supply voltage because of the coupling effect of the capacitor 136.

Therefore, according to the sixth embodiment, at t=T3, that is, when the high-level supply voltage falls to VA–VTH-P, the high-level supply voltage drop detection signal can be obtained, as in the foregoing fifth embodiment.

According to the sixth embodiment, the decrease in the high-level supply voltage can be detected with simple circuitry comprised of the nMOS transistors 127 and 133, pMOS transistor 128, capacitors 129 and 136, and resistors 130 and 134.

Furthermore, according to the sixth embodiment, since the high-level supply voltage drop detection signal is obtained when the high-level supply voltage falls to VA–VTH-P, the decrease in the high-level supply voltage can be detected with a higher speed than the fourth embodiment in which the high-level supply voltage drop detection signal is obtained when the high-level supply voltage falls to VA–VTH-N–VTH-P.

According to the sixth embodiment, since the resistance value of the clamping resistor 134 can be increased, it is possible to reduce the idling current flowing through the clamping resistor 134 compared with the configuration of the fifth embodiment.

Figure 20A:
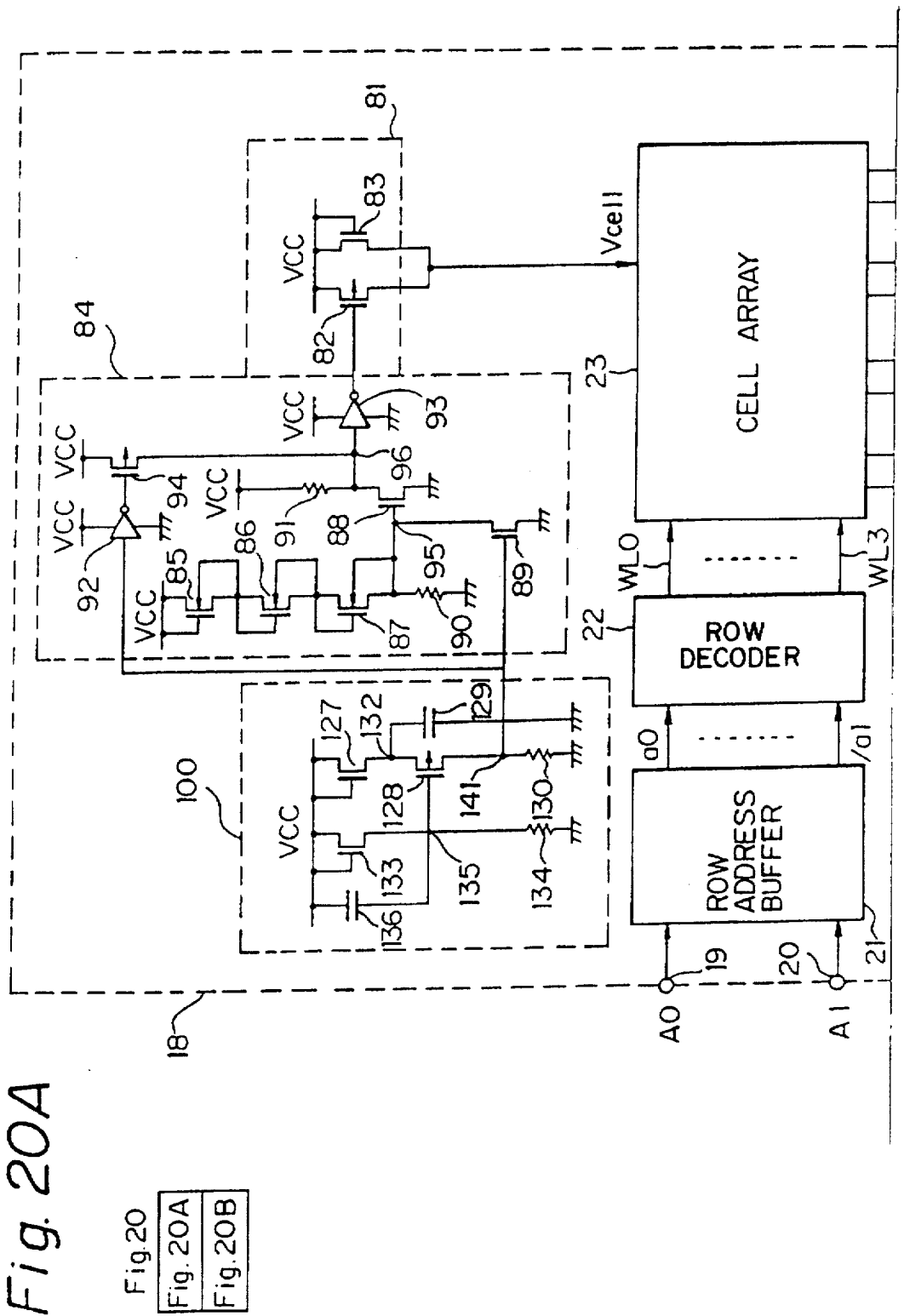

FIGS. 20A and 20B are diagrams showing the configuration of a seventh embodiment in which the high-level supply voltage drop detection circuit of the sixth embodiment is utilized in a static RAM.

In this SRAM, the external high-level supply voltage VCC is reduced on the chip and the thus reduced voltage is used as an internal high-level supply voltage VDD during write mode, read mode, and standby mode, while during cell data retention mode, a reduced high-level supply voltage VCC supplied externally is directly used as the internal high-level supply voltage VDD.

In the figure, the reference numeral 18 designates the chip, and 100 denotes the high-level supply voltage drop detection circuit of the sixth embodiment which is used to detect a drop in the externally supplied high-level supply voltage VCC. Furthermore, the numeral 84 is a high-level supply voltage detection circuit for detecting the high-level supply voltage VCC; 85 to 89 are nMOS transistors; 90 and 91 are clamping resistors; 92 and 93 are inverters; and 94 is a pMOS transistor.

The reference numeral 81 designates an internal high-level voltage supply circuit for supplying the internal high-level supply voltage VDD, 82 indicates a pMOS transistor, and 83 shows an nMOS transistor.

In the internal high-level voltage supply circuit 81, when the pMOS transistor 82 is OFF, the reduced voltage, VCC–VTH-N, is supplied as the internal high-level supply voltage VDD, and when the pMOS transistor 82 is ON, the external high-level supply voltage VCC is directly supplied as the internal high-level supply voltage VDD.

Other portions than those described above are identical in configuration to those of the static RAM of the first embodiment shown in FIG. 2, and therefore, such portions are not explained here.

Figure 21:
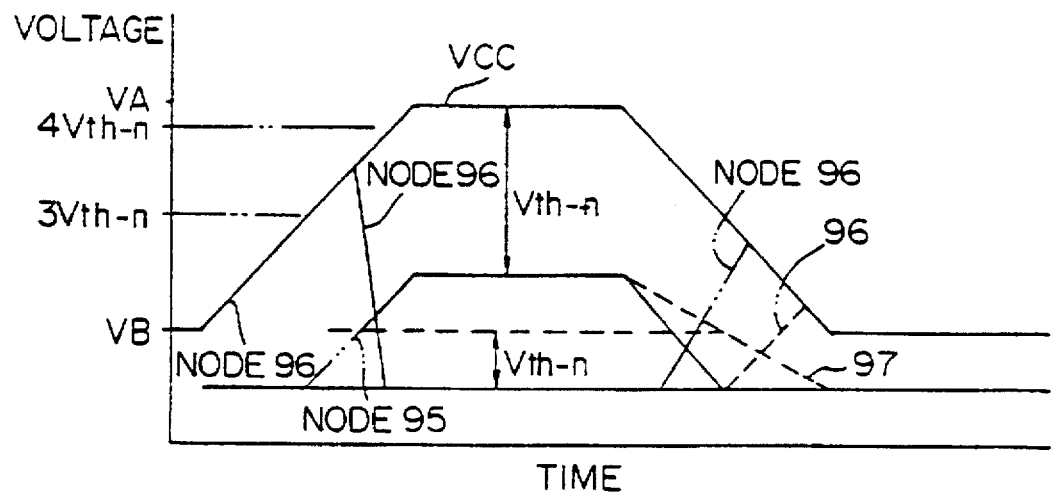
FIG. 21 is a waveform diagram for explaining the operation of a high-level supply voltage detection circuit in the seventh embodiment of the invention when a high-level supply voltage drop detection circuit is not provided.

FIG. 21 is a waveform diagram for explaining the operation of the high-level supply voltage detection circuit 84 when the high-level supply voltage drop detection circuit 100 is not provided. The figure shows the external high-level supply voltage VCC, voltage at node 95, and voltage at node 96.

When the external high-level supply voltage VCC is at VB below 3VTH-N, as shown, the nMOS transistors 85 to 87 are OFF and the node 95 is at a low level. As a result, the nMOS transistor 88 is OFF, the node 96 is high, the output voltage of the inverter 93 is low, and the pMOS transistor 82 is ON, so that the external high-level supply voltage VCC is directly supplied as the internal high-level supply voltage VDD.

From this state, the high-level supply voltage VCC begins to rise; when 3VTH-N is exceeded, the nMOS transistors 85 to 87 turn on, and the voltage at node 95 begins to rise from the low level with the rising high-level supply voltage VCC. When the high-level supply voltage VCC rises to 4VTH-N, the nMOS transistor 88 turns on, the node 96 is set low, the output voltage of the inverter 93 goes high, and the pMOS transistor 82 is cut off, so that the internal high-level voltage supply circuit 81 supplies the reduced voltage, VCC–VTH-N, as the internal high-level supply voltage VDD.

Thereafter, the high-level supply voltage VCC rises to settle at voltage VA which is higher than 4VTH-N. From this state, the high-level supply voltage VCC begins to fall, and when the high-level supply voltage VCC drops below 4VTH-N, the nMOS transistor 88 is turned off. As a result, the node 96 is high, the output voltage of the inverter 93 is low, and pMOS transistor 82 is ON, so that the internal high-level voltage supply circuit 81 directly supplies the external high-level supply voltage VCC, instead of the reduced voltage, as the internal high-level supply voltage VDD.

When the high-level supply voltage is at VA, the nMOS transistors 85 to 88 are ON, letting the current flow through the clamping resistors 90 and 91. To reduce this current, the resistance values of the resistors 90 and 91 should be increased. With increased resistance, however, when the high-level supply voltage VCC begins to fall, it will take time to discharge the parasitic capacitance at node 95, as shown by a dashed line 97 in FIG. 21; even when the high-level supply voltage VCC falls below 4VTH-N, the node 95 does not immediately drop below VTH-N, so that the nMOS transistor 88 remains on and the node 96 is still held low.

Furthermore, even when the voltage at node 95 drops below VTH-N and the nMOS transistor 88 is turned off, it will take time to recharge the node 96, and the low to high transition of the node 95 will be slowed as shown by a dashed line 98 in FIG. 21; as a result, the output voltage of the inverter 93 may not be set low to turn on the pMOS transistor 82, causing the problem that the internal high-level voltage supply circuit 81 is unable to supply the high-level supply voltage VCC as the internal high-level supply voltage VDD.

Figure 22:
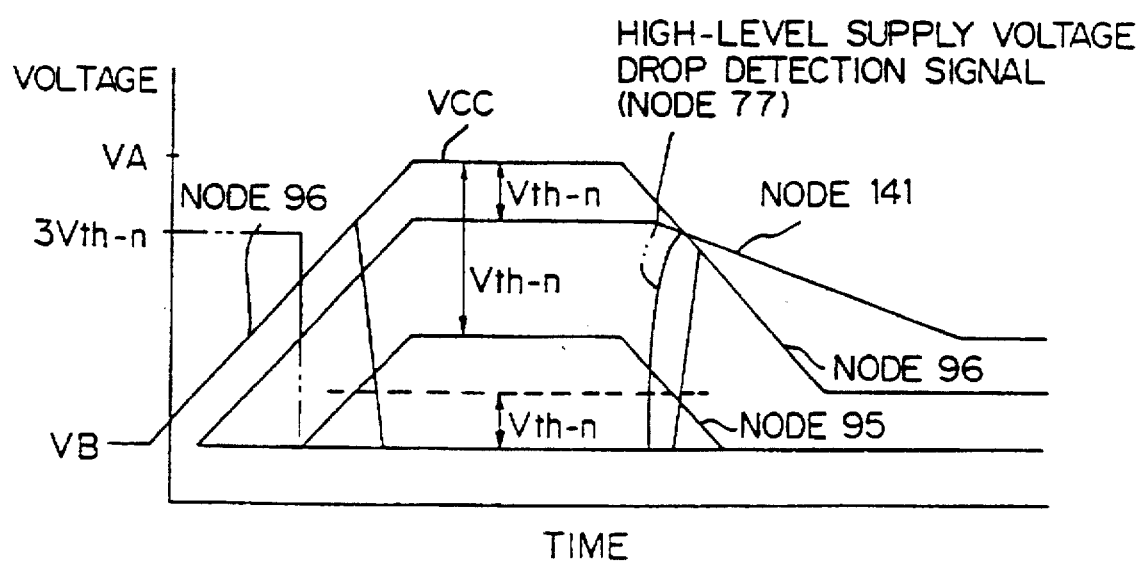
FIG. 22 is a waveform diagram for explaining the operations of the high-level supply voltage drop detection circuit and the high-level supply voltage detection circuit in the seventh embodiment of the invention.

The high-level supply voltage drop detection circuit 100 is provided to overcome this problem. FIG. 22 is a waveform diagram for explaining the operations of the high-level supply voltage drop detection circuit 100 and the high-level supply voltage detection circuit 84. Shown are the high-level supply voltage VCC supplied from an external power supply, the voltages at nodes 132, 95, and 96, and the high-level supply voltage drop detection signal.

It is desirable that the driving capacity of the nMOS transistor 89 be made sufficiently smaller than those of the nMOS transistors 85 to 87 and that the parasitic capacitance at node 95 be set at such a value as can be discharged relatively quickly.

It is also desirable that the driving capacity of the pMOS transistor 94 be made sufficiently smaller than that of the nMOS transistor 88 and that the parasitic capacitance at node 96 be set at such a value as can be recharged relatively quickly.

From the time that the high-level supply voltage VCC begins to rise from its minimum voltage VB to the time that it reaches the maximum voltage VA, the nMOS transistor 127 remains ON and the pMOS transistor 128 OFF, so that the capacitor 129 is charged to VCC–VTH-N.

In this case, since the node 141 is held low (at 0 V), the gate voltage of the nMOS transistor 89 is low and the nMOS transistor 89 is OFF. Therefore, the high-level supply voltage detection circuit 84 operates in the same manner as when the high-level supply voltage drop detection circuit 100 is not provided, as previously described.

Now, the high-level supply voltage VCC begins to fall from its maximum voltage VA; when it has fallen by VTH-P, the high-level supply voltage drop detection circuit 100 outputs the high-level supply voltage drop detection signal of a high level at node 141. As a result, the nMOS transistor 89 is ON and the pMOS transistor 94 is ON, so that the node 95 is quickly discharged to turn off the nMOS transistor 88 while at the same time, the node 96 is quickly recharged, the voltage at node 141 thus being quickly set high.

Consequently, the output voltage of the inverter 93 is quickly set high, and the internal high-level voltage supply circuit 81 supplies, instead of the reduced voltage, the external high-level supply voltage VCC directly as the internal high-level supply voltage VDD.

As described, by using the high-level supply voltage drop detection circuit 100 of the sixth embodiment, the decrease of the high-level supply voltage VCC can be quickly detected and the internal high-level supply voltage VDD output from the internal high-level voltage supply circuit 81 can be quickly switched accordingly even when the resistance values of the clamping resistors 90 and 96 are made large.

In the above configuration, the diode-connected nMOS transistors 127 and 133 may be replaced with p-n junction diodes. Furthermore, the capacitors 129 and 136 need not necessarily be provided as devices, but instead, parasitic capacitances may be used if sufficient capacitances can be secured.

As described above, when the high-level supply voltage drop detection circuit shown in the fourth to sixth embodiments is utilized in an SRAM in which during write, read, and standby modes, the external high-level supply voltage is reduced and the thus reduced voltage is used as the internal high-level supply voltage, and during cell data retention mode, the external high-level supply voltage is used as the internal high-level supply voltage, the internal high-level supply voltage can be switched at high speed from the reduced voltage to the high-level supply voltage.

In semiconductor memories such as the static RAM shown in the first embodiment, such operations as resetting internal circuits and limiting operating intervals are often performed for higher operating speeds. These operations are performed using signals obtained by detecting the transitions of address signals. In a semiconductor memory, an address signal is supplied to various internal parts in the form of a complementary signal pair of opposite logic states. Therefore, detection of an address signal transition is accomplished by detecting a transition of the complementary signal pair. In a semiconductor device, detecting complementary signal transitions is not restricted to the above purpose but is commonly practiced to perform various operations. Detection signals generated by detecting such transitions serve as the basic signals for the various operations, and therefore, reliable detection sensitivity and high speed response are demanded.

Before proceeding to a detailed description of the complementary signal transition detection circuit of the invention, a brief description of prior art complementary signal transition detection circuits will be helpful for a clearer understanding of the features of the complementary signal transition detection circuit of the invention.

Figure 23:
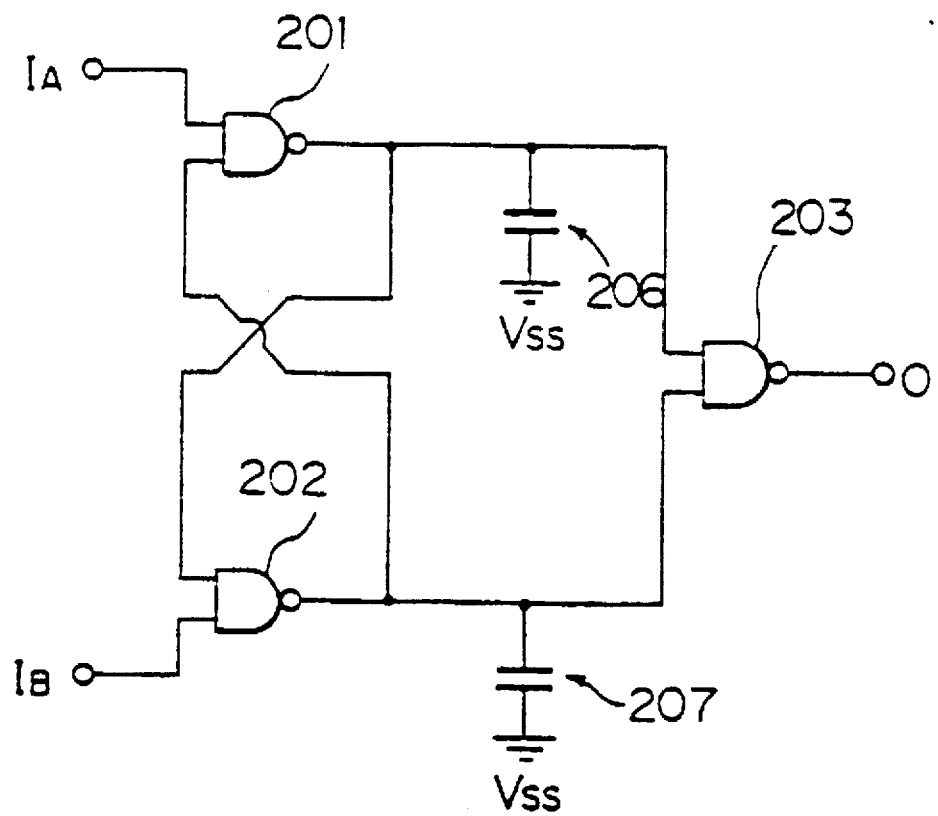
FIG. 23 is a diagram showing a complementary signal transition detection circuit in a prior art example.

FIG. 23 is a diagram illustrating a circuit for detecting complementary signal transitions according to one prior art example. Briefly described, the complementary of an input signal is produced using an inverter, and the two signals are input as a complementary signal pair, IA and IB. The circuit of FIG. 23 has a stable state with the input complementary signal pair and produces a high output. When the input signals, IA and IB, are inverted, the output of a first NAND circuit 201 or a second NAND circuit 202 attempts to change state in response to the changed input states, but the output state does not change until the capacitor, 206 or 207, connected to the output is charged, thus causing a delay. After this delay, the output of a third NAND circuit 203 changes state from high to low. At the same time, the output of the first NAND circuit 201 or the second NAND circuit 202 attempts to change from high to low but remains high until the associated capacitor becomes completely discharged, so that the output of the third NAND circuit 203 remains low during that period and returns high after the capacitor is completely discharged. This results in the generation of a pulse. That is, when the input signals are inverted, the pulse falls at the end of the charge period, the pulse duration being equal to the length of the discharge period.

The charge and discharge periods are determined by the driving capacity when the output of the NAND circuit changes from low to high or from high to low and also by the capacitor's capacitance. Therefore, usually, the driving capacity of the p-channel transistor in the NAND circuit is made large and the n-channel transistor small so that the charge period is short and the discharge period is long.

However, since the capacitor needs to be charged during the charge period, it is difficult to drastically shorten the charge period, and since the charge period corresponds to the response time required to generate a pulse after the inversion of the input signals, the problem is that the above circuit is not suitable for high speed operations.

Figure 24:
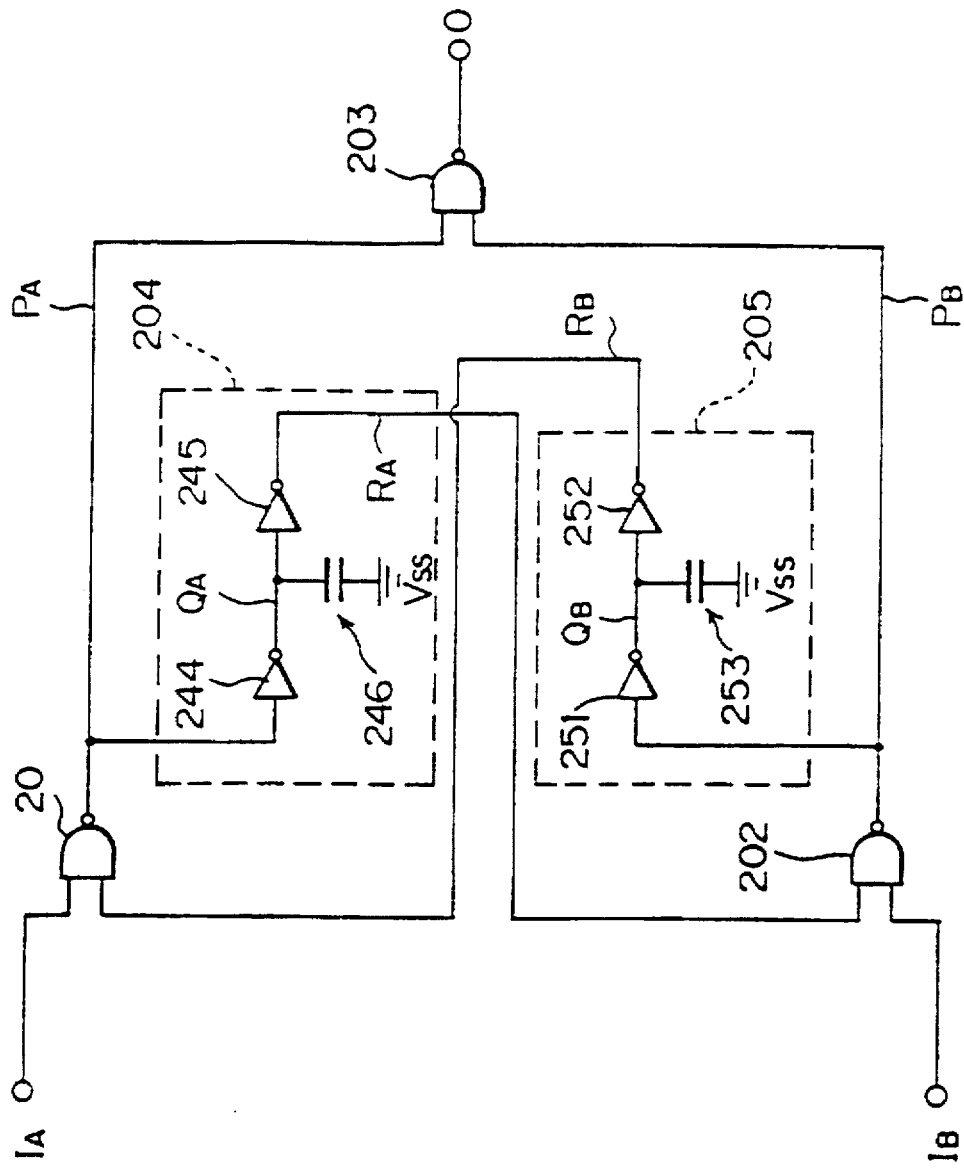
FIG. 24 is a diagram showing a complementary signal transition detection circuit in another prior art example.
Figure 25A:
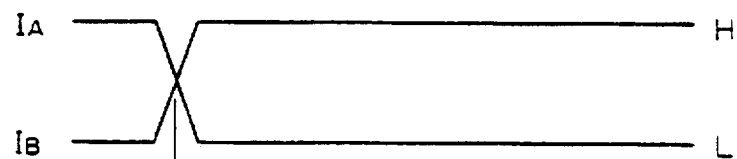
FIGS. 25A to 25E are diagrams showing potential changes at various parts of the circuit of FIG. 24.
Figure 25B:
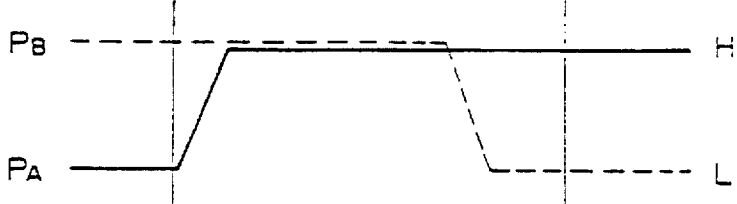
Figure 25C:
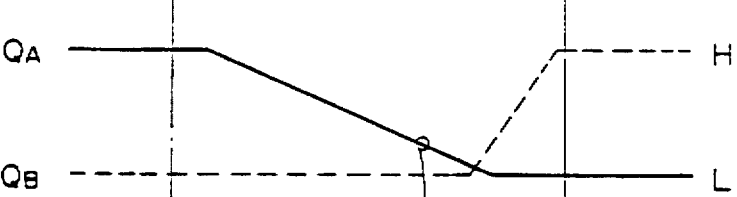
Figure 25D:
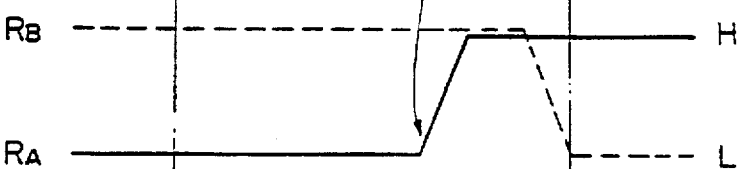
Figure 25E:
Figure 26A:
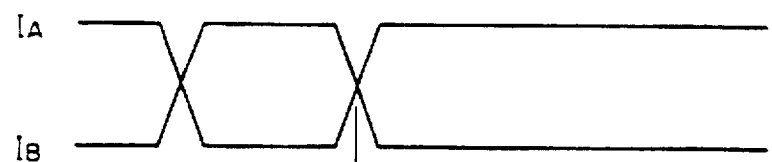
FIGS. 26A to 26E are diagrams showing potential changes at the various parts of the circuit of FIG. 24 when an inversion of input signals occurs in succession.
Figure 26B:
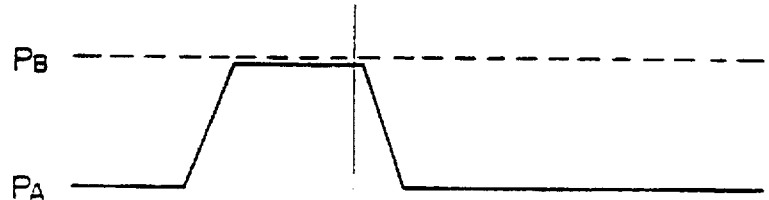
Figure 26C:
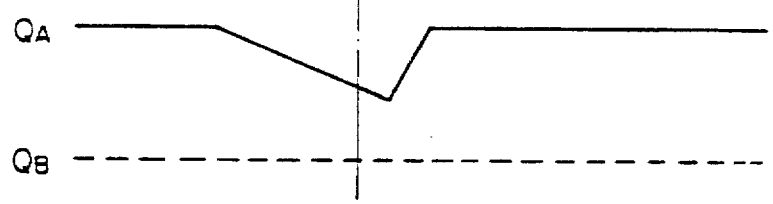
Figure 26D:
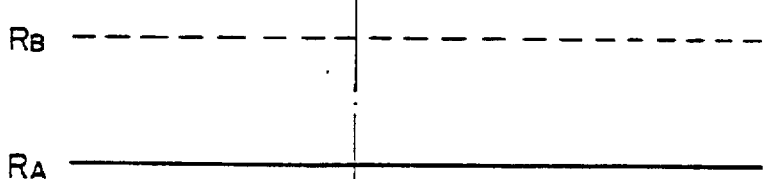
Figure 26E:
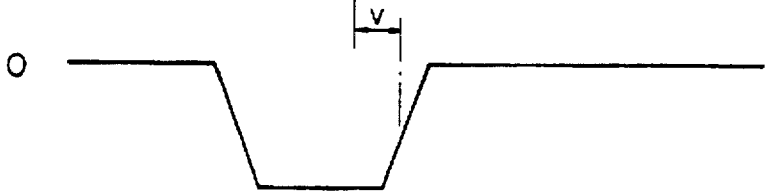

FIG. 24 shows a prior art complementary signal transition detection circuit designed to improve the response speed.

With the circuit of FIG. 23, high response speed is difficult to achieve because the inputs to the third NAND circuit are delayed. By contrast, the circuit shown in FIG. 24 is constructed so that the outputs of the first NAND circuit 201 and the second NAND circuit 202 are applied at the inputs of the third NAND circuit 203 without any delay. This is accomplished by separately providing a first delay circuit 204 and a second delay circuit 205 through which the outputs of the first NAND circuit 201 and the second NAND circuit 202, respectively, are delayed. With this configuration, a transition of the input complementary signal pair is quickly reflected in the output of the third NAND circuit 203. The delay circuits, 204 and 205, each consist of two series-connected inverters and a capacitor.

FIGS. 25A to 25E are diagrams showing the changes of potentials at various parts of the circuit of FIG. 24.

Suppose that the input signal IA is high and IB is low. At this time, the output O is high, and the capacitor 246 in the first delay circuit 4 is charged to high, its potential being denoted by QA. On the other hand, the capacitor 253 in the second delay circuit 205 is low, and its potential is denoted by QB.

When the input signal IA changes to low and IB to high, the output of the first NAND circuit 201 attempts to change to low, and potential PA changes from low to high. Then, the output O changes to low after a delay equal to the sum of the delays of the first NAND circuit 201 and the third NAND circuit 203. At the same time, the output of the inverter 244 in the first delay circuit 204 begins to change from high to low, but since the capacitor 246 is connected, the potential QA slowly falls. As the potential QA falls, the output potential RA of the inverter 245 goes high, so that the output potential PB of the second NAND circuit 202 changes to low and the output O returns high. This period is denoted by t in the diagram. At the same time, the output potential QB of the inverter 251 in the second delay circuit 205 changes to high and then settles in a stable state. The period from the time that the transition occurs to the time that the stable state is achieved is denoted by u. Thus, the output changes immediately after the input signal transition, and a pulse is generated that has a width equal to the length of the capacitor discharge period. It is assumed here also that the driving capacity of the inverter is greater during charging than during discharging.

In a memory device, a transition detection circuit for generating a pulse by detecting an address signal transition is required not only to respond to signal transitions at high speed, as described above, but also to generate a pulse in response to each signal transition for a prescribed period starting from the instant of transition. This is necessary for reset operations, etc., within the memory device.

The above requirement means that even when successive transitions occur within a short period of time because of introduction of noise, etc., in the address pulses, a prescribed pulse must be generated in response to each transition, and that even when a long train of successive pulses occurs depending on the transition pattern, for the last occurring transition a pulse must be generated that stops at the end of the prescribed period.

The circuit of FIG. 24 returns to a stable state within the period denoted by u in FIGS. 25A to 25E after the occurrence of a signal transition. In other words, this circuit outputs a proper pulse signal provided that the interval between input signal transitions is not shorter than the period u. However, when successive input signal transitions occur at intervals shorter than the period u, there arises the problem that proper pulse signals cannot be obtained because each transition arrives before the capacitor that determines the pulse width is charged to a required value. FIGS. 26A to 26E are diagrams showing the changes of potentials at the various parts of the circuit of FIG. 24 when successive transitions of the input signals IA and IB occur within a short period of time.

In response to the first transition of the input signals IA and IB, the output potential PA of the first NAND circuit 201 changes to high and the output O changes to low, while the output potential QA of the inverter 244 in the first delay circuit 204 begins to change to low. However, before the discharging of the capacitor 246 is completed, a second transition of the input signals IA and IB arrives and the output potential PA changes to low, as a result of which the capacitor 246 now starts to recharge. At this time, since the capacitor 246 is not completely discharged, the output state of the first delay circuit 204 does not change, nor do the output potential PB of the second NAND circuit 202 and the output state of the second delay circuit 205 change. As a result, the output O returns to high as the output potential PA of the first NAND circuit 201 returns to low. Therefore, the period from the time that the transition of the input signals IA and IB occurs to the time that the output pulse terminates is as shown by v in the diagram, the value of which has no relevance to the capacitor discharge period.

As described above, the prior art complementary signal transition detection circuit shown in FIG. 24 successfully achieves high speed response in that a pulse is generated immediately after the occurrence of an input signal transition, but when inversion of the input signals occur successively within a short period of time, there arises the problem that the transition detection pulse becomes short or no transition detection pulses are generated. The eighth embodiment of the invention hereinafter described provides a complementary signal transition detection circuit that overcomes the above problem.

Figure 27:
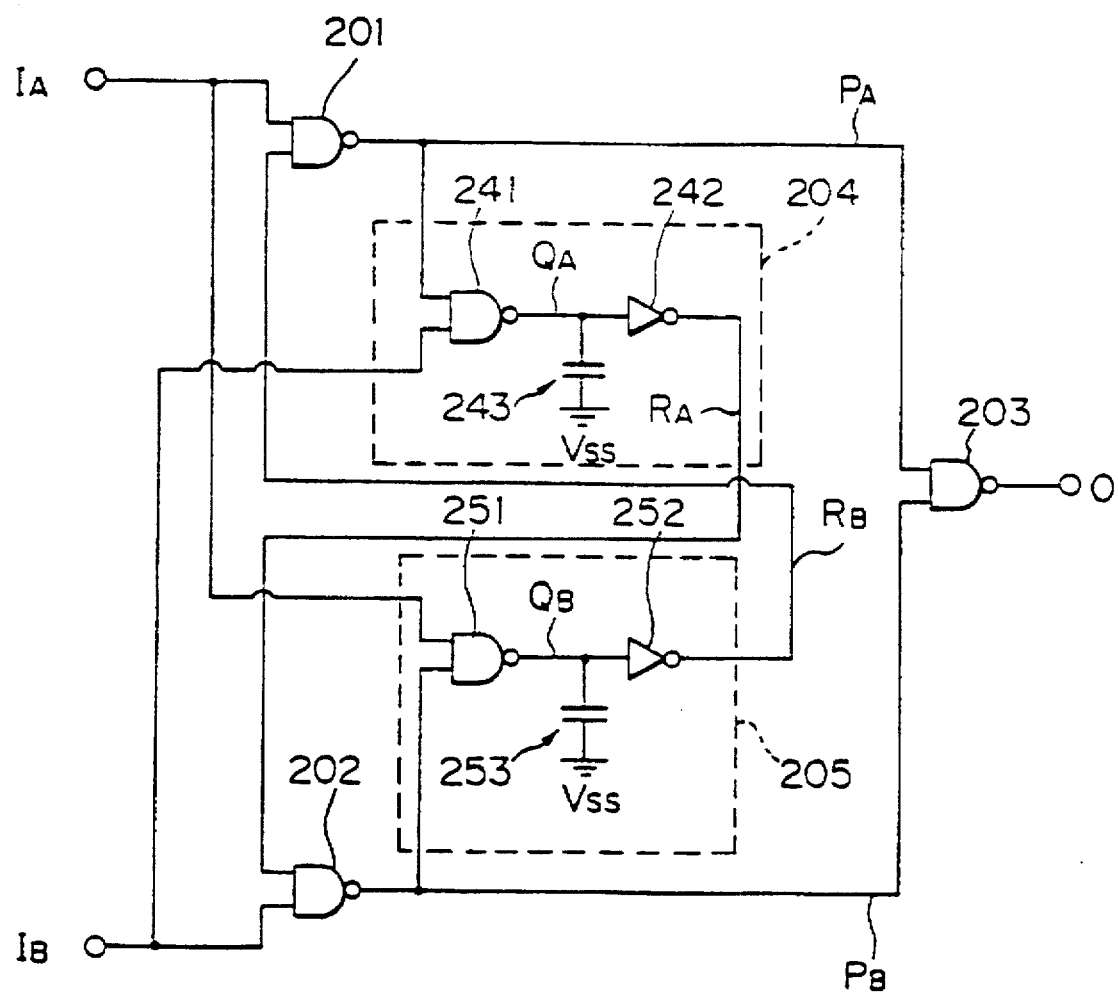
FIG. 27 is a diagram showing the circuit configuration of an eighth embodiment of the invention.

FIG. 27 is a diagram illustrating the complementary signal transition detection circuit according to the eighth embodiment of the invention.

In FIG. 27, IA and IB refer to the complementary input signal pair; 201 designates a first NAND circuit at which the input signal IA is applied; and 202 indicates a second NAND circuit at which the input signal IB is applied. The numeral 203 represents a third NAND circuit at which inputs the outputs of the first NAND circuit 201 and the second NAND circuit 202 are applied, and which produces an output O. The output potential of the first NAND circuit 201 is denoted by PA and the output potential of the second NAND circuit 202 by PB. The numeral 204 indicates a first delay circuit, and 205 a second delay circuit.

The first delay circuit 204 consists of a fourth NAND circuit 241 whose inputs are coupled to the output of the first NAND circuit 201 and the input signal IB, respectively; an inverter 242 for inverting the output of the fourth NAND circuit 241; and a capacitor 243 connected between the output of the fourth NAND circuit 241 and ground VSS, the output of the inverter 242 being coupled to an input of the second NAND circuit 202.

The second delay circuit 205 consists of a fifth NAND circuit 251 whose inputs are coupled to the output of the second NAND circuit 202 and the input signal IA, respectively; an inverter 252 for inverting the output of the fifth NAND circuit 251; and a capacitor 253 connected between the output of the fifth NAND circuit 251 and ground VSS, the output of the inverter 252 being coupled to an input of the first NAND circuit 201.

The potential on the output line of the fourth NAND circuit 241 is denoted by QA, and the potential on the output line of the fifth NAND circuit 251 is denoted by QB. Further, the output potentials of the inverters 242 and 252 are denoted by RA and RB, respectively.

The circuit of FIG. 27 has two stable states corresponding to the states of the input signals IA and IB; in either stable state, the output O of the third NAND circuit is high.

Except when inversion of the input signals occurs successively, the circuit operates in the same manner as the one shown in FIG. 24. That is, upon inversion of the input signals, the output O is forced low, and a pulse is generated that has a duration equal to the discharge period of the capacitor, 243 or 253, in the delay circuit, 204 or 205.

The circuit of FIG. 27 differs from the prior art example of FIG. 24 in that the fourth NAND circuit 241 and the fifth NAND circuit 251 are inserted in the respective first stages of the delay circuits 204 and 205, with the input signal IB coupled to the fourth NAND circuit 241 and the input signal IA to the fifth NAND circuit 251. In a stable state, the input signal being applied to the NAND circuit connected to the discharged capacitor is high, whereas the input signal being applied to the NAND circuit connected to the charged capacitor is low. For example, when the capacitor 243 in the first delay circuit 204 is discharged, that is, when QA is low, the input signal IB is high. In these circumstances, when the input signal is inverted and IB changes to low, the output of the fourth NAND circuit 204 begins to change state from low to high, and the capacitor 243 immediately begins to charge. This compares with the circuit of FIG. 24 in which one capacitor begins to charge after the other capacitor is completely discharged.

Furthermore, in the circuit of FIG. 27, the driving capacity of each of the fourth NAND circuit 241 and fifth NAND circuit 251 is made greater when the output changes from low to high than when it changes from high to low, as will be described later. The driving capacity for the high to low transition and the capacitance of the capacitor determine the discharge period, and hence, the duration of the output pulse. The capacitor is discharged in a shorter time.

FIGS. 28A to 28E are diagrams illustrating the changes of potentials at various parts of the circuit of FIG. 27 when the input signals IA and IB are inverted within a short period of time. The operation will be described in detail below.

To explain the operation, assume that the input signal IA has been previously set high and IB low in a stable state. Then, the output potential PB of the second NAND circuit 202 is high and the output of the fifth NAND circuit 251 is low. This means that the capacitor 253 is discharged and QB is low. The output potential RB of the inverter 252 is high. As a result, the output potential PA of the first NAND circuit 201 is low and the output of the fourth NAND circuit 241 is high. This means that the capacitor 243 is charged and QA is high. Therefore, the output potential RA of the inverter 242 is low and the output O (transition detection signal) of the third NAND circuit 203 is high.

At time T1, when the input signals IA and IB are inverted, the output potential PA of the first NAND circuit 201 immediately changes to high; since PA and PB are both high, the transition detection signal O immediately changes state, thus detecting the transition that has occurred to the input signals. At the same time, since both inputs, PA and IB, are simultaneously high, the fourth NAND circuit 241 attempts to output a low level, but actually, the potential QA changes slowly as it takes time to discharge the capacitor 243.

On the other hand, despite the input signal IB changing to high, the second NAND circuit 202 continues to output a high level since RA remains low.

Further, since the input signal IA is now low, the fifth NAND circuit 251 begins to change from low to high. As previously noted, the fifth NAND circuit 251 has a larger driving capacity when changing from low to high, so that the capacitor 253 is charged in a relatively short time and QB changes to high after time w. As a result, the output potential RB of the inverter 252 changes to low in a relatively short time.

Next, at time T2, the input signals are inverted again, IA now going high and IB low. As a result, the output potential PB of the second NAND circuit 202 is high irrespective of the level of RA, but actually, PB has been held high, which means no change occurs to PB. On the other hand, in the case of the first NAND circuit 201, although IA changes to high, the output potential PA remains high since the capacitor 253 is already charged and RB is already low. As a result, the output O remains low.

The output of the fifth NAND circuit 251 attempts to change to low since IA is now high with PB remaining high. As the capacitor 253 is already charged, the capacitor 253 now begins to discharge. As previously noted, the discharging is performed at a relatively slow speed.

On the otherhand, the fourth NAND circuit 241 attempts to change its output to high since IB is now low. At this time, the capacitor 243 is discharged partially, but returns high in a relatively short time as the output of the fourth NAND circuit 241 changes to high.

The signals IA and PB that are input to the fifth AND circuit 251 remain unchanged after time T2; therefore, the capacitor 253 continues to discharge and the output potential RB of the inverter 252 changes from low to high. When RB changes to high with IA remaining high, the output potential PA of the first NAND circuit 201 changes to low, and accordingly, the output O changes to high. The period u from time T2 is determined by the length of the discharge period of the capacitor 253; therefore, a proper pulse is generated. The stable state is restored when the generation of the pulse is completed.

As described above, according to the eighth embodiment, a proper detection signal can be generated even when inversion of the input signals IA and IB occur successively. Actually, when inversion of the input signals occurs after the discharged capacitor has been recharged, a proper detection signal can be generated.

Figure 29:
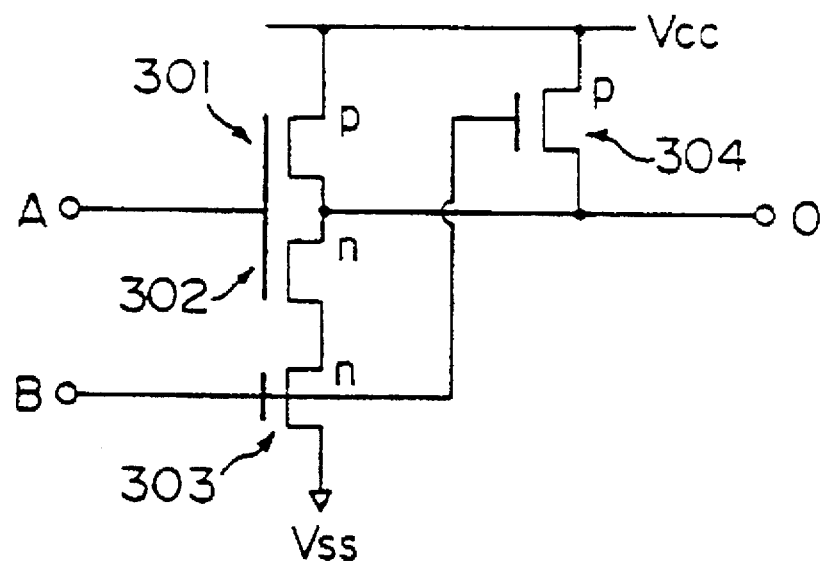
FIG. 29 is a diagram showing an example of the configuration of a NAND circuit in FIG. 27.

In the eighth embodiment, the capacitor charge period is made shorter than the discharge period. This is accomplished by varying the driving capacities of the transistors in the fourth NAND circuit 241 and fifth NAND gate 251. FIG. 29 shows an example of the NAND circuit configuration, wherein the numerals 301 and 302 are p-type transistors and 302 and 303 are n-type transistors. If the input signal applied to input terminal A is low, the p-type transistor 301 conducts, and if it is high, the n-type transistor 302 conducts. Similarly, if the input signal applied to input terminal B is low, the p-type transistor 304 conducts, and if it is high, the n-type transistor 303 conducts.

As is understood from the previous explanation, the capacitor begins to charge when the input signal, IA or IB, is set low. At this time, of the two p-type transistors 301 and 304, only the p-type transistor controlled by the low input signal conducts to charge the capacitor. Therefore, when the low input signal is applied to terminal A, for example, the driving capacity of the p-type transistor 301 determines the charge period. The capacitor begins to discharge when both input terminals are set high; in this case, the n-type transistors, 302 and 303, both conduct. Therefore, if the two n-type transistors have the same driving capacity, the driving capacity of either one of the transistors determines the discharge period since they are connected in series.

Since the discharge period corresponds to the pulse duration, the driving capacities of the n-type transistors 302 and 303 are determined according to the capacitance of the capacitor. It is desirable that the charge period be set as short as possible compared to the discharge period; therefore, the driving capacity of the p-type transistor 301 is set larger than either n-type transistor, 302 or 303. The driving capacity is adjusted by varying the gate width of the transistor.

Figure 30:
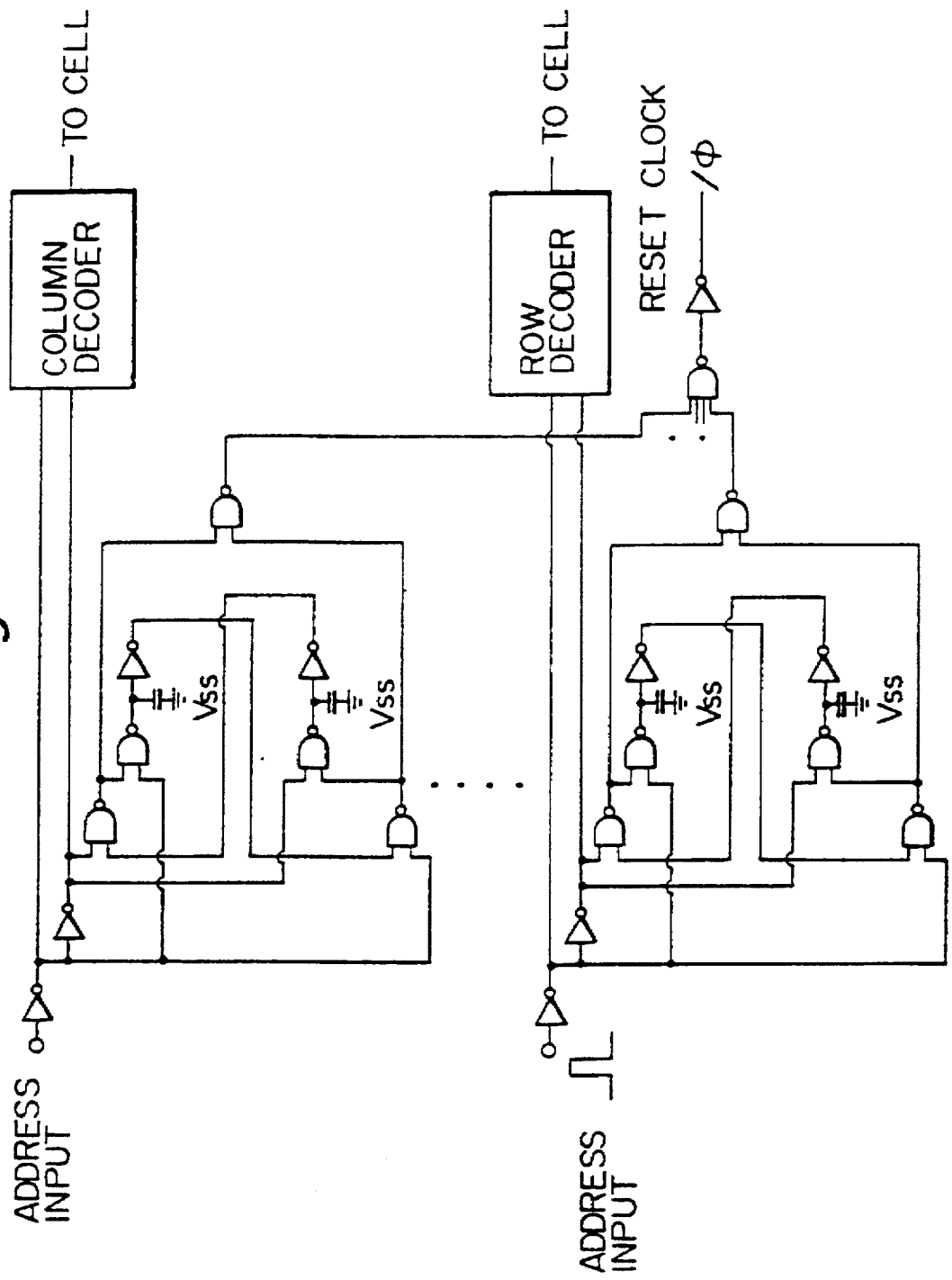
FIG. 30 is a diagram showing a portion of a ninth embodiment in which the circuit of FIG. 27 is used in an SRAM.
Figure 31:
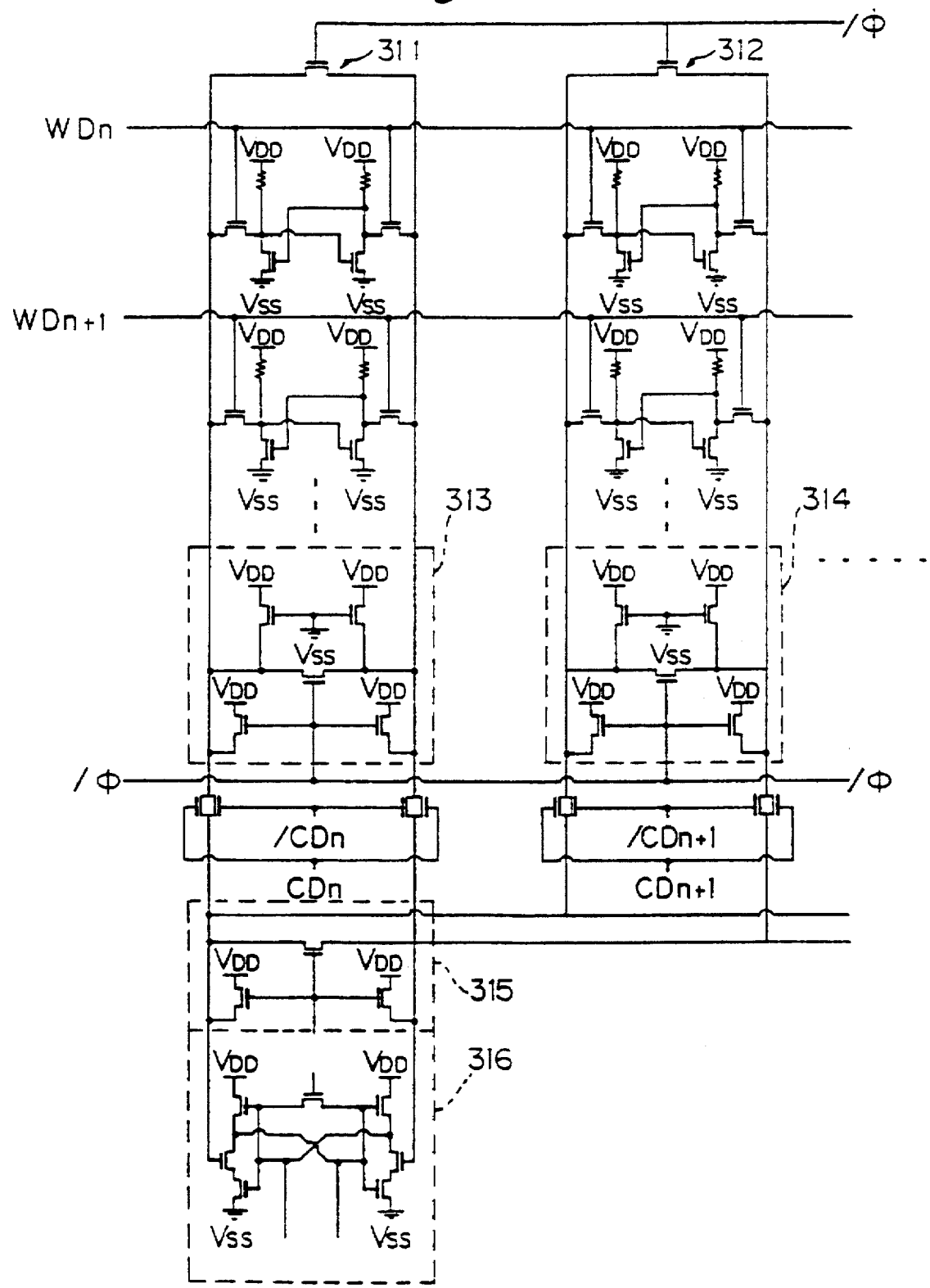
FIG. 31 is a diagram showing another portion of the ninth embodiment.

FIGS. 30 and 31 show a ninth embodiment in which the complementary signal transition detection circuit shown in FIG. 27 is utilized in an SRAM. FIG. 30 shows a section for generating reset clocks from address signals, and FIG. 31 shows a bit line reset section, a bus line reset section, and a sense amplifier section that use the reset clocks.

Address signals for the SRAM are input to the row and column decoders. In this embodiment, as shown in FIG. 30, each address signal is input to a transition detection circuit of the same configuration as that shown in FIG. 27, together with the complementary of the signal generated on the chip. This means that there are as many transition detection circuits as address signal lines. When a transition of the input address signal occurs, the associated transition detection circuit outputs a negative pulse. Therefore, by applying this negative pulse to a multiple-input NAND circuit, a reset pulse is output whenever a transition occurs in the address value.

In the SRAM, reset operations are performed to achieve higher operating speeds. There are two types of reset operations: a bit line reset involving shorting bit lines in pairs in p-type transistors 311, 312, and transistor circuits 313, 314; and a bus line reset involving shorting a bus line pair in a circuit 315 to which all bit line pairs are coupled. In either reset operation, the above reset pulse is used. The reset pulse is also used to control the operation of a sense amplifier 316 that amplifies the signals on the bus line pair. In the prior art, proper reset operations cannot be performed when noise is induced in the address input signal, but by using the transition detection circuit of the invention, reset operations are performed properly in any situation.

Figure 32:
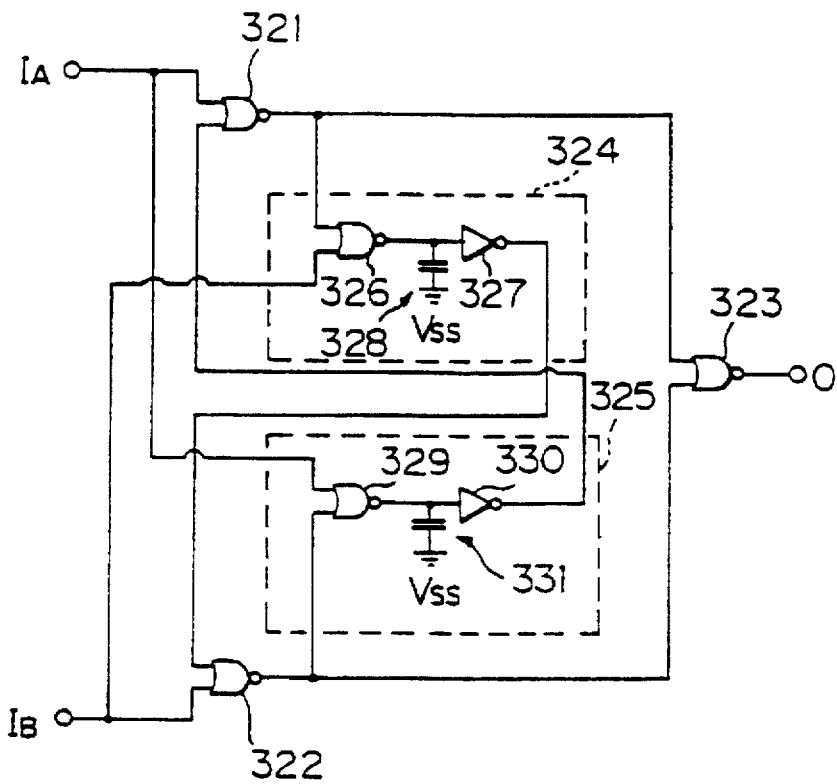
FIG. 32 is a diagram showing the circuit configuration of a 10th embodiment.

In the eighth embodiment shown in FIG. 27, the transition detection circuit is constructed using NAND circuits, but the transition detection circuit can also be realized by using NOR circuits in place of the NAND circuits in FIG. 27, as shown in the 10th embodiment illustrated in FIG. 32. The circuit operation in FIG. 32 can be easily understood from the previous explanation. Briefly described, the circuit of FIG. 32 differs from the one shown in FIG. 27 in that the circuit outputs a positive pulse.

Figure 33:
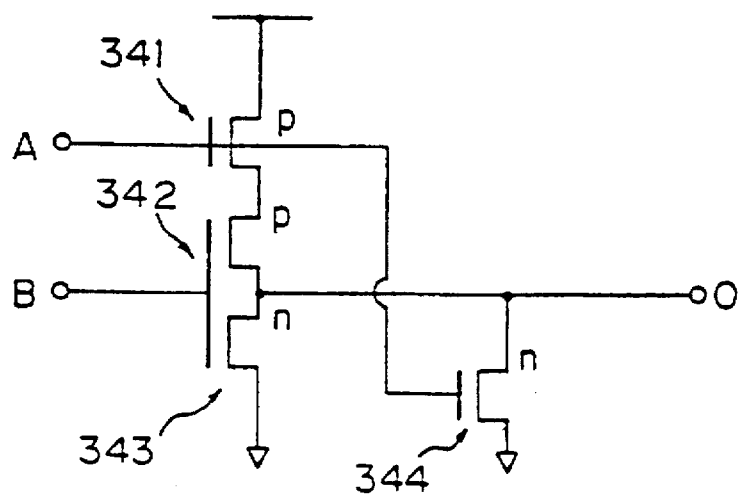
FIG. 33 is a diagram showing an example of the configuration of a NOR circuit in the circuit of FIG. 32.

FIG. 33 shows an example of the NOR circuit configuration. In this example, the pulse duration is defined by the charge period, and it is desirable that the discharge period be made shorter than the charge period. Therefore, the driving capacity of each of n-channel transistors 343 and 344 is made larger than that of either p-channel transistor, 341 or 342.

As described above, according to the complementary signal transition detection circuit of the invention, a reliable transition detection signal can be obtained at high speed; by utilizing the detection circuit for address transition detection in an SRAM and the like, high-speed stable operations can be assured even if noise and other unwanted signals are induced in the address inputs.

In recent years, with increasing storage capacity of static RAMs and other semiconductor devices, the chip area has been increasing, and accordingly, signal delay due to increased signal line length and failure of synchronization with other signals due to such delay have posed problems. It is therefore demanded that the circuits be designed by considering signal delays caused by increased wiring length of signal lines. According to prior known signal line wiring for a semiconductor device, it is practiced to lay out the signal lines so that each signal line is run over the shortest possible distance to reduce the signal propagation delay attributable to the signal line length. A signal line layout in a prior art static RAM and its associated problems will be briefly described below.

Figure 34:
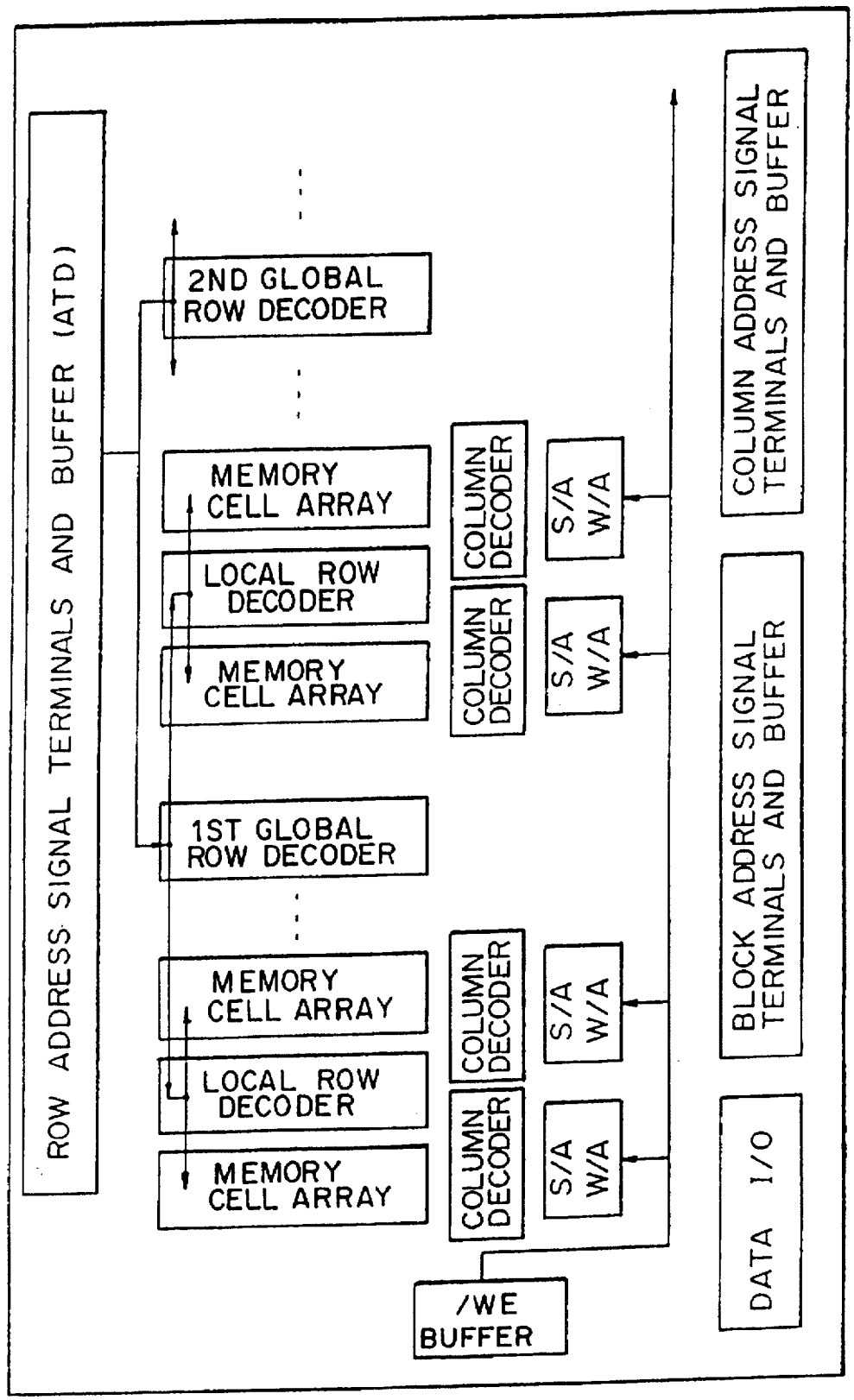
FIG. 34 is a diagram showing the arrangement of various portions and signal lines in a prior art SRAM.

FIG. 34 is a diagram showing the essential portions of the prior art static RAM. The problems associated with the signal line layout will be described below with attention focused on the row decode signal decoded from a row address signal and applied to the word line and the write enable signal /WE applied to the write amplifier; therefore, the figure shows the arrangement only of global row decoders for decoding the row address signal excluding the low-order one bit thereof; local decoders for decoding the low-order one bit of the row address signal; write amplifiers; cell arrays; and column decoders.

As shown in FIG. 34, the externally applied row address signal is transferred to two global row decoders for decoding into a row decode signal. The row decode signal is further decoded, together with the low-order one bit of the row address signal, by the local decoders arranged on both sides of each global row decoder, and is then applied to the corresponding word line. The write enable signal /WE is first converted into an internal write enable signal by a write enable signal buffer arranged at one end, and then placed on a write enable signal line extending toward the other end, the write enable signal being transferred to a write amplifier arranged along the signal line. Therefore, when viewed facing FIG. 34, the row decode signal delivered to the local decoder to the left of the global row decoder is propagated in the direction opposite to the direction of propagation of the write enable signal. The problem that arises when the signals propagate in opposite directions will be described below with reference to FIGS. 35, 36A, and 36B.

Figure 35:
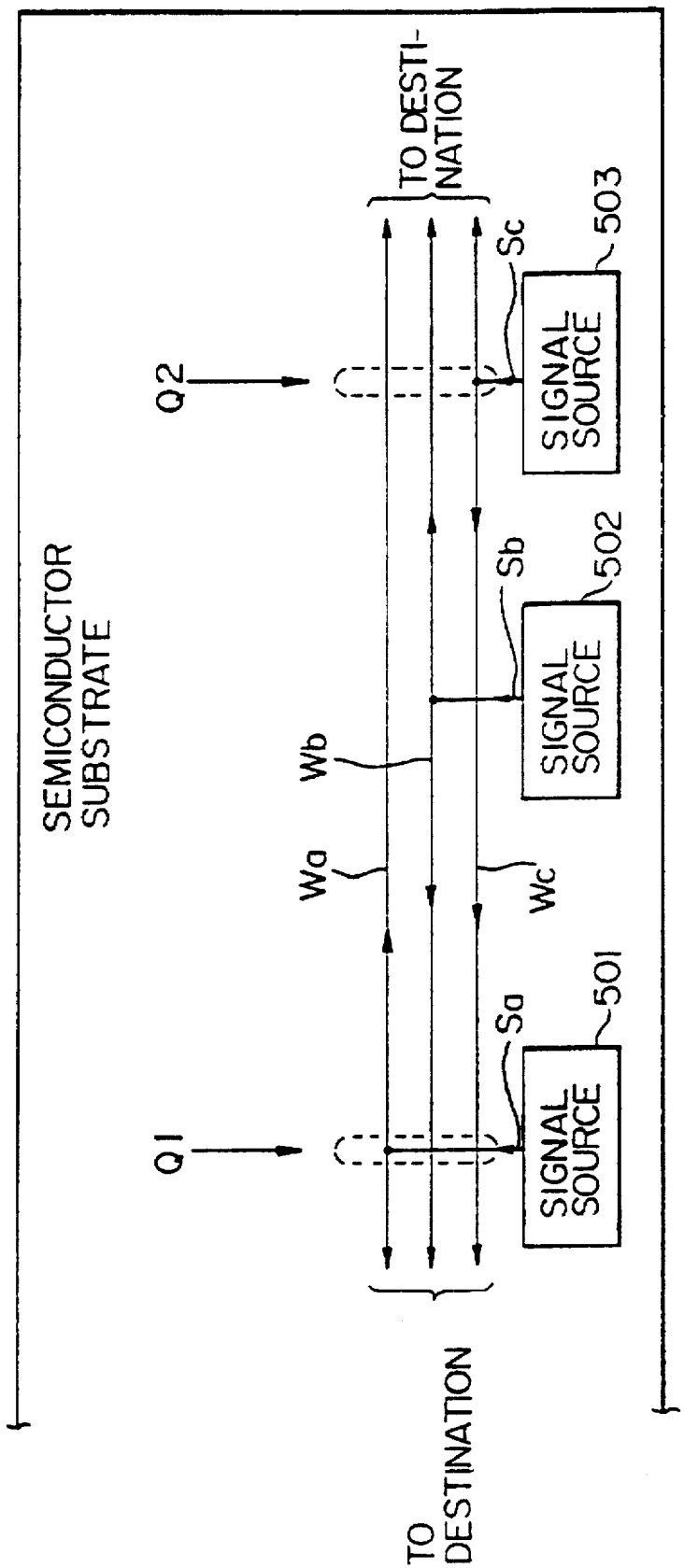
FIG. 35 is a diagram showing a signal line wiring layout for the SRAM of FIG. 34.
Figure 36A:
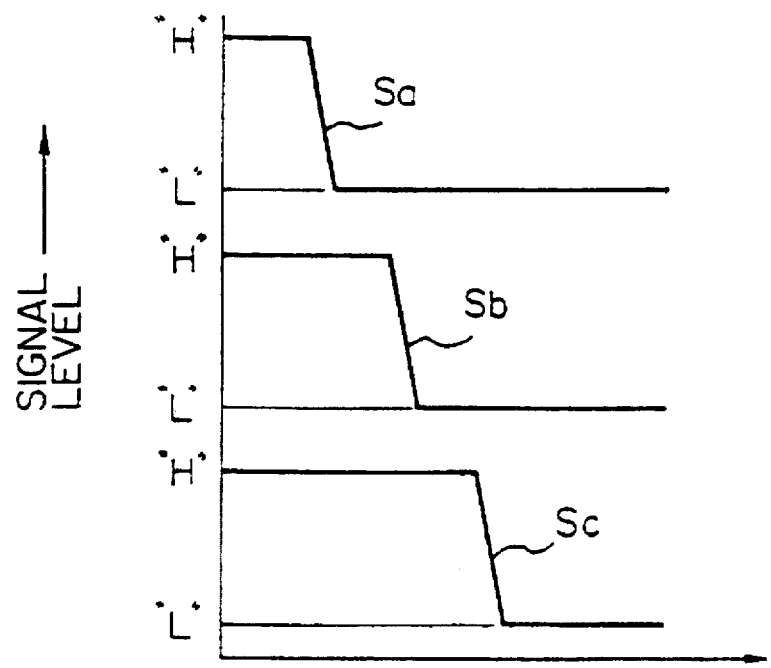
FIGS. 36A and 36B are diagrams illustrating signal propagation delays in the SRAM of FIG. 34.
Figure 36B:
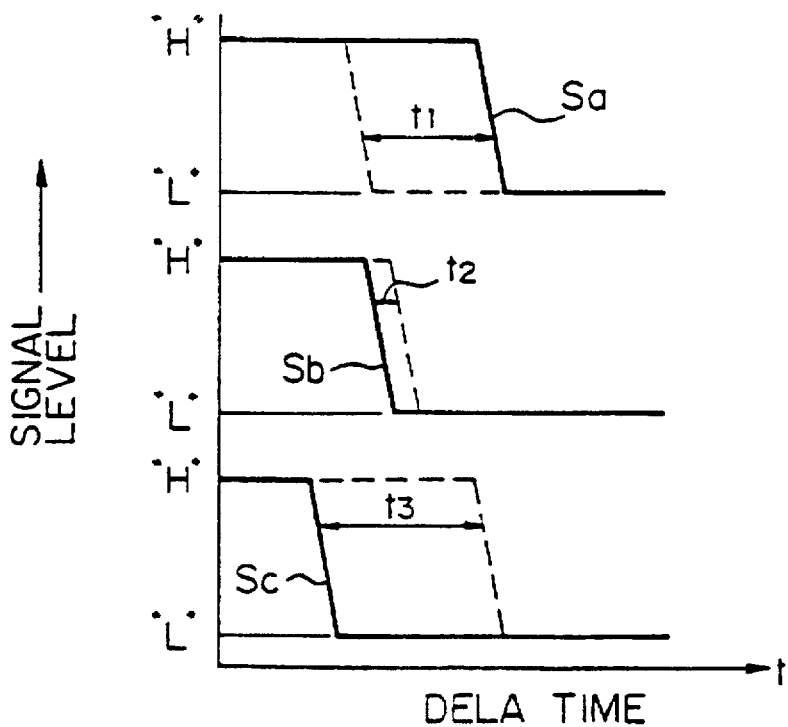

FIG. 35 is a diagram illustrating the signal line layout in the above-described arrangement, and FIGS. 36A and 36B illustrate the propagation delays of the signals.

In FIG. 35, the reference numerals 501 to 503 designate signal sources, and Wa, Wb, and Wc indicate signal lines along which signals Sa, Sb, and Sc generated from the respective signal sources are propagated. FIG. 36A shows the propagation timings at point Q1 (see FIG. 35) for the signals Sa, Sb, and Sc generated from the signal sources 501 to 503, respectively, and FIG. 36B shows the propagation timings at point Q2.

As shown in the signal timing diagram of FIG. 36B, the signals Sa, Sb, and Sc propagating along the signal lines Wa, Wb, and Wc, respectively, show different time delays between point Q1 and point Q2 on the respective signal lines (t1, t2, and t3 in the illustrated example).

Thus, in the prior art signal line layout, each signal line is run over the shortest possible distance, as previously noted, and furthermore, its signal propagation direction (wiring direction) is determined without considering the wiring directions of adjacent signal lines; as a result, the propagation timing delay is different between the signals, as shown in FIG. 36B, because of the arrangement and increased length of the signal lines.

In the prior art, as the signal line becomes longer as a result of the increase of the chip area necessitated by increased storage capacity, the time delay from the signal source to its destination (circuit block) becomes greater, and a timing difference (an out-of-synchronization condition) occurs with respect to signals supplied via other signal lines. Furthermore, depending on the position of the circuit block to which these signals are supplied, relative timing differences (i.e., propagation delay errors) occur among the signals supplied to that circuit block.

In a semiconductor memory such as a static RAM, an address signal, i.e., a row decode signal, and a write enable signal are required to satisfy prescribed timing conditions. If these conditions are not satisfied, there may occur a problem that data is written into a memory cell other than the one designated by the address signal. In cases in which the timing difference between the address signal and the write enable signal is large, there arises the need to absorb the timing difference by lengthening the address signal change cycle. Solving the timing difference problem in this way reduces the operating speed of the semiconductor device.

Figure 37:
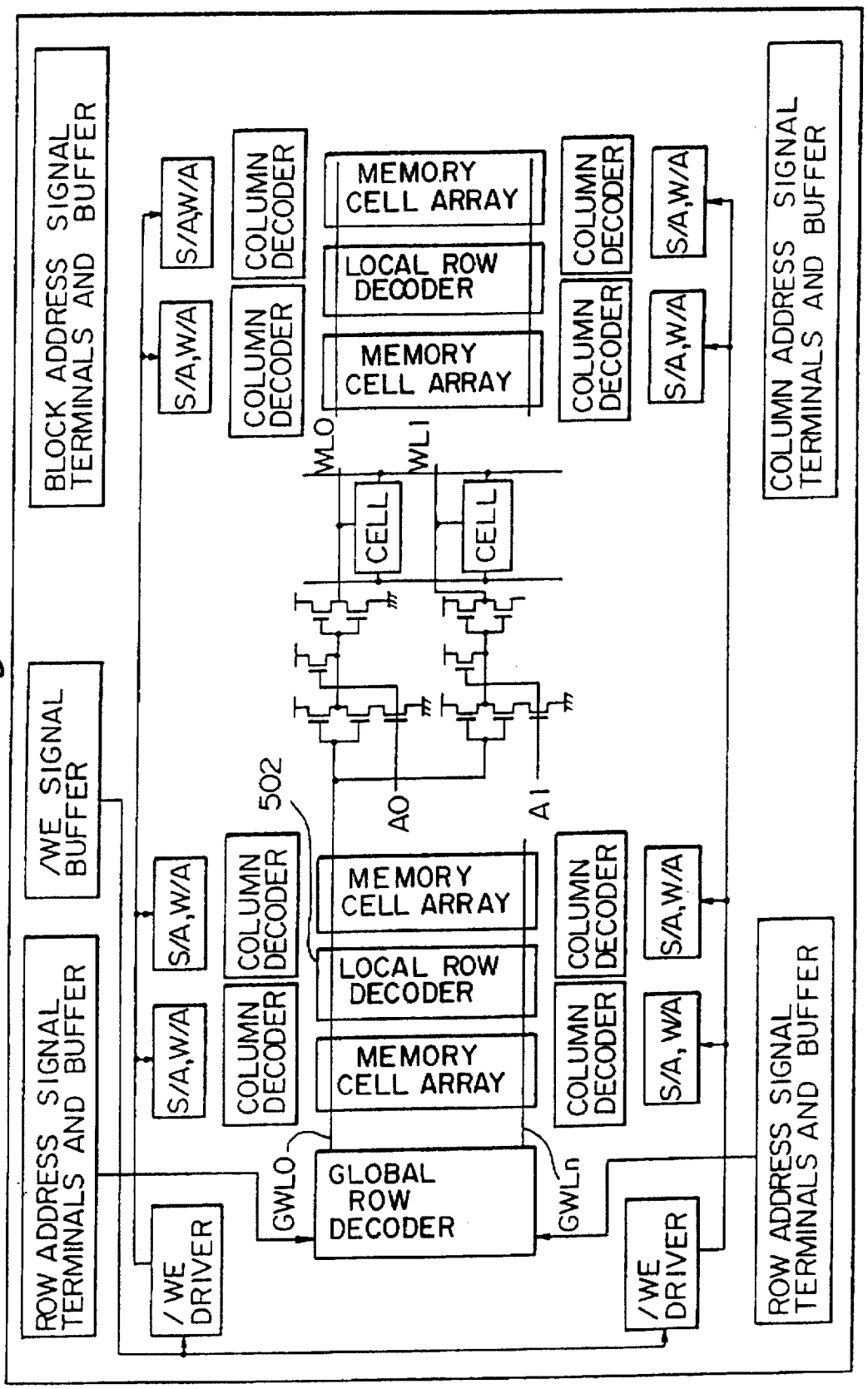
FIG. 37 is a diagram showing the arrangement of various portions and signal lines in an SRAM according to an 11th embodiment.

FIG. 37 is a diagram showing the arrangement of the essential portions of a static RAM according to an 11th embodiment of the invention. Only the portions corresponding to those shown in FIG. 34 are illustrated here.

As shown in FIG. 37, in the static RAM of the 11th embodiment, only one global row decoder is provided which is arranged on the same side as the write buffer, and the row decode signal and the write enable signal are both propagated in the same direction. The following describes the propagation timing difference between the row decode signal and the write enable signal in the above arrangement.

Figure 38:
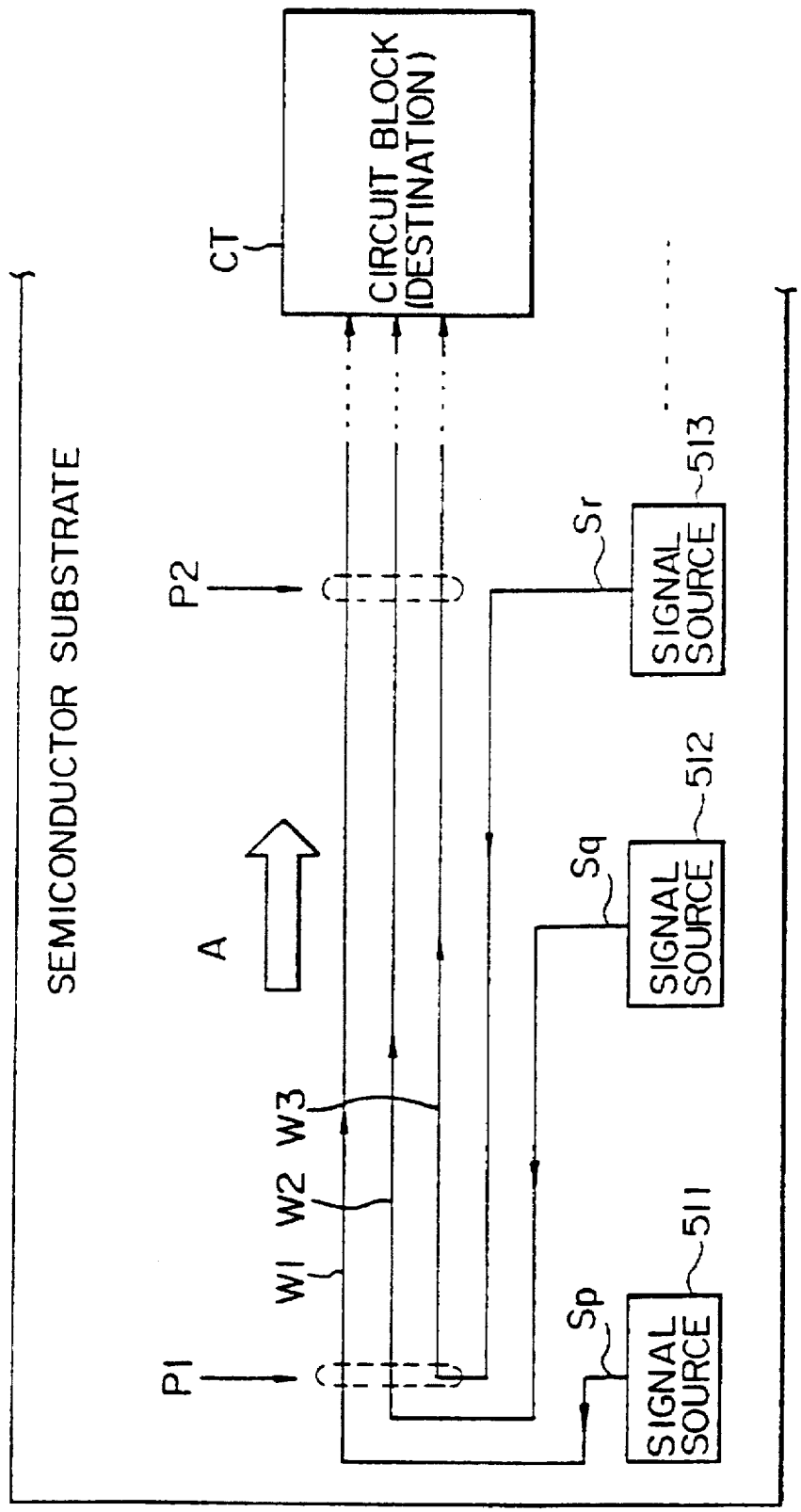
FIG. 38 is a diagram schematically showing a signal line wiring layout for the configuration of FIG. 37.

FIG. 38 is a diagram that gives a general explanation of signal propagation in the circuit arrangement and signal line layout according to the 11th embodiment.

A plurality of different signal sources G1, G2, G3, . . . , a plurality of signal lines W1, W2, W3, . . . for carrying a plurality of signals S1, S2, S3, . . . generated from the respective signal sources, and at least one circuit block CT to which the plurality of signals are supplied via the signals lines, are arranged as shown in FIG. 38, the plurality of signal lines being run in the same direction A.

In the arrangement shown in FIG. 38, since the plurality of signal lines, W1, W2, W3, . . . , extending from the plurality of signal sources, G1, G2, G3, . . . , to the circuit block CT, the signal destination, are run in the same direction A, the propagation timing (i.e., the delay amount) between the signals can be made equal at any specific point on the signal lines.

Figure 39A:
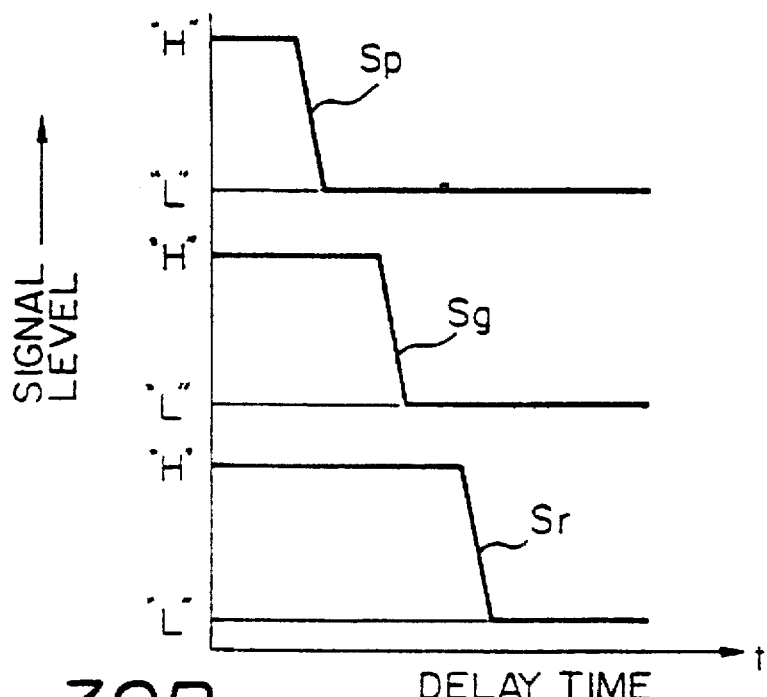
FIGS. 39A and 39B are diagrams illustrating signal propagation delays in the configuration of FIG. 37.
Figure 39B:
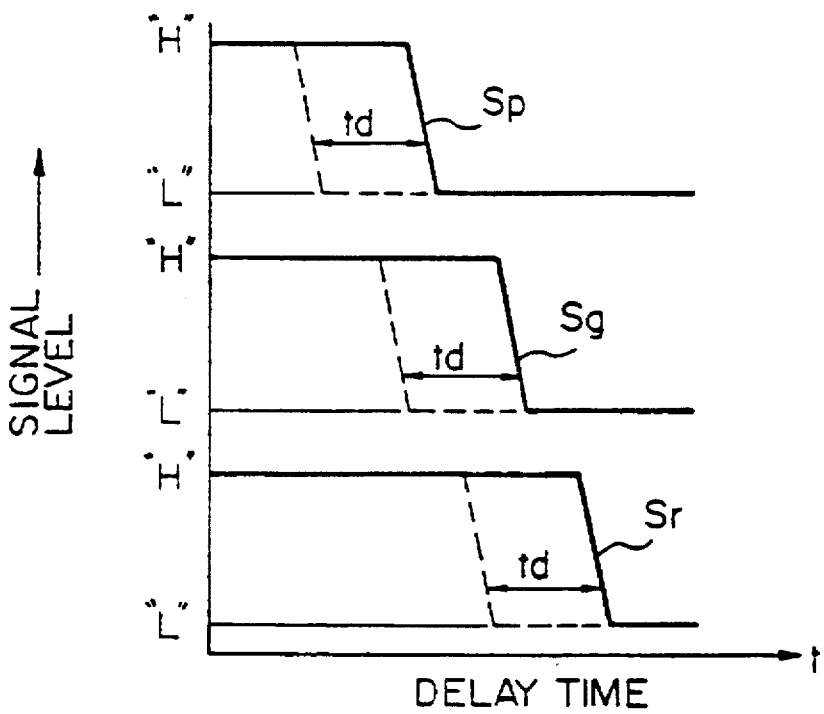

FIGS. 39A and 39B are diagrams illustrating the signal propagation delays in the signal line arrangement shown in FIG. 38. Only the three signals, S1, S2, and S3, are shown for simplicity.

FIG. 39A shows the propagation timings at point P1 in FIG. 38 for the signals S1 to S3 generated from the signal sources G1 to G3, respectively. FIG. 39B shows the propagation timings of the same signals at point P2 in FIG. 38.

As shown in the signal timing diagrams of FIGS. 39A and 39B, the three signals, S1, S2, and S3, have the same time difference, td, between point P1 and point P2 on the signal lines. That is, with the signal lines run in the same direction, the propagation timing (i.e., the amount of delay) is prevented from changing from one signal to another.

Furthermore, in cases in which there is a timing difference between signals at the signal propagation start point on the parallel signal lines, a means for synchronizing the signal timing may be provided at this point to eliminate the timing difference between the signals supplied to the circuit block.

Turning back to the static RAM, a description is now given of the arrangement of the 11th embodiment in which the address signal and the write enable signal are made to propagate in the same direction over the entire chip, by comparison with the prior art arrangement in which these signals are made to propagate in different directions in some portions of the chip.

Figure 40:
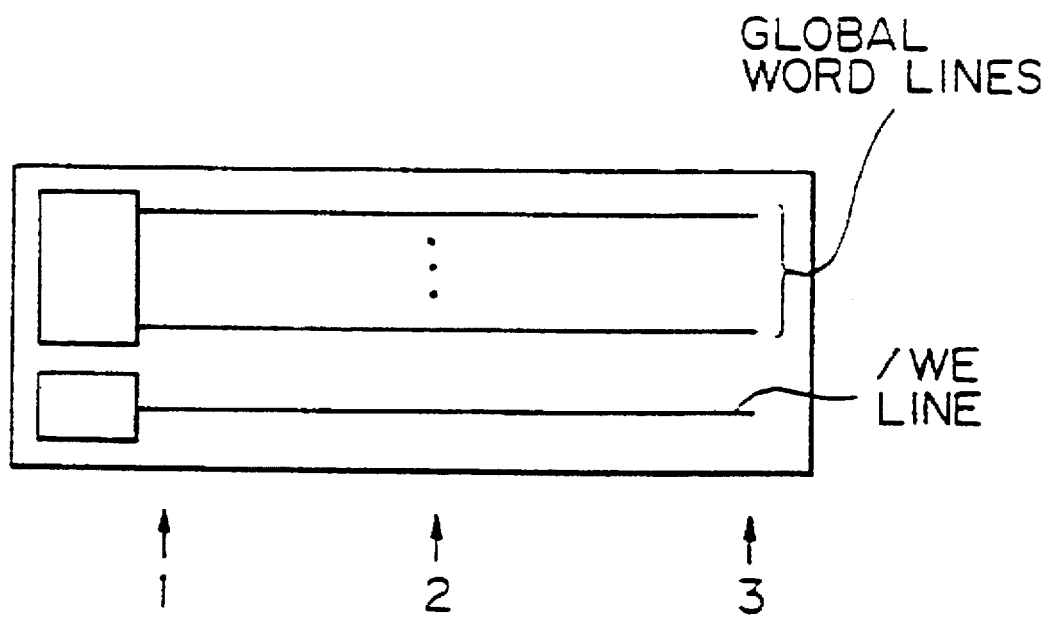
FIG. 40 is a diagram showing a first arrangement for explaining the differences resulting from different signal line arrangements for address and write enable signals.

FIG. 40 shows the arrangement in which the address signal and the write enable signal are supplied to each memory array via the signal lines running parallel to each other from one end of the chip, and FIGS. 41A to 41F illustrate the timings of various signals in the signal line layout of FIG. 40. FIG. 41A shows the address signal, FIG. 41B the write enable signal /WE, FIG. 41C the row decode signal applied to the word line, FIG. 41D the internal write enable signal, FIG. 41E the potential change on a bit line, and FIG. 41F the potential change at a node within the cell.

Figure 41:
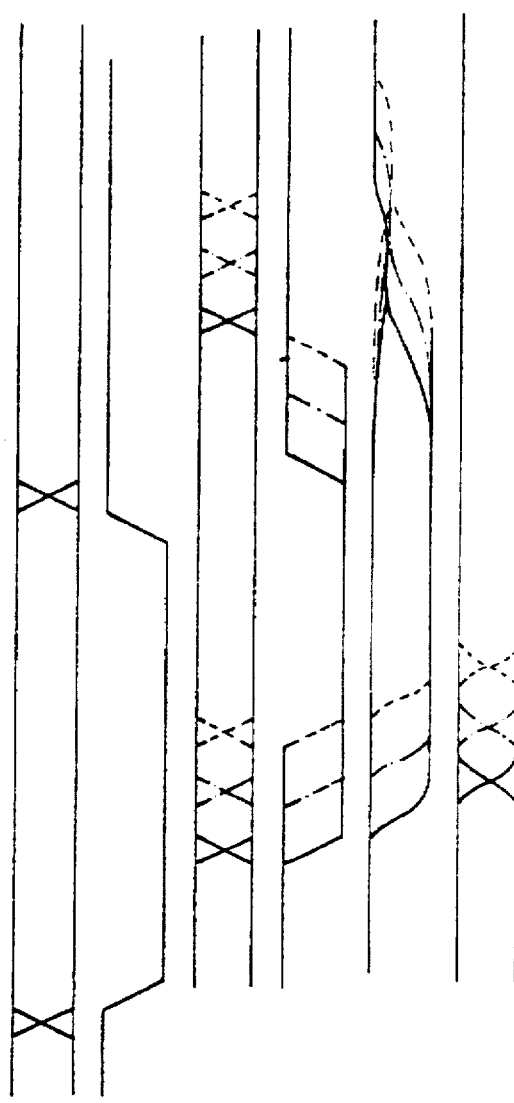
FIGS. 41A to 41F is a diagram showing timing differences between signals in the arrangement of FIG. 40.
Figure 42:
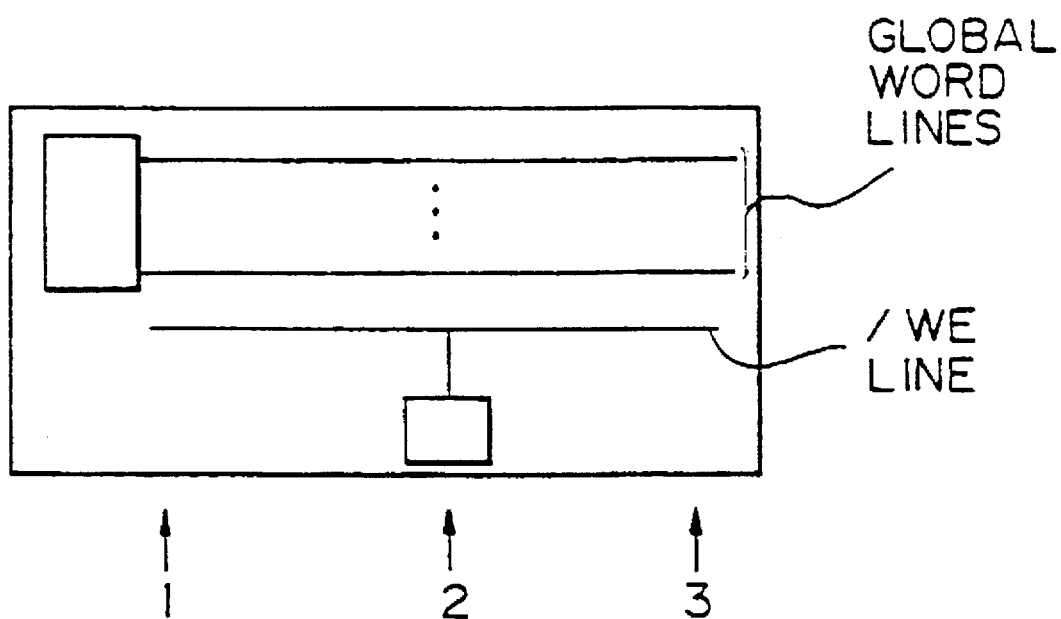
FIG. 42 is a diagram showing a second arrangement for explaining the differences resulting from different signal line arrangements for address and write enable signals.

FIG. 42 shows the arrangement in which the address signal is supplied from one end of the chip while the write enable signal is supplied from the center toward both ends. FIGS. 43A to 43F illustrate the timings of the various signals in the signal line layout of FIG. 42 and correspond to FIGS. 41A to 41F, respectively.

Figure 44:
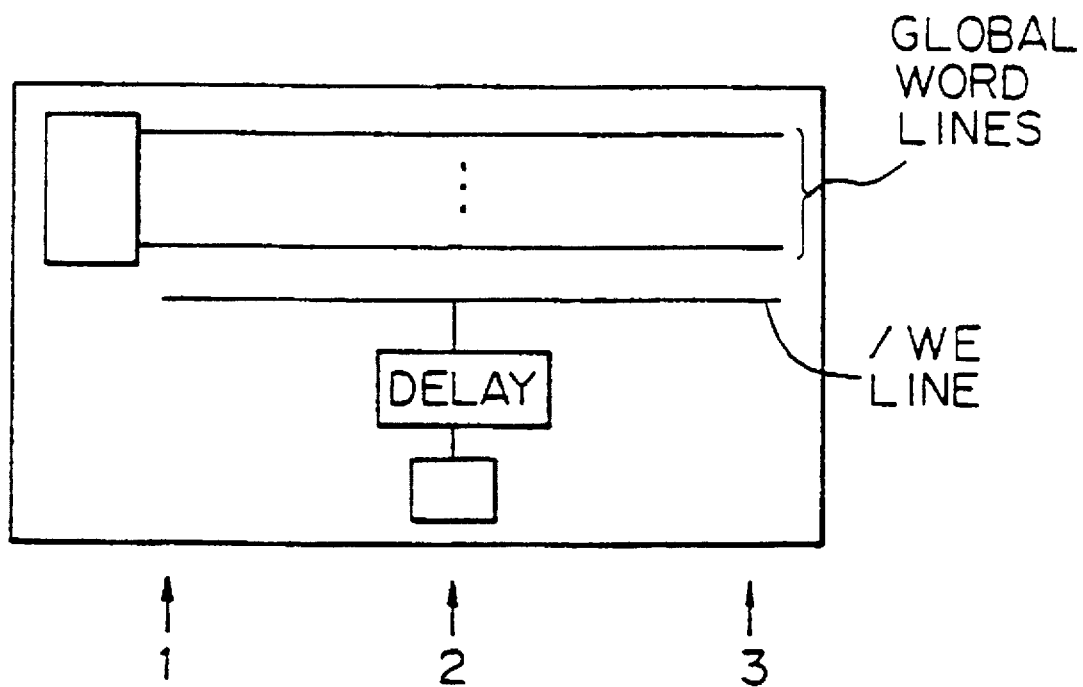
FIG. 44 is a diagram showing a third arrangement for explaining the differences resulting from different signal line arrangements for address and write enable signals.

FIG. 44 shows the arrangement in which the address signal is supplied from one end while the write enable signal is supplied from the center toward both ends, as in the arrangement shown in FIG. 41, but a delay circuit for delaying the write enable signal is added to adjust the timing at the center. FIGS. 45A to 45F illustrate the timings of the various signals in the signal line layout of FIG. 44 and correspond to FIGS. 41A to 41F, respectively.

As can be seen from FIGS. 41A to 41F, in the layout of FIG. 40 the signal delay amount increases with increasing distance from the signal source side, but no timing difference between the signals occurs since the delay increases uniformly. In the layout of FIG. 42, on the other hand, it can be seen that malfunctioning occurs at some points because of the timing difference between the signals. This problem cannot be eliminated even if the write enable signal is delayed as shown in the layout of FIG. 44.

FIG. 46 is a diagram schematically showing the signal line layout for the semiconductor device of the 11th embodiment of the invention.

In the figure, the reference numeral 520 is a semiconductor substrate; 521 is a row decoder as a signal source that generates a word line select signal based on an address signal ADD; 522a and 522b are write enable buffers as signal sources each for generating a write enable signal in response to a control signal C; 523 is a circuit block or memory cell matrix to which the word line select signal is supplied; 524a and 524b are circuit blocks or memory access peripheral circuits to which the write enable signal is supplied; 531 is a word line for carrying the word select signal; and 532a and 532b are write enable signal lines for carrying the write enable signal.

As shown, the signal line 531 for carrying the word line select signal generated from the row decoder 11 and the signal lines 532a and 532b for carrying the write enable signals generated from the write enable buffers 522a and 522b are arranged in such a manner that the signals propagate in the same direction (in the illustrated example, from left to right when viewed facing the diagram) and that the signal propagation delay is equal on any signal line.

Figure 47A:
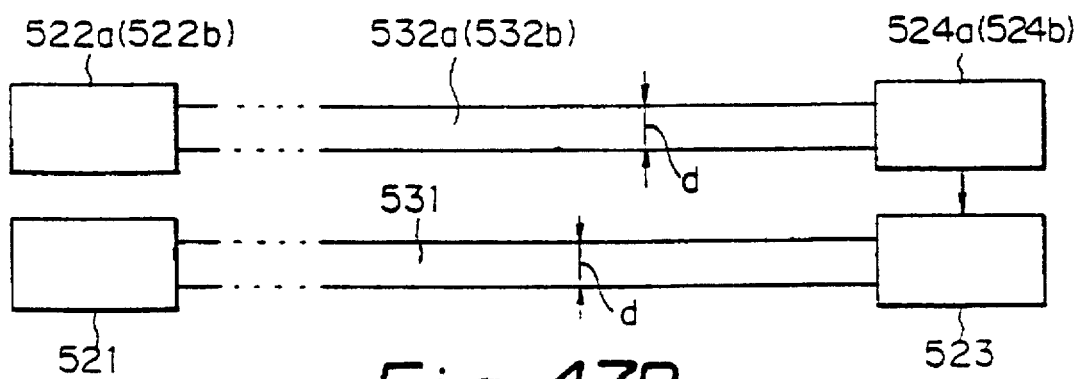
FIGS. 47A to 47C are diagrams illustrating specific examples of how signal propagation delays on signal lines are adjusted according to the 12th embodiment.
Figure 47B:
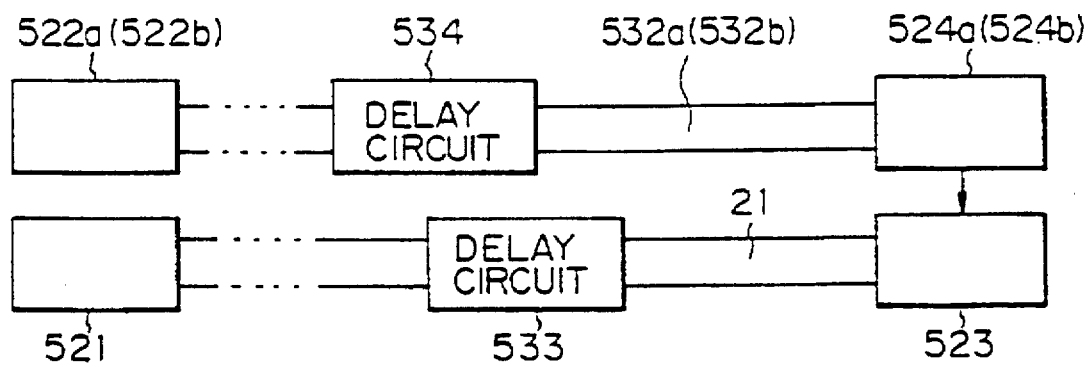
Figure 47C:
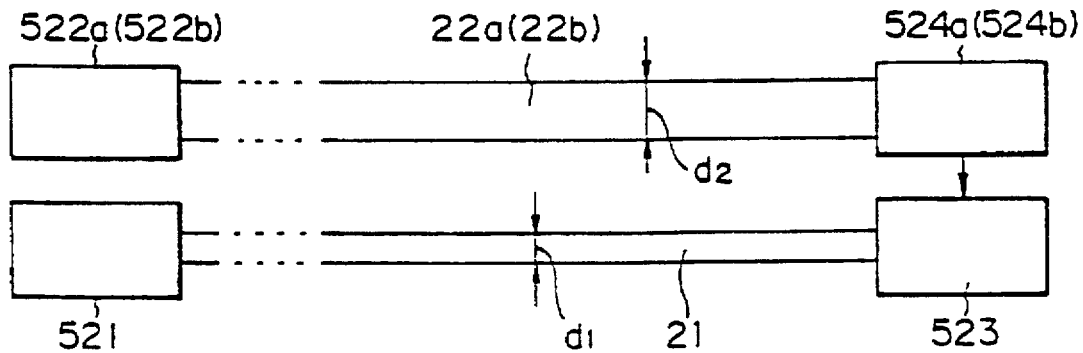

FIGS. 47A to 47C show specific examples of how the signal propagation delays on the signal lines 531 and 532a (532b) are adjusted in the semiconductor memory of the 11th embodiment shown in FIG. 11.

FIG. 47A shows an example in which the line widths of the word line 531 and the write enable signal line 532a (532b) are set to the same value, d, so that the signal propagation time, i.e., the delay amount, is made equal on each signal line.

FIG. 47B shows an example in which delay circuits 533 and 534 are introduced partway through the word line 531 and the write enable line 532a (532b), respectively. The delay circuits 533 and 534 are used to adjust (synchronize) the propagation timings of the word line select signal generated from the row decoder 521 and the write enable signal generated from the write enable buffer 532a (532b). With this arrangement, the signal propagation timing can be made equal at any specific point on the signal lines extending from the signal sources (row decoder 11, write enable buffers 522a, 522b) to the respective signal destinations (memory cell matrix 523, memory cell peripheral circuits 524a, 524b).

FIG. 47C shows an example in which the line width of the word line 531 and that of the write enable signal line 523a (532b) are set to different values, d1 and d2, to achieve the same function as provided by the delay circuits 533 and 534. With this arrangement, the signal propagation timing can be made equal at any specific point on the signal lines, as in the arrangement of FIG. 47B.

In the above embodiment, the signal line layouts have been described by taking a semiconductor memory as an example, but it will be understood from the purpose of the present invention that the above embodiment is not limited to semiconductor memories but can also be applied to other types of semiconductor devices having a plurality of signal lines of such length that the signal propagation delay time cannot be ignored.

As described above, according to the 10th and 11th embodiments, since the signal lines extending from the signal sources to the destination circuit blocks are arranged so that they run in the same direction, the propagation timing difference between signals at any specific point on the signal lines can be eliminated. This eliminates the possibility of malfunctioning of the circuit blocks and greatly contributes to improving the performance of semiconductor devices.

We claim:

1. A complementary signal transition detection circuit for generating a prescribed pulse signal in response to a change of a complementary signal pair input thereto, comprising:

a first NAND circuit to which a first signal of the complementary signal pair is input;

a second NAND circuit to which a second signal of the complementary signal pair is input;

a third NAND circuit to which the outputs of the first NAND circuit and the second NAND circuit are input and which outputs the prescribed pulse signal;

a first delay circuit for delaying the output of the first NAND circuit and supplying the delayed output as an input signal to the second NAND circuit; and a second delay circuit for delaying the output of the second NAND circuit and supplying the delayed output as an input signal to the first NAND circuit, wherein the first delay circuit comprises a fourth NAND circuit, a first inverter circuit to which the output of the fourth NAND circuit is input, and a capacitive device connected between the output of the fourth NAND circuit and one of supply voltage input terminals, the fourth NAND circuit being supplied at its inputs with the output of the first NAND circuit and the second signal of the complementary signal pair, and the second delay circuit comprises a fifth NAND circuit, a second inverter circuit to which the output of the fifth NAND circuit is input, and a capacitive device connected between the output of the fifth NAND circuit and the one of supply voltage input terminals, the fifth NAND circuit being supplied at its inputs with the output of the second NAND circuit and the first signal of the complementary signal pair.

2. A complementary signal transition detection circuit according to claim 1, wherein the fourth NAND circuit and the fifth NAND circuit each include p-channel transistors respectively driven by the first and second signals of the complementary signal pair, the driving capacity of the p-channel transistors being made larger than that of any other transistor included therein.

3. A MOS static RAM comprising a complementary signal transition detection circuit according to claim 1 as an address transition detection circuit.

4. A complementary signal transition detection circuit for generating a prescribed pulse signal in response to a change of a complementary signal pair input thereto, comprising:

a first NOR circuit to which a first signal of the complementary signal pair is input;

a second NOR circuit to which a second signal of the complementary signal pair is input;

a third NOR circuit to which the outputs of the first NOR circuit and the second NOR circuit are input and which outputs the prescribed pulse signal;

a first delay circuit for delaying the output of the first NOR circuit and supplying the delayed output as an input signal to the second NOR circuit; and a second delay circuit for delaying the output of the second NOR circuit and supplying the delayed output as an input signal to the first NOR circuit, wherein the first delay circuit comprises a fourth NOR circuit, a first inverter circuit to which the output of the fourth NOR circuit is input, and a capacitive device connected between the output of the fourth NOR circuit and one of supply voltage input terminals, the fourth NOR circuit being supplied at its inputs with the output of the first NOR circuit and the second signal of the complementary signal pair, and the second delay circuit comprises a fifth NOR circuit, a second inverter circuit to which the output of the fifth NOR circuit is input, and a capacitive device connected between the output of the fifth NOR circuit and the one of supply voltage input terminals, the fifth NOR circuit being supplied at its inputs with the output of the second NOR circuit and the first signal of the complementary signal pair.

5. A complementary signal transition detection circuit according to claim 4, wherein the fourth NOR circuit and the fifth NOR circuit each include n-channel transistors respectively driven by the first and second signals of the complementary signal pair, the driving capacity of the n-channel transistors being made larger than that of any other transistor included therein.

6. A MOS static RAM comprising a complementary signal transition detection circuit according to claim 4 as an address transition detection circuit.

* * * * *

UNITED STATES PATENT AND TRADEMARK OFFICE
CERTIFICATE OF CORRECTION

PATENT NO. : 5,734,622
DATED : March 31, 1998
INVENTOR(S) : Kazuto Furumochi and Junji Seino It is certified that error appears in the above-identified patent and that said Letters Patent is hereby corrected as shown below:

On the title page item [75]:

Please remove Junji Seino as an inventor.

Signed and Sealed this

Eighth Day of September, 1998

Attest:

BRUCE LEHMAN

Attesting Officer      *Commissioner of Patents and Trademarks*